(12) United States Patent
Molinari et al.

(10) Patent No.: US 7,275,235 B2
(45) Date of Patent: Sep. 25, 2007

(54) GRAPHICAL APPLICATION DEVELOPMENT SYSTEM FOR TEST, MEASUREMENT AND PROCESS CONTROL APPLICATIONS

(76) Inventors: Alfred A. Molinari, 100 Locke Dr., Marlboro, MA (US) 01752; Andreas Claus Randow, Tempelstrasse 5, 63571 Gelnhausen (DE); Dirk Rick Schmischke, Spessartstrasse 37, 63505 Langenselbold (DE); Frank Gabler, Herlengrasse 6a, 63571 Gelnhausen (DE)

( * ) Notice: Subject to any disclaimer, the term of this patent is extended or adjusted under 35 U.S.C. 154(b) by 711 days.

(21) Appl. No.: 10/230,412

(22) Filed: Aug. 28, 2002

(65) Prior Publication Data

US 2003/0058280 A1    Mar. 27, 2003

Related U.S. Application Data

(60) Provisional application No. 60/315,830, filed on Aug. 29, 2001.

(51) Int. Cl.
*G06F 9/44* (2006.01)
(52) U.S. Cl. ...................... 717/100; 717/109
(58) Field of Classification Search ........ 717/104–105, 717/109, 113
See application file for complete search history.

(56) References Cited

U.S. PATENT DOCUMENTS

| | | | |
|---|---|---|---|
| 5,291,587 A | 3/1994 | Kodosky et al. | |
| 5,301,336 A | 4/1994 | Kodosky et al. | |
| 5,710,727 A | 1/1998 | Mitchell et al. | |
| 5,724,272 A | 3/1998 | Mitchell et al. | |
| 5,847,955 A | 12/1998 | Mitchell et al. | |
| 5,920,479 A | 7/1999 | Sojoodi et al. | |
| 6,064,812 A * | 5/2000 | Parthasarathy et al. | 717/105 |
| 6,102,965 A * | 8/2000 | Dye et al. | 717/109 |
| 6,694,513 B1* | 2/2004 | Andersson et al. | 717/165 |

OTHER PUBLICATIONS

Mike Kersten et al., "Atlas: A case study in building a web-based learning environemnt using aspect-oriented programming", Oct. 1999, ACM SIGPLAN Notice, Proceedings of the 14th ACM SIGPLAN conference on Object-Oriented programming, p. 340-352.*

* cited by examiner

*Primary Examiner*—Wei Zhen
*Assistant Examiner*—Philip Wang
(74) *Attorney, Agent, or Firm*—Philip Koenig

(57) ABSTRACT

A graphical application development environment is provided, for the development of test, measurement and process control applications. Said environment comprises thematically organized groups of "panels" representing components of virtual instruments, and said panels are combined and interconnected via data channels, control channels and event channels to form a complete instrument "front panel." Each panel represents a quasi-autonomous "aspect" software object that has the attributes, properties and connectivities of the represented instrument component, and that is associated with executable code segments, including code segments that are usable by a plurality of aspects and are maintained in libraries accessible to an aspect handler for the construction of aspects. A representation of a user-developed application program, as created in a textual language, comprises an executable description of front panel aspects and their attributes and interconnections, and serves to invoke said associated code segments to run said user application.

34 Claims, 27 Drawing Sheets

```
object PageControl1: TDTPageControl
  Left = 0
  Top = 0
  Width = 1280
  Height = 1024
  TabOrder = 0
  TabPosition = tpBottom
  VirtualWidth = 1280
  VirtualHeight = 1024
  RuntimeMode = False
  GridSizeX = 10
  GridSizeY = 10
  ShowGrid = True
  SnapToGrid = True
  VersionInfo = '0.0.0'
  ActivePageIndex = 0
  DTMFVersion = '3.0.4.0'
  object TDTPanelTabPage
    Caption = 'Front panel 1'
    ShowGrid = True
    RuntimeColor = clBtnFace
    EmbededVisible = False
    object TDTPBMeasureSource0: TDTPBMeasureSource
      Left = 19
      Top = 28
      Width = 82
      Height = 68
      Cursor = crHandPoint
      ObjectDescription = 'DT Data Source'
      Version = '2002.1'
      Caption = 'DT Data Source'
      ColorCaption = clWhite
      Color = clBtnFace
      IsPinned = False
      Copyright = '(c) 1999-2002 Data Translation inc.'
```

FIGURE 3A

```
DTDataSourcePropertiesEx = (
  '[DATAX]'
  'Exists=0'
  ''
  '[DTDEVICESECTION]'
  'Exists=1'
  'DTDeviceName=DT3010(01)'
  'SubdeviceCount=1'
  ''
  '[Subdevice.0]'
  'SubdeviceType=1'
  'SubdeviceNumber=0'
  'A/D Actions=0'
  'ChannelType=1'
  'BufferCount=30'
  'BufferSize=1024'
  'CutOffInputFilter=0'
  'ChannelRange=0'
  'ClockFrequency=10'
  'ClockFrequencyReal=1000'
  'ExternalClockDivider=1'
  'ClockSource=0'
  'Resolution=0'
  'Encoding=0'
  'DMAUsage=0'
  'ReadDigitalIn=0'
  'NrOfDigitalInputAD=0'
  'DIOPositionAD=3'
  'ADTriggerMode=0'
  'ADTriggeredScanMode=0'
  'ADMultiscanCount=1'
  'ADReTriggerMode=1'
  'ADReTriggerFreq=1,19999999976717'
  'NrOfCGLChannels=1'
  'CGL.Count=1'
  'CGL.0=0 1 false '
  'ChannelCount=1'
  ''
  '[Subdevice.0.Channel.0]'
  'Name=DT3010(01).A/D0. Ch 0'
  'Unit=Volt'
  'Min=-10'
  'Max=10'
  'ScalFromX=0'
  'ScalFromY=1'
  'ScalToX=0'
  'ScalToY=1'
  'Color=0'
  'AutoRange=1'
  ''
  '[CalulatedChannels]'
  'ChannelCount=0'
  '')
end
```

FIGURE 3B

```
object TDTDigitalDisplay1: TDTDigitalDisplay
  Left = 20
  Top = 99
  Width = 202
  Height = 122
  Cursor = crHandPoint
  ObjectDescription = 'Digital Display'
  Version = '2002.1'
  Caption = 'Digital Display'
  ColorCaption = clWhite
  Color = clBtnFace
  IsPinned = False
  MeasureSource = TDTPBMeasureSource0
  Channel = 0
  Digits = 4
  DecimalPoint = 1
  BkgColor = clBlack
  FgColor = clLime
  SuppressLeadingZero = False
  DataReduction = pbcompFirst
  FakeDigitalDisplayProperties = (
    0
    0)
end
```

FIGURE 3C

```
  object TDTDAQCompound2: TDTDAQCompound
    Left = 230
    Top = 49
    Width = 115
    Height = 164
    Cursor = crHandPoint
    ObjectDescription = 'DAQ Controller'
    Version = '2001.1'
    Caption = 'DAQ Controller'
    ColorCaption = clWhite
    Color = clBtnFace
    IsPinned = False
    BkgColor = clBtnFace
    Font.Charset = DEFAULT_CHARSET
    Font.Color = clWindowText
    Font.Height = -11
    Font.Name = 'Arial'
    Font.Style = []
    CtrlSource = TDTPBMeasureSource0
  end
 end
end
```

FIGURE 3D

GRAPHICAL APPLICATION DEVELOPMENT SYSTEM FOR TEST, MEASUREMENT AND PROCESS CONTROL APPLICATIONS

The present application incorporates previously filed Provisional Application for Patent Ser. No. 60/315,830 filed Aug. 29, 2001.

FIELD OF THE INVENTION

The present invention relates to computerized systems for developing virtual instrumentation systems, and more particularly to graphical development software and systems for the design and construction of virtual instrumentation systems including test and measurement applications.

BACKGROUND

The present invention concerns computer software that is used to create and operate "virtual instrumentation systems." That is, the invention concerns computer software that a user would employ to develop a computerized test and measurement system, for controlling from a computer desktop an external measurement hardware device and for displaying, on instrument-like panels on a computer screen, test or measurement data collected by the external device. The invention extends also to computerized systems for controlling processes based on data collected and processed by a computerized instrumentation system.

An instrument is a device designed to collect data from an environment, or from a unit under test, and to display information to a user based on the collected data. Such an instrument may employ a transducer to sense changes in a physical parameter, such as temperature or pressure, and to convert the sensed information into electrical signals, such as voltage or frequency variations. The term instrument may also cover, and for purposes of this description it will be taken to cover, a physical or software device that performs an analysis on data acquired from another instrument and then outputs the processed data to display or recording means. This second category of instruments would for example include oscilloscopes, spectrum analyzers and digital multimeters. The types of source data collected and analyzed by instruments may thus vary widely, including both physical parameters such as temperature, pressure, distance, and light and sound frequencies and amplitudes, and also electrical parameters including voltage, current, and frequency.

Historically, instrumentation systems originated in the distant past, with measuring rods, thermometers, and scales. In modem times, instrumentation systems have generally consisted of individual instruments, for example an electromechanical pressure gauge comprising a sensing transducer wired to signal conditioning circuitry, outputting a processed signal to a display panel and perhaps also to a line recorder, in which a trace of changing conditions is inked onto a rotating drum by a mechanical arm, creating a time record of pressure changes.

Even complex systems such as chemical process control applications typically employed, until the 1980s, sets of individual physical instruments wired to a central control panel that comprised an array of physical data display devices such as dials and counters, together with sets of switches, knobs and buttons for controlling the instruments.

The introduction of computers into the field of instrumentation began as a way to couple an individual instrument, such as a pressure sensor, to a computer, and enable the display of measurement data on a virtual instrument panel, painted in software on the computer monitor and containing buttons or other means for controlling the operation of the sensor. Thus such instrumentation software enabled the creation of a simulated physical instrument, having the capability to control physical sensing components.

A large variety of data collection instruments designed specifically for computerized control and operation were developed and made available on the commercial market, creating the field now called "virtual instrumentation." Virtual instrumentation thus refers to the use of general purpose computers and workstations, in combination with data collection hardware devices, and virtual instrumentation software, to construct an integrated instrumentation system; in such a system the data collection hardware devices, which incorporate sensing elements for detecting changes in the conditions of test subjects, are intimately coupled to the computer, whereby the operations of the sensors are controlled by the computer software, and the output of the data collection devices is displayed on the computer screen, in a manner designed in software to be particularly useful to the user, for example by the use of displays simulating in appearance the physical dials, meters and other data visualization devices of traditional instruments.

Virtual instrumentation systems typically also comprise pure software "instruments", such as oscilloscopes and spectrum analyzers, for processing the collected sensor data and "massaging" it in ways useful to the users of the data. For example, software means may be employed to analyze collected data as needed to present the user with isolated information on "max" or "min" readings, averages, standard deviations, or combinations of results from related sensing points, etc.

The early development of virtual instrumentation systems faced challenging technical difficulties. Major obstacles included the many types of electronic interfaces by which external data collection devices can be coupled to a computer, and great variety in the "command sets" used by different hardware device vendors to control their respective products.

Also, data collecting hardware devices differ in their internal structures and functions, requiring virtual instrumentation systems to take account of these differences. Thus some data acquisition devices are so-called "register-based" instruments, controlled by streams of 1s and 0s sent directly to control components within the instrument; others are "message-based" instruments, and are controlled by "strings" of ASCII characters, effectively constituting written instructions that must be decoded within the instrument. In turn, different instruments use different protocols to output data, some as electrical frequencies and others as variations in a base voltage, for example. Any virtual instrumentation system intended for connection to a typical variety of commercially available data collection hardware devices must accordingly comprise software tools capable of communicating effectively with the disparate types of hardware devices.

The software that is used to control any one type of instrument is referred to as "instrument driver" software. For a computerized instrumentation system to operate, means must be provided, usually in the form of "libraries" of instrument driver software, to deal with the different ways used by the external instruments to communicate with a computer host.

Until the 1990s the programming of virtual instrumentation systems was a task strictly for professional programmers, who wrote the required software programs using "textual" programming languages such as BASIC, C++, or PASCAL. In addition to the factors previously mentioned, the great variety in possible applications also called for professional expertise, in that one customer's measurement application was rarely suitable for a second customer: for example, one customer may have needed only to collect a single value, say outside temperature, once an hour, and to have all collected values stored in a file; the next customer possibly required that several related process temperatures, say in a rubber-curing process, be monitored continuously, and that a shut-off valve be activated in the event that the relative temperature between two process steps should vary by more than 7 degrees for a time period of 3 seconds or more, in any 15 minute period, and to store only data concerning such episodes.

The development of instrumentation systems software by professionals using textual programming languages such as C++ is very time consuming and tedious, and it typically results in the production of a program consisting of many pages of so-called source code, written in a computer language that is virtually unreadable by non-programmers, and which thus cannot be modified by the typical users of such programs.

In the last 10 years there have appeared several commercial software products for the development of virtual instrumentation systems using purely graphical programming methods. Examples of such software products include the Hewlett-Packard HP VEE software, the LabVIEW products marketed by the National Instruments Company, and Wavetest software marketed by Wavetek Corporation. Each of these prior art commercial products provides users, typically including users who are not skilled software programmers, with a "graphical development environment" within which to design a custom virtual instrumentation system. Typically the user is presented with a "design desktop" environment, generally having the look-and-feel familiar to users of Windows-based graphical applications, in which a variety of software options and "tools" are accessible, from toolbars and dialog boxes featuring drop-down menus, and may be accessed by manipulating an on-screen cursor using a computer mouse.

However, all known prior art systems for developing virtual instrumentation systems, using graphical programming means, provide the user with tools for designing so-called "data flow" diagrams. The user of these prior art systems is thus required both to place icons representing desired system components onto a design desktop and then to effect "wiring" connections between components. In order to design a data flow diagram that corresponds to a workable measurement system application, the user is required to have a comparably deep knowledge and understanding of the specific data paths and element combinations that will be required to effectuate the user's objective, which is a "solution" to the user's measurement requirements. User-designed systems developed using these prior art graphical development systems are also prone to errors, because they generally allow the use unwittingly to wire together components that are functionally incompatible.

The range of applications that may be made the subject of an instrumentation system spans the range of human activity. Therefore a software development system that aims to provide a large cross-section of potential users with the tools to design their own customized instrumentation system must provide the user with a large range of development tools and options, including tools and options that may be or are mutually incompatible in a given application. Ideally such a system should also organize the software tools provided to the user in a way that enables the user to select easily the particular tools best suited for the pertinent application, and guide the user's selection of configuration options. The known prior art systems lack built-in safeguards against the construction of unworkable combinations of components, and provide inadequate intuitive guidance to the user seeking to develop a measurement application.

It is accordingly an important objective of the present invention, not met by existing products, to present the user with development tools in a manner that guides the user intuitively to choices to system elements that are appropriate to the user's project, and that automatically precludes the user's selection of system elements that are mutually incompatible.

SUMMARY OF THE INVENTION

The present invention is a graphical measurement application development software system. That is to say, the invention is a software application that presents the user with a graphical desktop, and sets of software "tools", for developing a problem-specific test or measurement application by using graphical programming techniques such as mouse manipulations of icons and of drop down lists of selectable options. Using the tools provided by the invention, a user having essentially no software programming training or experience is enabled to design and construct a working, problem-specific measurement solution which can readily be saved to a file, and be exported to one or a plurality of end user personal computers, on the factory floor or the science lab, that are connected to data collection hardware.

The present invention thus provides a "design desktop" on which the user may develop a plurality of "front panels", each of which represents a complete instrument and a group of which constitutes all of the instrumentation required for a multi-instrument measurement environment or project. For example, one front panel may constitute a single instrument such as a temperature gauge, and comprise, in its runtime mode, a control panel containing "start and "stop" buttons, a digital display panel to display the currently measured temperature, and a line recorder panel displaying temperature variations over a period of time selected by the user/ developer.

A separate "front panel" developed for the same end user project might contain several distinct instruments, including for example a temperature gauge and a pressure gauge, possibly displaying data obtained from the same or from different data acquisition devices such as "data acquisition boards" (DAQ boards) plugged into the computer. An end user application might thus comprise several "front panels" for handling a particular test or measurement application, as the software of the invention provides for designing and building a plurality of independent front panels within a single development project, and for toggling readily between front panels as needed to view the several virtual instruments represented by the different panels.

In design mode each front panel provides a desktop workspace on which a user may place instrument components, selected from functionally distinct groups of available components, and then combine the selected components into a complete virtual instrument. Three principal groups of instrument components are provided (plus some miscellaneous components): a set of "data source panels" components, a set of "display panels" components (part of a larger group sometimes referred to herein as "Standard" panels), and a set of "Controlling panels" components. Generally a user application will comprise, in each front panel, a combination of components including at least one component selected from each of these three principal groups, including a data source component representing a source of measurement data, a visualization component chosen to represent the measurement data, and a control component selected for controlling the operation of the data source hardware. However front panels may incorporate many more components, including components that represent software instruments for processing measurement data, such as an oscilloscope or a spectrum analyzer, and the additional control components necessary or useful to control the additional data visualization or data processing components.

The user in developing an application may thus first select a visual component, such as a virtual gauge or dial, or a non-visual component such as a comparator or a counter, and connect that component to a source of data. The data source component may provide original measurement data, or it may provide calculated data, consisting of calculation results derived from measurement data provided by another source of data (either currently, or consisting of previously collected and now stored measurement data).

A large variety of display panels for visualizing data and a large variety of instrument control panels are provided for use in front panels. The provided visualization and display components include both "simple" displays that operate on arrays and single values (e.g., Meter, LED, Labels, Bar Graph), and more complex components (e.g., Oscilloscope, Line Recorder, Spectrum Analyzer, Cross Spectrum Analyzer, and Filewriter panels). A corresponding large set of control panels is provided, including control panels specific to particular display components, such a an oscilloscope controller and a line recorder controller, in addition to a large variety of controller panels having more general application such as button controls, slider controls and the like.

The procedure employed by the user in developing an application is generally as follows: upon opening the software of the invention, the user is presented with a "design mode" desktop, having the general appearance of a graphical desktop containing a large workspace. By selections from menu lists, or the "drag and drop" of selected panel icons presented in "flying tool windows", the user places on the design workspace a selection of "panels", chosen to represent the several instrument components that will need to be combined to form an "instrument" of the kind required by the user's intended application. For example a user may select and place on the desktop front panel a "DAQ data source" panel, a "Digital display" panel, and a "DAQ controller" panel, selected respectively from a "Data source panels" list, a "Controlling panels" list, and a "Controlling panels" list. Upon configuration and inter-connection of its constituent panels by the user, the resulting "front panel" will constitute a fully functional "Digital Display" instrument, comprising both a visualization panel on which the values of sampling data can be viewed, and the control buttons needed to start and stop the sampling of data from a selected data source for viewing on the display.

Each of the instrument component "panels" employed in the software of the invention represents a software object that incorporates the potential attributes, functions and connectivities of the represented component type. There is associated with each panel a property page, readily accessible to the user, that serves as the main tool for configuring the particular component and adapting it to suit the user's requirements, and to connect that instrument component panel to other component panels.

In order to configure an instrument component panel, or effect a desired connection with another panel (for the transport of data, the communication of a control signal, or the reporting of an event to an "event client" panel), the user thus accesses the necessary configuration options from the property page of a selected panel, with a mouse click on a border of the panel. Within the property page of each panel, dialog boxes, drop-down menus and other graphical tools are used to provide carefully designed configuration options that guide and assist the user in designing and building, intuitively and simply, a working measurement application. For example, the property page of a data source panel comprises functionality to locate data sources available to and supported by the system, such as installed data acquisition boards (DAQ boards), and to identify and present to the user, the subsystems of a data source selected by the user and the data channels carried by each data source subsystem.

Similarly, the property page of a digital display component panel may be opened to provide the user with a tree view of the channel table of the data source previously selected by the user. The user may then, with a few clicks of the mouse, identify and select the specific data input channel of the data source to serve as a data source for the digital display panel. Likewise the property page of the DAQ Controller panel selected by the user will provide the user with a pre-defined set of options for controlling the sampling of measurement data from the selected DAQ data source, including configuration options concerning sample data buffer size, and clock speed, that will enable end users to change these parameters in run time if so intended in the design of the instrument.

The user who is developing an application may thus, by accessing the property page of selected "data sink" instrument component panels like the display panels, connect each such visualization or display panel to a selected data channel of an available data source. The user merely selects the components to be employed and inter-connected, and is not required to "wire" them in any particular way. The system automatically creates the data links employed as base carriers of the resulting data streams (which, as earlier noted, may comprise data that is the result either of a measurement or of a calculation or function (i.e., FFT)). Means are provided for the user to enable or disable channels from any given source of data. This allows the user to choose, at any given time including run time, the channel or channels to be measured, by disabling or enabling data channels at will.

Another feature of the invention is that the property pages of selected panels, principally including "Controlling panels", provide for the creation of "control channels" that allow the user to change selected properties of certain other component panels, for example the data sampling rate, or a trigger point. One form of provided control channel is an "action channel," that is, a channel for "actions" properties that enables specific actions to be executed when set, for user control of features such as "start measurement," or "open property page."

The system of the invention employs data channels for the streaming of data between data sources (sender) and data sinks (receiver). Data may be acquired in several ways including buffer driven, timed data thread driven (single value), and "data on demand" (also single values). The following set of predefined functions are implemented for calculating virtual channels: Sum, difference, product and division of two channels; average; RMS; standard deviation; first value, minimum or maximum value of one channel, giving one value; two-point scaling; polynomial linearization of one channel; and fast Fourier transform (FFT).

A central feature of the present invention is its use of quasi-autonomous software objects, herein called "aspects", to represent each instrument component type contained in the sets of panels that are presented to the user. Each such "aspect" incorporates the potential functionalities of its respective component type, and the capability to effect its interconnection with such other aspects precisely as would be required for the aspects collectively to form a complete and working instrument. Furthermore, said aspects are constructed of optimized machine-readable code segments: upon a user's development of a specific application, through the selection and configuration of specific "panels" corresponding to software aspects, the execution of the developed application may therefore be implemented, with no compilation or interpretation of code, by the execution of a simple textual script file identifying the selected attributes, functions and connectivities determined by the user's application.

Thus the software of the present invention comprises libraries of executable code segments, representing discrete instrument component attributes having potential uses for numerous objects, and it enables the combination of selected sets of such pre-defined attributes into interconnected objects called "aspects". By association with said libraries of executable code segments, each aspect of a particular type (data source, data sink, or controlling) may be fitted with specific characteristics appropriate to its type, including methods, properties and other attributes, including sets of configuration options enabling any aspect to be tailored to a user's specific requirements for that aspect type. Each aspect may also be selectively provided with specific connectivity to other aspects, thereby allowing for transfers of instrument control instructions, of "real" or "virtual" data, and of event data, among aspects.

In prior art graphical programming environments using data flow techniques, the user designs programs that require compilation or interpretation prior to execution. By contrast, user programs developed using the present invention require no compilation or interpretation, because the machine-readable code required to execute all program functions is pre-compiled and archived. In the system and method of the present invention, the user's programming activities effectively order, into the programming objects herein called "aspects", segments of optimized executable code that are immediately accessible to the runtime execution subsystem of the software.

The use of "aspects" as software objects the present invention was inspired by aspect-oriented programming (AOP) concepts, which call for a programmer to identify, group, and express, in the form of "aspects", the methods, properties, connectivities and other attributes that are to characterize, collectively, each particular object of an intended system, and then to combine an intended system's "aspects of concern" in a final executable form. In a sense the present invention extends these AOP concepts, by enabling a user of the present invention, wholly untrained in programming techniques, to assemble and to configure into a functional end user application, sets of aspects comprised of executable code segments effectively manipulated by the user with graphical application development tools.

An important advantage of the present invention, and its use of "aspects" as software objects directly associated with executable code segments maintained in libraries, is that a measurement application created by a user of the invention may be fully represented in a brief text description of the chosen and configured aspects, and of their interconnections, in lieu of pages of source code. In particular, a user in creating an application program using the present invention, by using graphical tools to select and configure "panels" that represent software aspects, is simultaneously caused to create such a text file as the run time and distributable representation of the user's application. In embodiments described in the present specification, the format selected to represent and comprise user-designed programs is termed Aspect Interaction Language (AIL), an expression selected to reflect the nature of AIL as a form of program representation that is purely textual and descriptive, and that is not a programming language subject to being compiled into machine-executable code. However other textual representations of aspects descriptions and interconnections could readily be employed, for example using XML representation.

The user in the course of programming a measurement application is guided in the selection and the definition of instrument component panels, each of which represents a software "aspect" having attributes necessary for the user's intended application. As the user places selected virtual instruments "panels" on the desktop and configures their properties (using "drag and drop" and related graphical environment techniques), an AIL file containing a description of the selected, created and defined aspects is simultaneously being created, including, for each aspect, a description of its properties and connections.

As the user adds more panels, selects more properties, and effects connections between panels, the AIL file expands into a complete textual description of the user's program. At the same time, this AIL file corresponds to an executable set of selections from existing libraries of executable code. This AIL file, which is human-readable, and readily saved and stored, also constitutes an abstract representation of the existing, executable code segments that are invoked, ordered and activated upon running the user's program.

In the operation of a user-designed program, the AIL representation of the program serves to invoke and order the operation of the program attributes associated with each of the aspects represented in the AIL description. At run time, parsing of the AIL listing by the execution subsystem invokes the optimized code segments, resident in the software of the system, that represent each of the specific aspect properties, methods, data transfers, and other actions and procedures required to execute the user's project.

Software tools including a front panel Aspect Handler and, for each aspect, a property page handler, are provided for use in the development of an application. Guided manipulation of aspect properties, using these tools, enables the user to define the characteristics, behavior and actions of selected aspects. In like fashion the user is enabled to effect appropriate interconnections between available and supported data sources and a large selection of virtual instrument components, including display panels, control devices and analytic processes.

For the interactions between aspects, and particularly between aspects representing measurement data sources and "data sink" aspects that represent virtual instruments that display or process measurement data, the invention provides three basic data streaming/communications mechanisms: data channels; control channels; and event channels. The invention provides graphical connection-handling user interfaces for each of these three types of data streaming mechanisms, accessible from the property pages of the pertinent aspects.

Data channels are provided by special software "cores" having the aspect of a data source, and are adapted to handle the data streaming of measured or processed data. Aspects that have the characteristics of a data sink (e.g., an oscilloscope component panel) can receive data via a data channel and process it. The connection of a data source to a data sink aspect is effected by establishing a data link between the two aspects. The user does this by the simple expedient of selecting the desired data source, from within the property page of the "data sink" instrument component panel.

The invention provides that certain aspects may have properties and/or methods (actions) accessible to certain other aspects, including properties and/or methods that may be changed or triggered externally by the actions of another aspect. For this purpose the invention provides a communication mechanism called a control channel.

Lastly, a communication mechanism called event channels is provided to allow aspects to react upon the occurrence of events in other aspects of the application. Applications developed using the invention may thus provide for a wide variety of "events" to be published by selected aspects, to effect actions by other aspects. For example a panel with a data source aspect may publish a "start" event, and subsequently a "stop" event, to inform other aspects of its state.

The invention provides for operation under an "Online" mode, in which measurement applications constructed using the software of the invention operate on live measured data, and also for operation on "Offline" mode, in which such applications operates on simulated data.

The invention in its preferred embodiment has been designed to operate in a Windows environment, that is, under the supervision of one of the several current Windows operating systems marketed by the Microsoft Corporation. Windows operating systems comprise a message-queuing process whereby several operations, including any movement of any standard "window" supervised by the Windows software, interrupt the receipt of signals in a user application. This Windows operating system feature is an impediment to the proper operation of measurement applications running under Windows supervision, in that the receipt of sampled data is subject to being interrupted at will by the accidental operation of another Windows controlled operation, resulting for example in the overloading of data buffers and the loss of data. To overcome this problem the present invention comprises software means for by-passing the Windows queuing process in the course of running user-developed measurement applications developed using the present invention.

The software of the invention also comprises a distribution wizard for creating packages containing user applications developed using the software of the invention. Said distribution wizard enables user applications to be distributed in a form that provides for easy installation on end user computers. Furthermore, the aspect-centered architecture of the present invention allows for the creation of application packages that comprise all executable code segments needed to run the application, in contrast to conventional application distribution means that require the compilation of source code by the end user computer. As a result, application packages created with the distribution wizard of the present invention avoid any possibility of variations in run time operation by different end users, as can result upon the distribution of applications in a source code format.

DESCRIPTION OF DRAWINGS

FIG. 3A-3D is a representative textual file description of a user-developed program for a spectrum analyzer virtual instrument.

DETAILED DESCRIPTION OF A PREFERRED EMBODIMENT OF THE INVENTION

Figure 1:
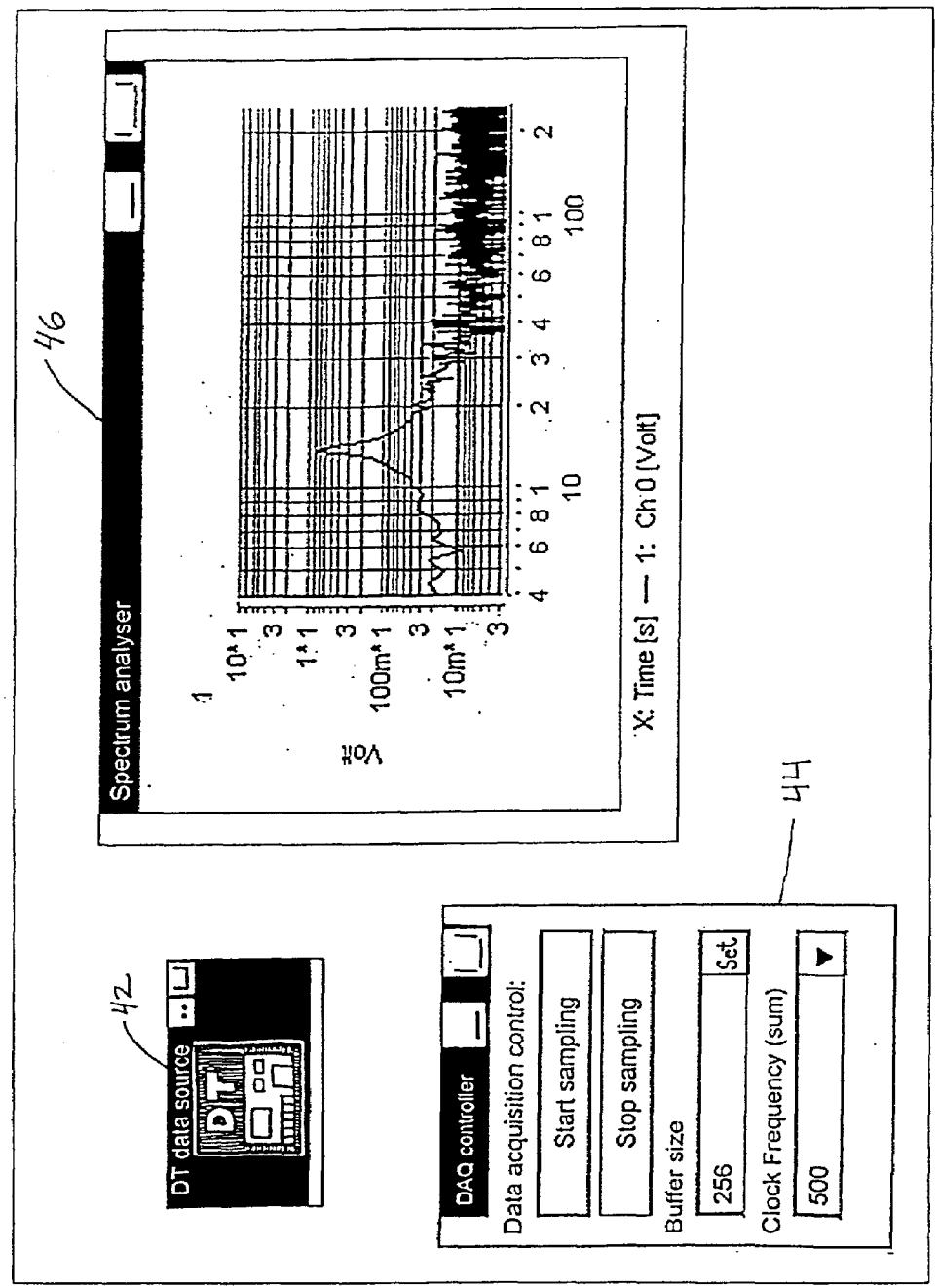
FIG. 1 is a screen shot illustrating a Spectrum analyzer instrument developed with the software of the present invention.

The system of the present invention comprises software that provides users with a graphical development environment that is specifically adapted for the development of customized measurement environments. The graphical application development software of the present invention has been designed to be run on a conventional personal computer, preferably a computer equipped with an operating system, such as the Windows series of Microsoft operating systems, that is adapted to supervise graphical applications. The embodiments of the invention as described in this specification may of course be employed on any other type of computer capable of running conventional Windows applications, and embodiments of the invention based on the present description may also readily be developed for other computer platforms, in a manner known to persons skilled in the art.

It is a principal object of the present invention to provide a user, equipped with a computer such as a personal computer, with software means for creating a "software application" capable of creating a customized "measurement environment" adapted to the real-life instrumentation requirements of an end user. Potential uses of such "measurement environments" are boundless, and range from a user needing to record hourly temperature measurements from a single outdoor thermometer, to factory environments requiring a multiplicity of test sensings to be scheduled and made, and the test data processed, using a multiplicity of electronic transducers to collect data regarding parameters such as voltage fluctuations, process temperatures and pressures, and like physical and electrical parameters. Additionally the system of the invention may be used to control factory or laboratory processes, based on the collection and processing of test or measurement data.

With the system of the present invention a user, including a user having no appreciable skill or experience in programming software, is enabled to create, on a computer display monitor, a virtual instrument capable of displaying measurement data collected from physical transducers external to the system, and to control the operation of such transducers. In addition the system of the present invention allows the user to develop means for processing input measurement data and to display, record and archive the processed results of calculations made on the input data.

A user application created using the measurement system development software of the present invention thus comprises a working solution to a test, control or measurement problem confronting a user. The problem may be simple, for example to sample hourly the temperature of a vat of liquid and to maintain a record of the temperature readings; or complex, involving for example the continuous monitoring of several different parameters by a plurality of external hardware devices, the performance of statistical and other calculations on resulting sampling data, and the graphical recording of multi-band analyses of original and of processed data. For the complex as for the simple measurement project, the present invention provides sets of tools that allow an untrained user to create complete measurement solutions easily and in minutes.

Figure 16:
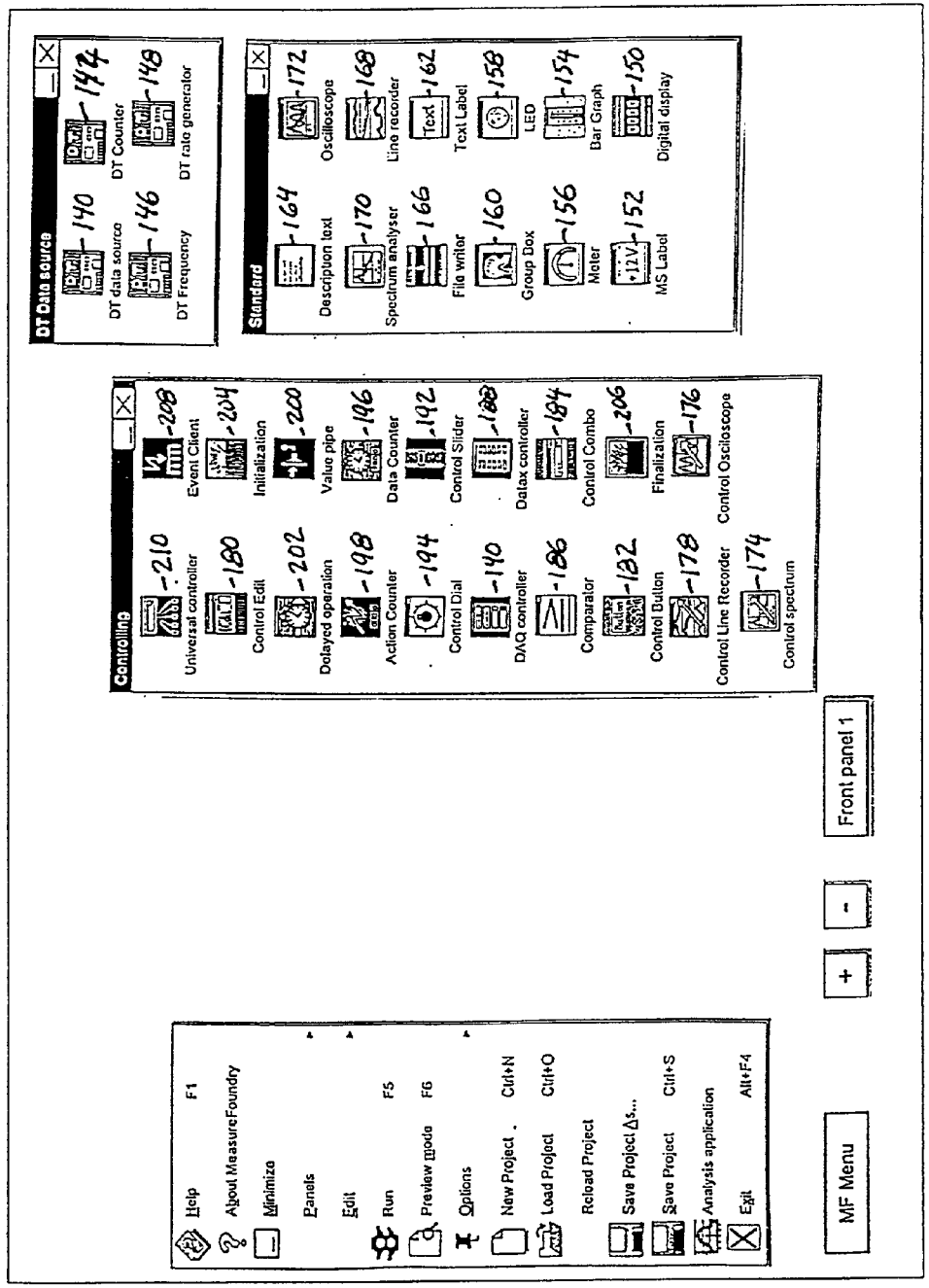
FIG. 16 is a screen shot of the design desktop workspace comprising principal panel groups.

To commence to develop a working test or measurement application using the present invention, the user need only identify the instrumentation functionalities required to solve the project problem, and the corresponding instrument components required to implement these functionalities: what are the physical parameters that need to be measured? What instruments would normally be required to collect and display the measurement data? And what statistical or other calculations on the measurement data would be desirable or useful? The development software of the present invention presents the user with categorized sets of virtual instrument components that correspond with those imagined by the user, and with the software means needed for interconnecting these virtual instrument components into a working solution to the user's measurement problem. Referring briefly ahead to FIG. 16, there is shown on FIG. 16 the design desktop comprising sets of component "panels", which illustrate the many instrument components that the user can place on the desktop and interconnect into complete and functional instruments for the sampling, visualization and analysis of measurement data.

To illustrate a simple user application, developed using a graphical measurement application development system according to the invention, there is shown in FIG. 1 a Spectrum Analyzer virtual instrument. FIG. 1 is a screen shot of the complete Spectrum Analyzer instrument, in the form of a "front panel" 40 comprising a Data Source panel 42 to provide data acquisition from a DAQ data acquisition board plugged into an end user computer, a Data acquisition control panel 44 to control the Data source panel, and a Spectrum analyzer panel 46 to perform data analysis and visualization.

As described in detail below, each of the instrument components illustrated in FIG. 1, including data source 42, DAQ control panel 44 and Spectrum analyzer panel 46 corresponds to an active software object, called an "aspect" in this description of the invention, that has been created, defined, and interconnected to other components using the application development software of the present invention. The application development process is generally the same for the simple and for the complex user application. Thus a user application developed to handle a very complex test and/or measurement project would likely comprise a plurality of front panels like front panel 40 of FIG. 1, each front panel constituting one or a few separate instruments, but the appearance of each front panel in the complex application would generally be similar to that shown in FIG. 1. Preferably, each front panel developed by a user should constitute the complete "solution" of one instrumentation task.

The instrument components shown on FIG. 1 collectively form a "front panel" 40 that is a functional Spectrum Analyzer virtual instrument, fully capable of sampling measurement data collected from a DAQ data acquisition board, and of displaying to a user pertinent spectrum information concerning the spectrum of the input measurement data. Said front panel thus represents and models a stand-alone electronic Spectrum analyzer instrument, and (in association with a DAQ board), it has the same functionality as the physical instrument.

Figure 2:
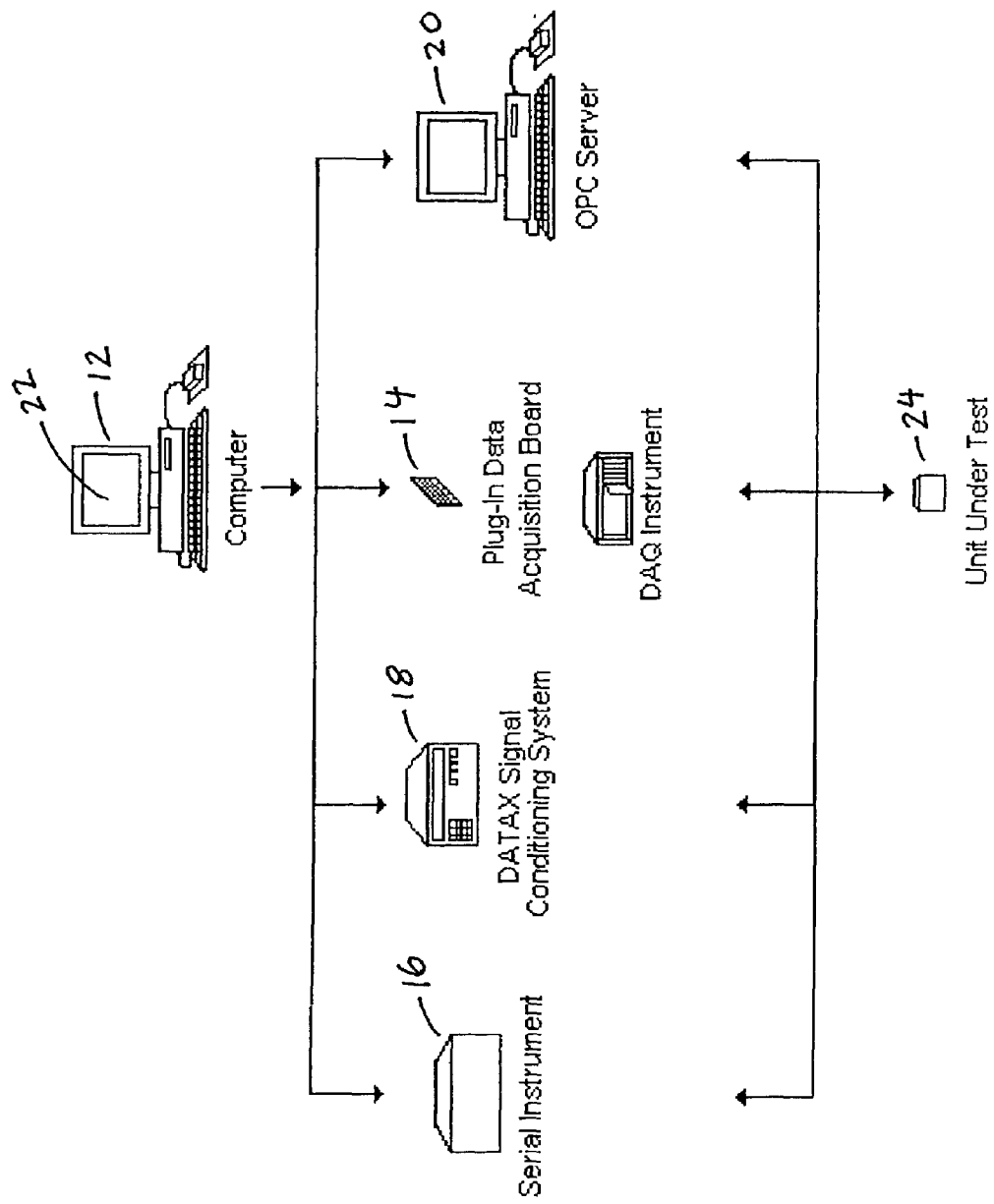
FIG. 2 is an overview of a computerized measurement system suitable for use with the invention.

It is a principal objective of the present invention to enable users to develop measurement application programs that may be run in a wide variety of measurement environments. In particular it is intended and contemplated that measurement application programs developed by users of the invention will generally be suitable for use in measurement environment comprising a personal computer or workstation operating under the supervision of a Windows operating system such as Windows XP (and earlier Windows operating systems). FIG. 2 thus illustrates a typical end user measurement system 10 in which a measurement application designed and built using the present invention would be operated.

The system 10 comprises a computer 12, which is connectable to a plurality of instruments which may include a data acquisition ("DAQ") board 14, a serial instrument 16, a DATAX signal conditioning instrument 18, and a second computer 20 acting as an OPC server. Data acquisition board 14 is coupled to the computer 12 by being plugged into an I/O slot in the computer such as a PCI bus slot, an ISA bus slot, or an EISA bus slot provided by the computer. The serial instrument 16 is coupled to the computer 12 via a serial port such as an RS-232 port provided by the computer. OPC server computer 20 may be connected to computer 12 in any of many ways including a wired or wireless network connection. One of more of the instruments coupled to computer 12 may also be coupled to a unit under test (UUT) 24, or may be coupled to receive field signals generated by transducers. It should be understood that computer 12 may be coupled to transducers, and other forms of data acquisition means, by a large variety of additional connectivity means, for example including a wired or wireless Ethernet interface; other possible means of instrument connectivity include the wide variety of wired and wireless means and protocols, including networking means and protocols, now or in the future available to transfer data to a computer.

When used in a measurement system like that of FIG. 2, a measurement application developed using the present invention would be embodied in a software program stored on a memory or hard drive of computer 12 and executed by a central processing unit (CPU) of the computer. Computer 12 may be a typical personal computer comprising the various hardware components typical of personal computers as sold to the general public. Accordingly computer 12 includes at least one central processing unit, or CPU, which may be of any of various types, including an Intel Pentium processor, or a processor from the AMD family of personal computer processors. Computer 12 comprises generally the internal components (not shown) that are typical of personal computers, including besides the CPU a main memory, a host bus, and assorted memory drives, and it also comprises a display monitor 22. The main memory of computer 12 is the preferred primary location for the storage of any measurement application developed using the present invention. The main memory, or other forms of memory associated with computer 12, also stores so-called "low level" instrument driver software as needed for communication with, and control of, data acquisition hardware devices such as data acquisition board 14, DATAX signal conditioning instrument 18, and other devices external to computer 12 for collecting or processing measurement data.

It is a principal feature of the present invention that a user develops an application by the manipulation, using graphical tools and techniques, of icons and "panels" that represent components of virtual instruments, and by the configuration of the properties of said panels, selecting operational and connectivity options that are presented to the user from property pages associated with each panel. This graphical programming approach conforms closely to the user's intuitive understanding of the requirements of the desired measurement solution, by focusing the user's attention on identifying a data source of interest, identifying one or more visualization tools considered most useful to view the measurement data, directly or in a processed form, and identifying the types of controls most suitable for controlling the application. Technical details regarding the forming of interconnections between component panels are handled by the software, which presents the user (through the property page of each panel) only with pre-defined connectivity and other options that are appropriate to the user's collective selection of components.

Known prior art graphical programming environments for measurement applications all require the user effectively to design and build a data flow diagram of an intended application, and to "wire" connections between components. These prior art systems accordingly rely on the user to know which connections are desirable, appropriate and compatible with the other components to be used in the potential application.

In contrast to such prior art graphical development environments the present invention presents the user with several groups of instrument components, grouped by function principally into a "data source" group of panels, a data visualization or "display" group of panels, and a third group of "controlling panels." The three principal groups of instrument component panels serve to model, and correspond to, instrument components that are functionally familiar to the user as an instrumentation system user, rather than as an instrumentation system designer or a software programmer. It is therefore intuitively natural for a user of instrumentation devices and systems, who knows the intended application but who may be wholly ignorant of software programming techniques, to select and organize the required instrument component panels into the desired form of measurement application.

The user-friendly development environment of the present invention is the result of an underlying software architecture in which each virtual instrument component (that is, each "panel" usable by a user, such as a "digital display panel") is represented in software by a full-featured software object, here generically called an "aspect", which comprises the full set of attributes, functions and connectivities required to accomplish all tasks that might be assigned to an aspect of its type. Thus, all aspects inherently contain the functional capability to form connections with all other aspects with which they might potentially be required to interconnect; conversely certain aspects are equipped with such filters as are required to block their interconnection with any other component in any circumstance where such interconnection would be inappropriate.

In the course of developing a measurement application the user thus selects, and locates on the design desktop of a "front panel", by means of "drag and drop" and related graphical environment techniques, subsidiary "panels" that represent instrument components, including "data source panels", "data visualization panels", and "controlling panels." Each of these instrument component panels in turn represents a software object (an "aspect") having functional attributes appropriate to the corresponding instrument component. Software tools including, for each component "panel", a property page handler, allow the user to access selected component panel properties, and thereby to define the characteristics, behavior and actions of selected component panels. In like fashion the user is enabled to effect appropriate interconnections between available data sources and a large selection of virtual instruments, including displays, control devices and analytic processes.

For example, aspects having the nature of a "data sink" (e.g., a "digital display"), that serve to consume data from a data source, inherently comprise the capability to locate within the system any available data source that is supported by the particular data sink type. When queried by the user (simply by clicking open the property page of the data sink "panel" placed on the desktop by the user), the data sink presents to the user a detailed listing of available data sources; for any said data source selected by the user, said property page then displays a tree view of only those data channels that are supported for display by the data sink panel. Upon selection of a desired data channel by the user, the data sink aspect contains the functionality required to establish automatically a data link between the data source and the data sink to serve as base carrier of the data channel selected for streaming data to the data sink.

A central feature of the present invention is therefore the use of a software architecture that relies on full-featured and immediately executable software objects, herein called "aspects", as the principal software agents for creating a development application. The use of "aspects" as software objects in the present invention, and their form and functions, derives from the use of similar concepts in so-called Aspect-Oriented-Programming (AOP). In AOP, a programmer sets out to identify, group, and express, in the form of an "aspect", the attributes that are to characterize, collectively, each particular object of an intended system. For any given object, in AOP, aspects of concern may thus be:

What the objects do
Where are they located
Communication
Synchronization

Once all such pertinent attributes have been identified, grouped into categories, and individually expressed in machine-readable code, all of the intended system's "aspects of concern" are then combined in a final executable form. This architecture enables the combination of aspect attributes into interconnected objects, simply by organizing aspect descriptions at will.

In a manner inspired by the AOP paradigm, the development software of the present invention comprises libraries of executable code segments, each optimized to implement a discrete method, property, action or other attribute that is potentially usable by numerous objects. Using these libraries of code segments as raw materials, a blank aspect "core" may be fitted with specific characteristics, including methods, properties and other attributes, and thereby be enabled to represent either a data source or another component of a virtual instrument such as a visualization component or an instrument control component. Each aspect may also be selectively provided with specific connectivity to other aspects, thereby allowing for transfers of measurement or calculated data, event data, and instrument control instructions, among aspects.

Some basic functionalities are shared by all full-fledged aspects employed in a system according to the invention, others are shared by (and thus a characteristic of) all aspects of a specific type and class, such the data source panel aspect class, or the controlling panel aspect class. Still other functionalities and attributes are specific to a particular aspect, as configured by the user from a defined set of options presented to the user by the software.

Each particular "aspect", that is, each aspect that represents a specific instrument component, is thus constructed in large part of a set of attributes (any of which attributes may be shared by a number of other aspects) that have been selected from libraries of pre-defined attributes existing as executable code segments. Any one aspect may typically also comprise in addition one or more attributes that are strictly specific to that aspect, but these also are represented by one or more executable code segments. As particular properties of an aspect are defined by the user, under the guidance of selections presented by the property page of the aspect, the aspect is tailored to comprise only those properties needed for the user's application.

The actions of the user in selecting instrument component panels, and configuring their properties, serve to define the content and properties of the user's intended application program. These actions by the user also operate to create a textual file, called in this description an Aspect Interaction Language (AIL) file, that contains a description of the selected, created and defined software "aspects", including, for each aspect, a description of its properties and connections. As the user adds more panels, selects more properties, and effects connections between panels, the AIL file expands into a complete textual description of the user's program.

Using AIL description language, the file embodying the user's application comprises only a relatively few, human-readable lines that set forth identifications and descriptions of the aspects used in the application, and their interconnections and interactions, in lieu of hundreds of lines of source code needing to be parsed and compiled or interpreted. Using the AIL approach, no compiling or interpretation is needed. At run time, parsing of the AIL listing by the execution subsystem invokes the described aspects and their interconnections, now in the form of optimized code built into the software of the system, that represents the specific aspect properties, methods, data transfer mechanisms, and other actions and procedures required to execute the user's project.

Once having activated the code segments that make up the aspects defined in the AIL file, the AIL file plays no further active role in running the application. From that point onward, it is the aspects themselves (that is, the code segments present in the front panel by virtue of having been selected in the course of the "assembly" of each aspect) that autonomously execute, without further direction, all of the actions called for by the user's application. In effect the software architecture of the present invention allows for the creation of aspects as independent software agents, each aspect comprising a combination of properties, functions, actions and connections, that, left to its own devices will carry out the tasks assigned to it without outside direction, including interconnecting and inter-relating as needed with other aspects on its front panel.

Examination of a user program, in the form of its AIL file, shows that it is consists only of front panel identification and formatting information, followed by a brief description of each aspect on the front panel and of that aspect's attributes. FIG. 3 thus reproduces the complete AIL file of a user program creating the Digital Display instrument of FIG. 26, the creation of which by a user is described below. The AIL file of FIG. 3 starts with an identification of the "front panel" of the instrument (on FIG. 3-*a*), and there follows a short description of each aspect on said front panel. Thus FIG. 3-*b* contains the AIL description of the data source aspect, FIG. 3-*c* contains the description of the digital display aspect, and FIG. 3-*d* contains the description of the DAQ control panel aspect. As shown on FIG. 3, the AIL file is not written in a programming language, it is only a description language, but this textual description suffices to identify the executable code segments that are activated in running this user application.

User programs created using the present invention are accordingly always optimized, and ready-to-run immediately upon completion of program design. Each aspect employed in the user's program is comprised of pre-written pieces of compiled code. The user can generally modify at will the behavior or properties of a selected aspect, but in each such instance the code corresponding to the modification is already compiled, and standing by for possible use.

The aspect-based architecture of the software of the present invention has many advantages. For the developer of an embodiment of the present invention, the division of principal system components into libraries of discrete and executable code segments makes it easy to separate program tasks into separate aspects; easy to reuse components to create new aspects; easy to scale; and, by providing for maximum usability of source code, it reduces duplicate code writing.

For the user of a graphical programming environment according to the present invention, the system is remarkably fast in operation, because the user develops a program using as tools only basic descriptions of aspects, which in turn represent existing and optimized executable code segments. Thus no compilation or interpretation of code is necessary to execute a program designed by the user.

The operation of the software of the invention in the context of the development of a specific user application will now be described in greater detail.

As the software tool for handling the creation of aspects and effectively for managing the design workspace, each front panel is provided with an Aspect Handler. The Aspect Handler has the functionality to create aspects, using as building blocks code segments selected from a large collection of executable code segments scattered throughout the plurality of aspect segment libraries. As stated earlier, these libraries contain executable code segments that represent discrete attributes having potential uses for a plurality of objects, and that are capable of being combined into selected sets to form the software objects herein called "aspects".

For the user there is presented a graphical environment, including a design desktop comprising a "front panel" workspace and a variety of graphical tools under the control of the Aspect Handler. These tools include a menu button and several "flying tool windows", for accessing and selecting panel icons that represent instrument components. Upon selection and configuration by the user, each instrument component panel will be transmuted into a software aspect capable of functioning in runtime as an autonomous software agent.

The front panel Aspect Handler has the capability to cobble together an aspect by assembling various fundamental aspect parts, including a set of core functionalities shared by all aspects, a set of aspect class core functionalities, shared by all aspects of the specific type "ordered" by the user, and a set of specific aspect functionalities selected by the user. The aspect class functionalities and attributes of each specific class of aspects include a property page handler, having the functionalities required to allow the further configuration of an aspect of its type. Thus, the Aspect Handler of the front panel having placed on the design desktop a representation of an aspect of the type desired by the user, the user then completes the formation of that aspect by accessing the property page of the aspect and making such final configuration decisions as are necessary to fully equip the aspect to carry out its intended function.

A full-fledged aspect, comprising the resulting sets of properties, functionalities and connectivities is then formed upon the user's exercise of a Save function, which serves to archive the development actions of the user made to that point. Where this Save action occurs upon the user's completion of a front panel embodying a complete solution to a measurement task, a user application is created.

Figure 4:
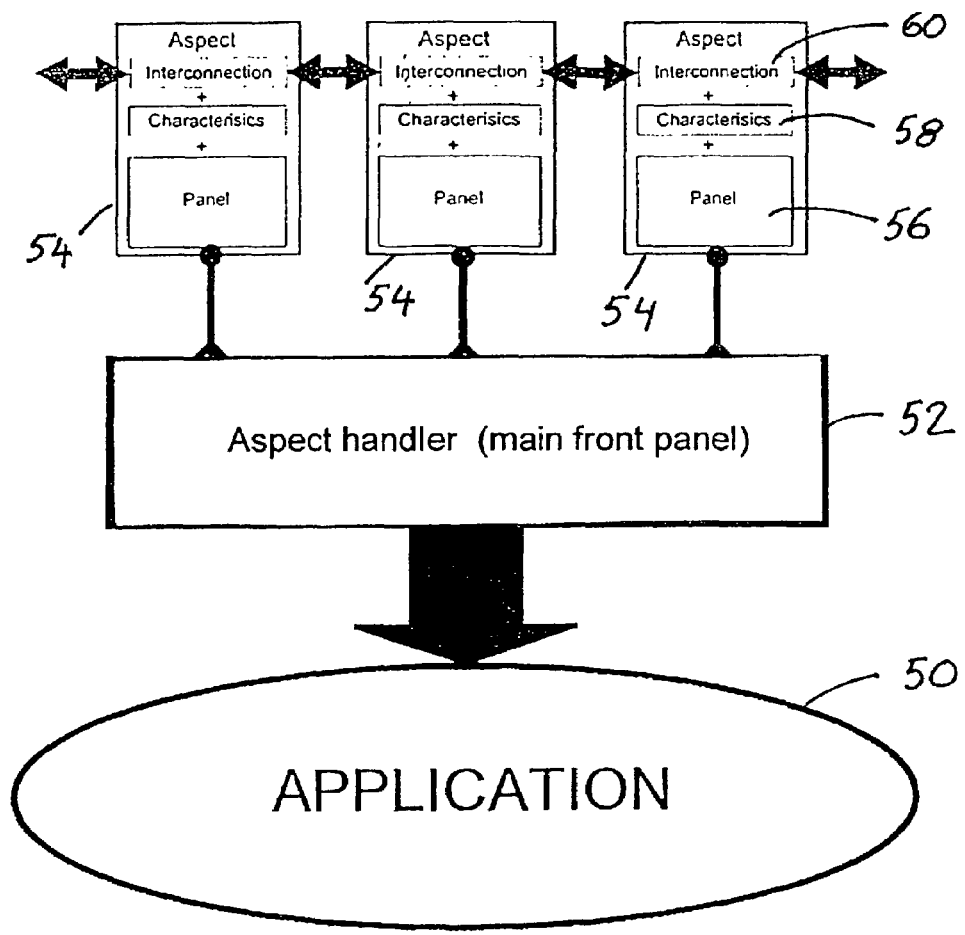
FIG. 4 is a diagram illustrating the functional role of a front panel "aspect handler" in creating user applications.

FIG. 4 illustrates the role of the role of the front panel Aspect Handler in creating a user application. As shown diagrammatically in FIG. 4, user application 50 comprises front panel Aspect Handler 52 (and its associated housekeeping functions, not shown) and the several aspects 54 created by the Aspect Handler as described above. Each of aspects 54 comprises a panel 56 (representing the user-visible elements of the aspect, including its property page as presented to the user), a set of characteristics 58 including core functionalities shared by other aspect types and characteristics specific to each aspect type, and a set of interconnection functionalities 60 that provide for the interconnection of aspects to implement the streaming of data and the communication of control and event notifications.

Importantly, each aspect 54 in user application 50 consists simply of the code segments that were referenced by the Aspect Handler and the user (through the property page of each aspect) in configuring each of said aspects, in the course of assembling that particular aspect for use in this front panel.

A general description of the now configured aspects that make up a user application is then saved as an AIL file, which simply identifies, in a high level, descriptive manner, a short-hand description of the functionalities, properties and connections embodied in the code segments assembled by the Aspect Handler and by the property page handler of each aspect, as described above.

Figure 5:
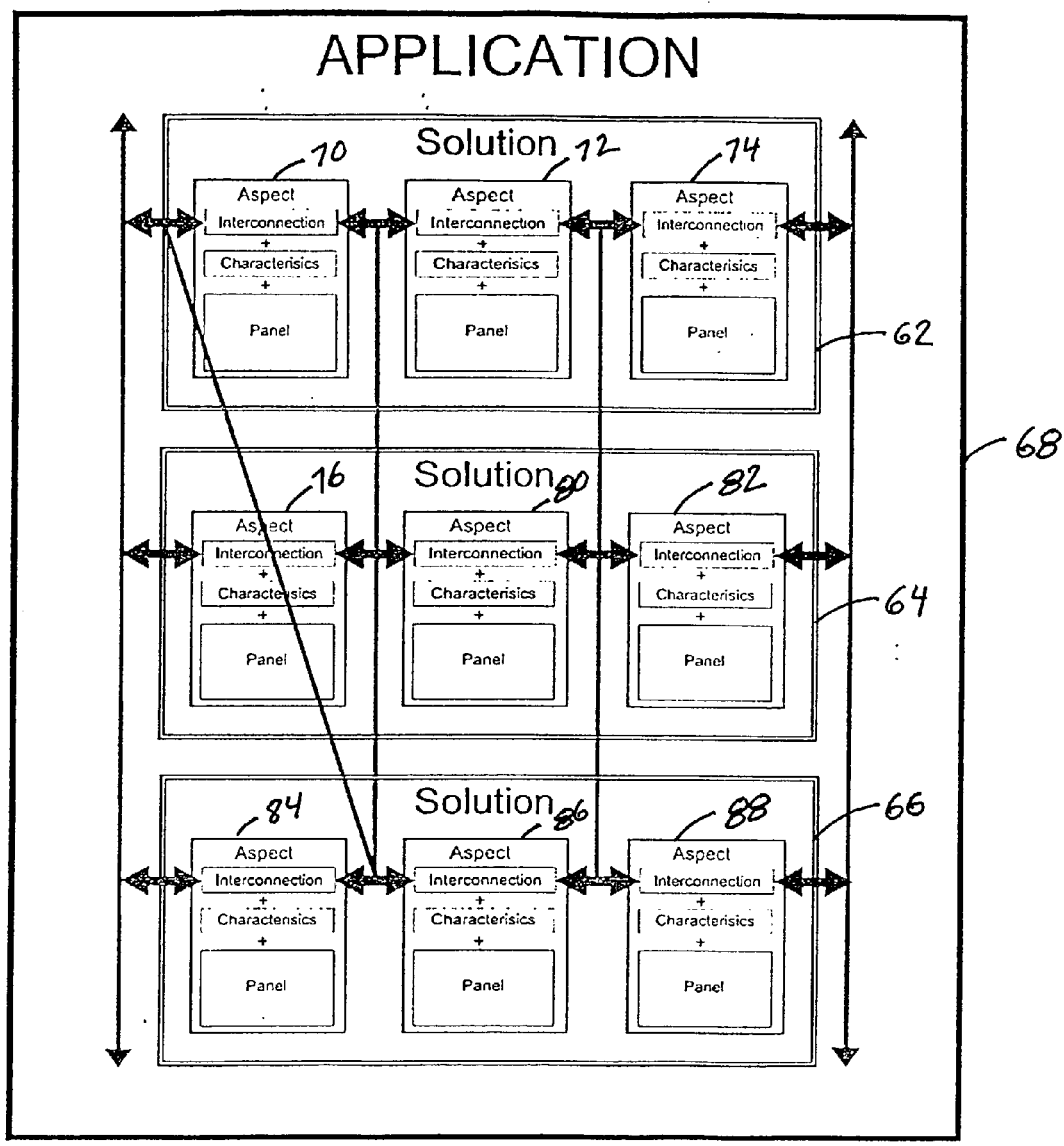
FIG. 5 is a diagram illustrating the general relationship among software aspects in a user-developed application according to the invention.

The operational interrelationship of the aspects employed in a completed user application is illustrated in FIG. 5. Aspects 54 are grouped into a plurality of "solutions" 62, 64 and 66 that collectively constitute user application 68. A first solution 62 might for example consist of the panels required to sample measurement data from a data channel of data source aspect 70 and to display such data in a Digital display aspect 72 under the control of a DAQ controller aspect 74. A second solution 64 within the same user application 68 might be the sampling of data from a different data channel of data source 70 by a meter panel 76 under the control of a meter controller 80 and independently the recording of said data with a file recorder panel 82; a third solution 66, still part of the same user application, could be the processing by an oscilloscope panel 84 of the measurement data from the two selected data channels of data source panel 70, under the control of an oscilloscope controller panel 86 and also under the control of a comparator panel 88.

As in FIG. 4, each individual aspect shown in FIG. 5 comprises a "panel" 56, representing the desktop representation of the aspect that is visible to the user and that comprises a property page and a property page handler for user configuration of selected aspect properties. Each aspect also comprises a set of characteristics 58, which will generally comprise attributes, properties and actions (as will be further detailed below); lastly, each aspect 54 in user application 68 also comprises a set of interconnection functions 60 that serve to define and establish such interconnections with other aspects as have been established in the development of the user application. As diagrammed in FIG. 5 each aspect is in theory potentially capable of interconnecting with every other aspect; however particular aspect types have been defined to constrain their potential interconnections in particular ways, as discussed in greater detail below.

Data Transfer Mechanisms

For the interactions between aspects, and particularly between aspects representing measurement data sources and aspects that represent virtual instruments that display or process measurement data, the invention provides three basic mechanism for the streaming or transfer of data: data channels; control channels; and event channels. As described in detail further below, the invention also provides graphical connection-handling user interfaces for each of these three types of data streaming mechanisms, accessible from the property pages of the pertinent aspects.

Figure 6:
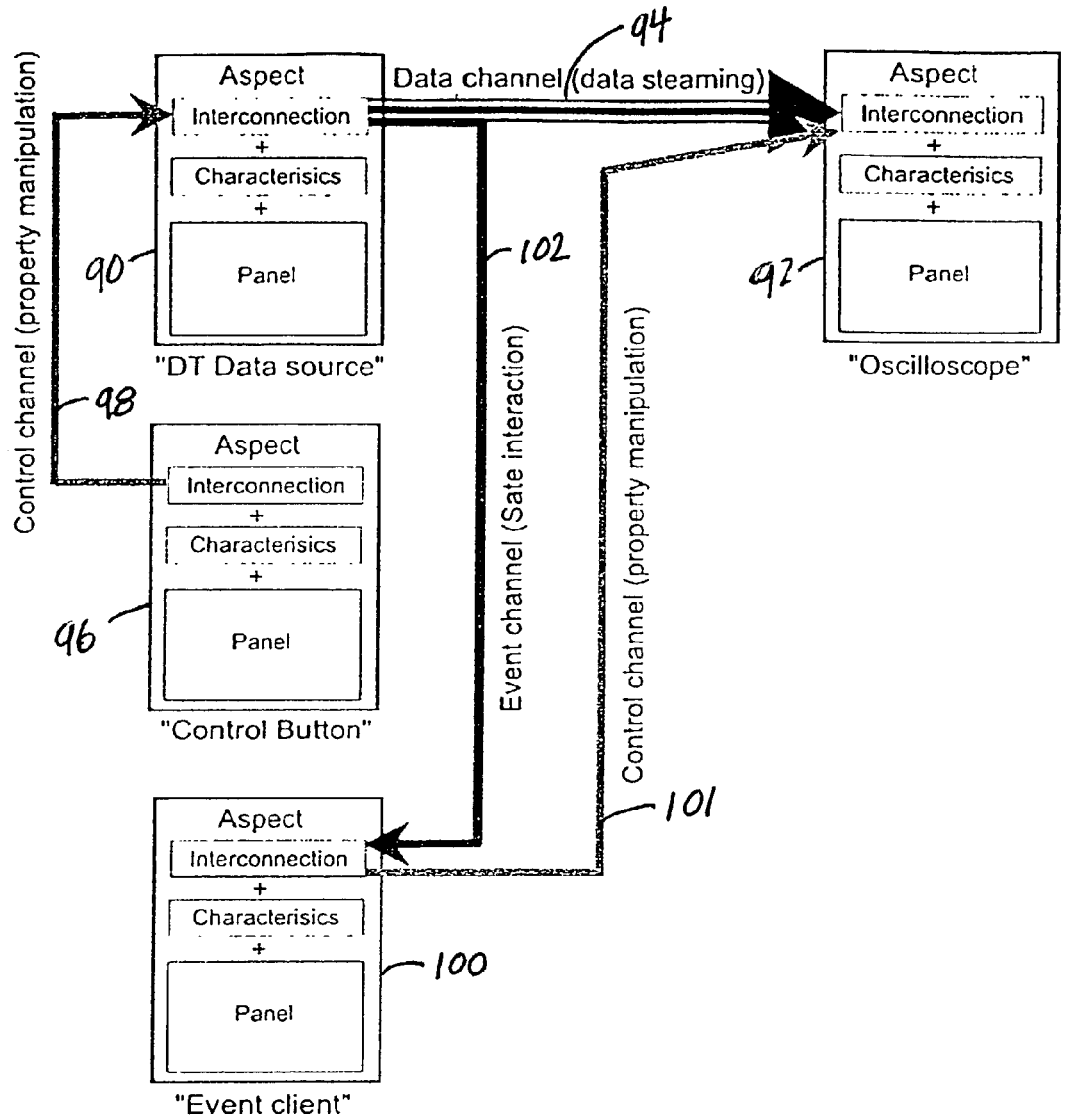
FIG. 6 is a diagram illustrating the operational relationship of software aspects employed in an "Oscilloscope" instrument developed using the invention.

The interrelationship of the three basic data transfer mechanisms employed in the invention is illustrated in FIG. 6. There is shown in FIG. 6 a data source aspect 90 streaming measurement data to an oscilloscope panel aspect 92 over a data channel 94; the sampling of data to said oscilloscope panel is controlled by the user with a "control button panel" aspect 96, which transmits control instructions to data source 90 via a control channel 98. Whenever the sampling of data by data source 90 is stopped (by user operation of data source control button 96, or for any other reason), data source aspect 90 publishes an "event" that reports said stoppage to the connected "event client" panel aspect 100, via event channel 102. On receipt of said event, event client 100 initiates an action (predefined by the user upon configuring the event client panel), for example event client 100 sets the "Action" property of oscilloscope panel 92 to the value "Save data," via control channel 101, thereby initiating a save data operation.

Aspects that have the characteristics of a data sink (e.g., a digital display, a meter, or an oscilloscope) can receive data from a data source via a data channel and display or process this data. Certain panel aspects, including for example a formula panel, act as a data sink in receiving measurement or processed data from a data source, but may themselves act a data source of processed data to yet another data sink aspect, say a line recorder panel aspect. In this description the terms "data source" and "data sink" are accordingly generally functional. One category of aspects, however, the "Data source panels" aspects, consists of aspects that function only as data sources, and never as data sinks.

Data channels having the task of handling the data streaming of measured or processed data (sometimes collectively called "real data" in this description) are provided by special "cores" having the general attributes of a data source. The data is transferred through these channels as a buffer, or as a single value (if the data source is a single value based data source). In this and subsequent discussions of data transport mechanisms it is important to be sensitive to the different meanings that, in virtual instrumentation software descriptions, can be ascribed to the term "data channel". In this paragraph the term "data channel" means a connection between a data source and a data link, through which data is streamed. Such a data channel (stream) can transport one or more "real data" channels or "DAQ data channels". For example, a data source might be set up to acquire data from the (DAQ) channels 0, 3, and 4 of a DAQ board 14 that is, or is to be, plugged into computer 12 in the end user measurement system illustrated in FIG. 2. All three of these designated "DAQ data channels" or "real data" channels are then transported collectively through one (stream) "data channel" to a connected client panel such as display panel.

The connection of a data source to a data sink aspect is effected by establishing a data link between the two aspects. Such a data link is established by the user, from the property page of the data sink aspect: this property page will generally contain a "Channels" button, that opens a page containing for example combo boxes and other graphical tools and guides for selecting a data source, viewing a tree of the ("DAQ") data channels of that data source that are available to and supported by the data sink, and selecting a desired channel for the streaming of real data.

The data link formed as described above is a software object comprising the identification information regarding the data source aspect with which the data link is being formed, and the ID of the one or of a selection of ("DAQ") data channels of the data source. When configured this data link will serve as the base carrier of the ("DAQ") data channels.

Two different types of data links are preferably provided for handling the streaming of "DAQ data." A first type, the "single channel" data link type, is defined to serve single-channel consuming data sinks, such as a "Digital display" panel aspect, the property page of which allows for the users selection of one and only one "real data" data channel. A multi-channel type of data link is separately provided that allows transfers of "DAQ data" from a selection of ("DAQ") data channels provided by a data source.

In a preferred embodiment of the invention, the single channel data link class comprises data reduction functionality, for example including the capability for converting buffer data to single value data in accordance with any of a variety of data reduction algorithms. Such algorithms preferably include: buffer average; RMS; standard deviation; and first value, minimum or maximum value of one channel, giving one value. (Preferably the following additional predefined functions are also made available for calculating virtual channels: Sum, difference, product and division of two channels; two-point scaling; polynomial linearization of one channel; and fast Fourier transform (FFT)).

When designed for use in "single process" environments, a system according to the invention will preferably be designed to make all data channels that a data source is set up to acquire available to all data sinks, including a data sink aspect having no need for particular ones of said data channels. The reason for this design choice is that sending all data source data channels to all data sinks, by reference, is faster and thus more efficient than it would be to select and assemble such data channels in accordance with the needs of particular data sinks. Different considerations would apply with respect to a system designed for use in multi-process or distributed environments; for such environments an arrangement whereby data acquired by a data source is assembled depending on the needs of particular data sinks would preferably be implemented.

Figure 7:
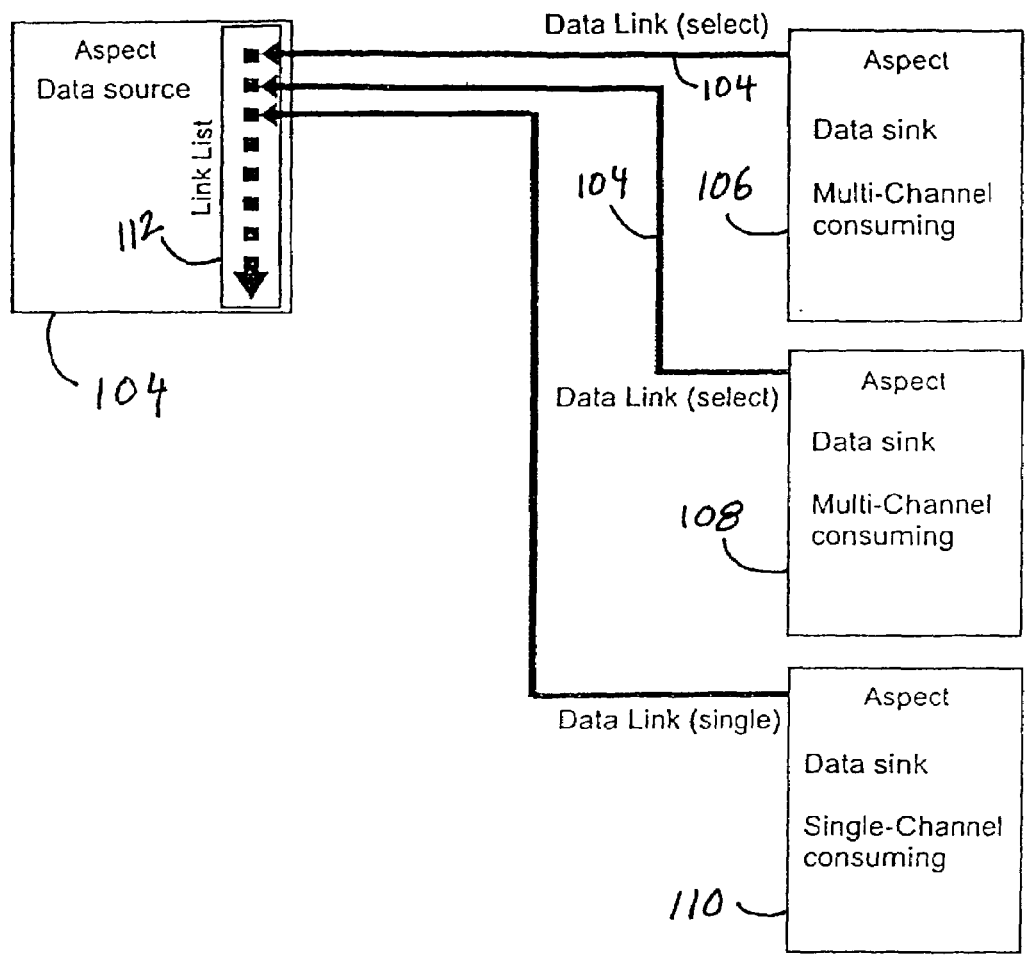
FIG. 7 is a diagram illustrating and comparing data link mechanisms used by single-channel consuming and by multi-channel consuming data sink aspects.

FIG. 7 illustrates the two types of data links that may be established between data sinks and a data source. There is shown in FIG. 6 a data source aspect 104 providing a plurality of data channels. A first "multi-channel consuming" data sink aspect 106, such as an oscilloscope panel aspect, and a second "multi-channel consuming" data sink aspect 108, such as a spectrum analyzer panel aspect, each of which require to access multiple channels of a data source, have each established a data link to data source 104 consisting of a "multi-channel allowing" data link. These multi-channel data links allow the user to choose from a selection of channels provided by data source 104. A third data sink 110, which is a single-value consuming data sink, such as meter, has also established a data link with data source 104, but this data link is of the single-channel type. A single-value consuming data sink like data sink 110 can receive the data of only one "DAQ data" channel, and accordingly can establish only a single data link of the single-channel type. Also as shown in FIG. 7, data source 104 maintains a link list 112 for recording all extant data links. Each data source aspect maintains such a list of its connected data links, and employs this list in addressing streaming data to the data sinks that established the respective data links.

Each aspect in an embodiment of the invention comprises a variety of characteristic properties and methods, i.e., functions and actions. For some types of aspects, including certain data source aspects and certain visualization aspects, specific properties of the aspect can be accessed, and then changed or triggered, by the action of another aspect or from the property page of another aspect. In other words the properties and actions of one aspect may be controlled, in well-defined manner, by another aspect. For example, the buffer size of a specific data channel of a data source panel aspect may be changed, at any time including in "run time", directly from a controller panel connected to the data source panel.

To enable certain aspects thus to control the properties or actions of other aspects, the invention provides a communication mechanism called a control channel. Generically control channels are equipped to support several types of properties, including integer values, floating point values, boolean values, (alphanumeric) "strings", and also "enumerations", date and time. In appropriate circumstances, therefore, specific properties of one aspect, characterized by one of these value types, may be made subject to control by another aspect. Furthermore a controlling aspect is capable of controlling properties of a plurality of controlled aspects.

With the mechanism of a control channel, specific properties and methods of one aspect may be made visible to a second, controlling aspect (which may also be referred to in this context as a control source client, in that said controlling aspect is provided with a means exercising control over another aspect). In general a given controlling aspect is provided under the system of the invention with control only over a specific type of control channel. That is, where the controllable properties of an aspect may include both string-based properties, and/or properties having floating point characteristics, the assigning to another aspect of control over one or more of said controllable properties is generally constrained to properties that are appropriate for the specific controller and for the specific situation.

In some controller panel aspects the allowed properties depend only on their data types; in other controller aspects the allowed properties may also depend on which other controlled aspects may also be connected to the controller aspect. For example, connecting a "universal controller" panel aspect to a "string" type control channel, as a first control connection, will limit all subsequent connectable control channels also to "string" type control channels. This constraint is necessary because the user can only enter a single value into the universal controller panel, and this value must of necessity fit all controlled properties. On the other hand, a "button" panel has no such restriction, because the user cannot enter any particular values using a button panel, but can only set a pre-defined set of values and these values can be of any data type. Thus a button panel can be used to (simultaneously) set different sets of values, of varying types, in different controlled aspects.

Figure 8:
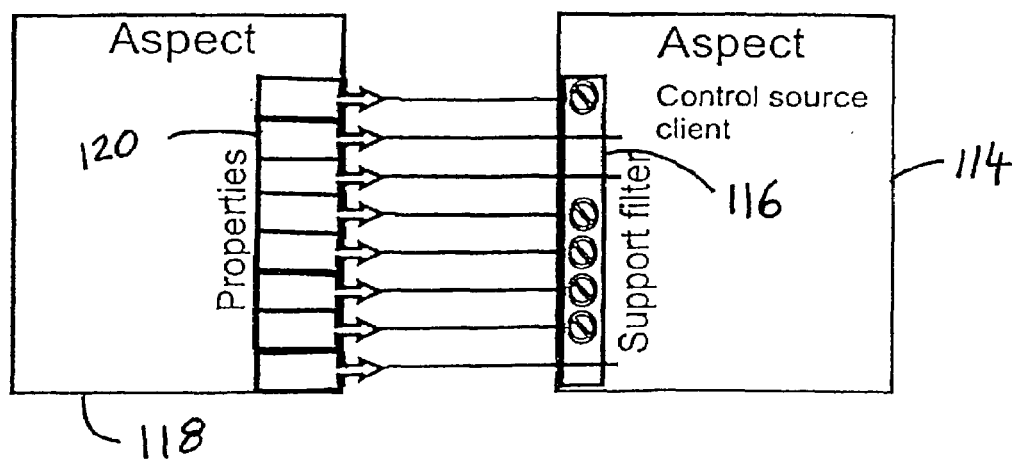
FIG. 8 is a diagram that illustrates the action of a support filter of control source client aspect to block property control channels of type not supported by control source client.

The setting of these constraints enables a system according to the invention to guide the user's configuration of controlling aspects. Thus, from the property page of a controlling aspect, the user is presented and provided with pre-defined selections of the controllable properties of the aspect to be controlled, limited to those controllable properties that are accessible to the controlling aspect (the control source client). For example, the property page of a "slider" panel aspect may be provided access to an integer type property of a data source, but cannot access, and therefore cannot be made to change, any "enumeration" type property such as the "Clock source" property of data source panels. The operation of these constraint is illustrated in FIG. 8, which shows Control source client aspect 114 comprising support filter 116 that serves to block access by said control source client aspect to property channels of controlled aspect 118 comprising a set of properties 120 including properties of a type not supported by control source client aspect 114 in this situation.

However there are provided, in a preferred embodiment of the invention, controlling aspects having control channels implementing a variety of control data types, thereby to enable control of controllable properties also of a variety of data types of controlled aspects including integers, floating point, strings, enumerations, Boolean values, Date, and time.

Preferably, one provided form of control channel is an "action channel," that is, a property control channel that enables specific actions to be executed when set, for user control of features such as "start measurement," or "open property page."

A list of the control channel links of each controlling aspect is maintained in the controller aspect base class. Control channel link objects are created in this base class list as needed.

Lastly regarding control channels and their creation, it is noted that (for reasons discussed in the next section regarding "event channels"), there is established upon the creation of any control channel link an associated "event channel link", as a housekeeping measure to provide the control source client (i.e., the controlling aspect) with information regarding any changes, for any reason, in the state of a property of said controlled aspect that is subject to the control of the control source client.

The third type of communication mechanism provided by the invention is called the event channels mechanism. The event channels mechanism is provided to allow aspects to react upon the occurrence of events in other aspects of the application. Applications developed using the invention may thus provide for a wide variety of "events" to be published by selected aspects, to effect actions by other aspects. For example a "data source" panel aspect may publish a "start" event, and subsequently a "stop" event, to inform other aspects (functionally, event client aspects) of its state.

Event channels result from the establishment of an event link between an event client aspect and an event-publishing aspect. Such an event link is created whenever an aspect having an event client property is connected, for any reason, to another aspect that publishes events, or an event client panel is connected to a user-controlled event of the aspect that publishes events.

Event links are used in the invention in several scenarios. Internally (that is, in a manner not visible to the user) event links serve housekeeping purposes and are used in combination with control channels for the broadcast of system events. Visibly for the user, event links are used notably in the "event client" panel, the property page of which allows the user to access "user events."

In a preferred system according to the invention, data source panel aspects generally have the capability to publish events, while the event client panel provides the user, if desired, with means for viewing the occurrence of selected data source panel events.

Figure 9:
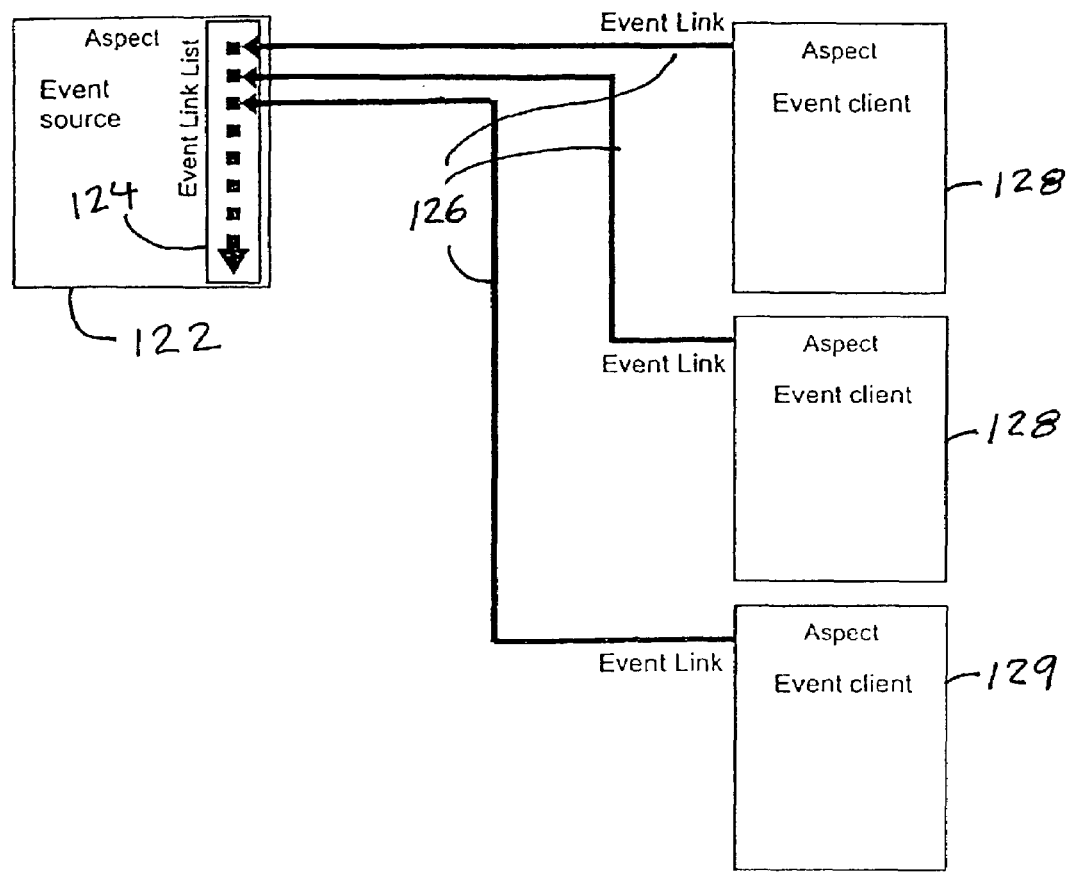
FIG. 9 illustrates linkage of a plurality of event clients to an event-publishing aspect.

In a preferred embodiment of the invention event channels transport only their event type, but no parameters. Also, event channels broadcast their signal to all connected event links. As shown in FIG. 9, an event source aspect 122 maintains an event link list 124 for event links 126 formed with event client panel aspects 128.

As noted above in the discussion of control channels, the setting up of any control channel occasions the creation of an associated event channel, designed and defined to support the publication of several categories of system events. System events are inherent to every descendant of the most basic of the system's base classes (herein termed the "TDX-ControlSource class). This system event publication function is invisible to the user of the system and serves four system tasks:
1. debug events;
2. ControlSourceRemove events: upon the removal of any aspect for any reason, a ControlSourceRemoveEvent informs all other aspects connected via a control channel to the aspect being removed;
3. PropertyUpdated events inform affected aspects of any change in the properties of a controlled aspect; and
4. ControlPropertiesChanged events likewise inform affected aspects of any value change in a property of a controlled aspect.

The three basic data streaming mechanisms provided by a system according to the invention, data channels, control channels, and event channels, are configured and implemented by connection-handling user interfaces that are accessible from the property pages of the affected panel aspects. The internal operation of these connection-handling user interfaces will now be described.

Figure 10:
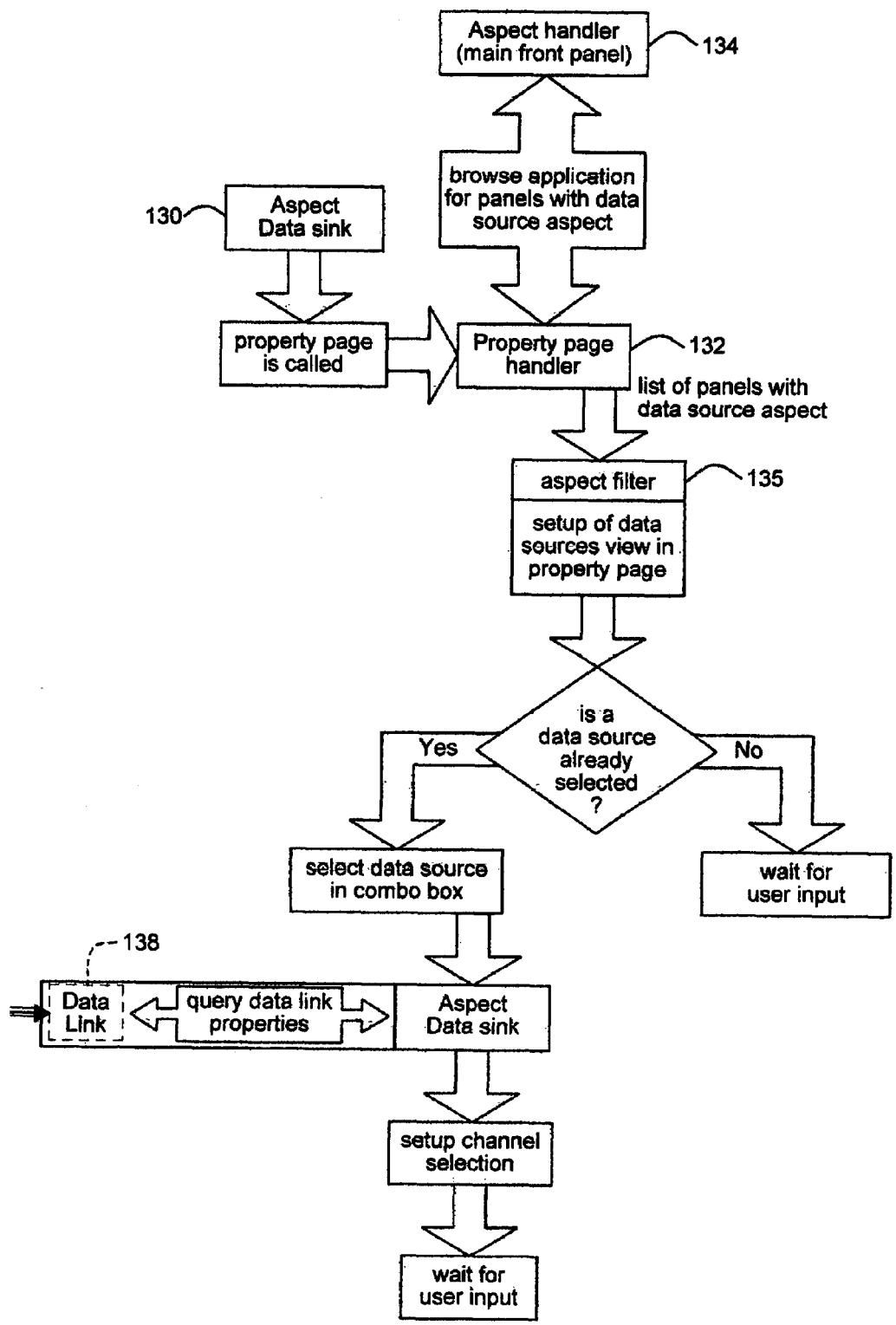
FIG. 10 a flow diagram illustrating process whereby a data sink aspect obtains available data source channel information for presentation to, and selection by, a user.

With respect to data channels for the streaming of data between a data source aspect and a data sink aspect, there is shown in FIG. 10 a flow diagram illustrating the general procedure whereby a user establishes a data link for the streaming of data between a data sink aspect 130 (say, a Spectrum analyzer panel) and selected data channels of a selected data source aspect.

As shown on FIG. 10, data sink aspect 130 has a property page that comprises property page handler 132. Upon the opening of the property page by the user, said property page handler browses front panel Aspect Handler 134 (which is the carrier of all aspects in the "front panel" then open) for any data source panels then existing within the front panel.

Figure 11:
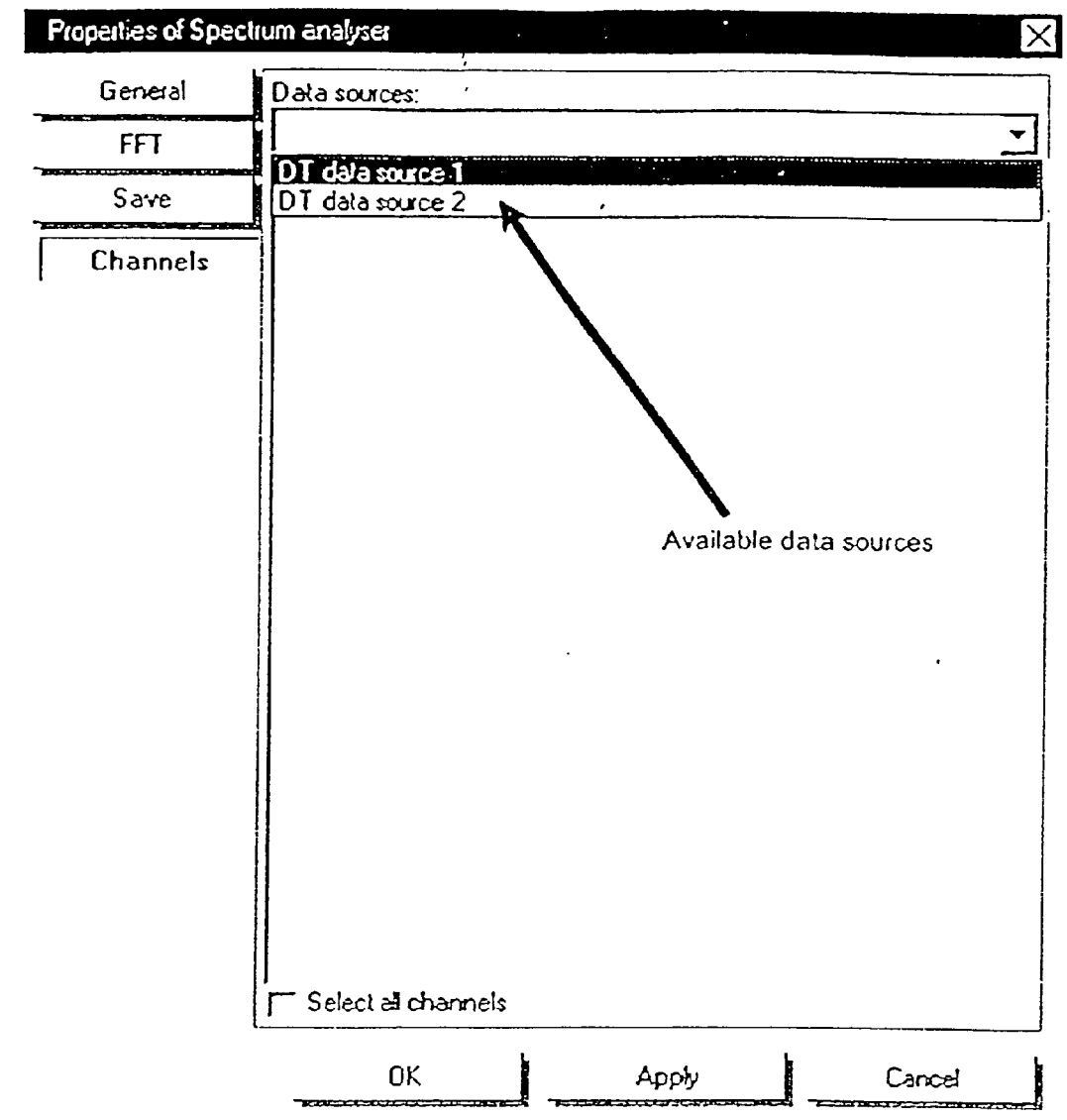
FIG. 11 is a screen shot of a data sink property page illustrating presentation of data source information to user.

A list of panels having a data source aspect is returned, and an aspect filter 135 of data sink aspect 130 determines, for each data source found, whether the data source accords with the needs of said data sink aspect. (For example, a filter criterium could be that this data sink accepts only single value based data, and accordingly rejects data sources that stream buffer-based data.) Data sources that fit the needs of data sink 130 are checked, and the resulting list of qualifying data sources is displayed, on a combo box, in a "data sources view" of the data sink property page (as shown on FIG. 11). Upon the selection of a data source by the user, from the listing in said combo box, data sink aspect 130 establishes a data link 138 to the selected data source aspect.

Figure 12:
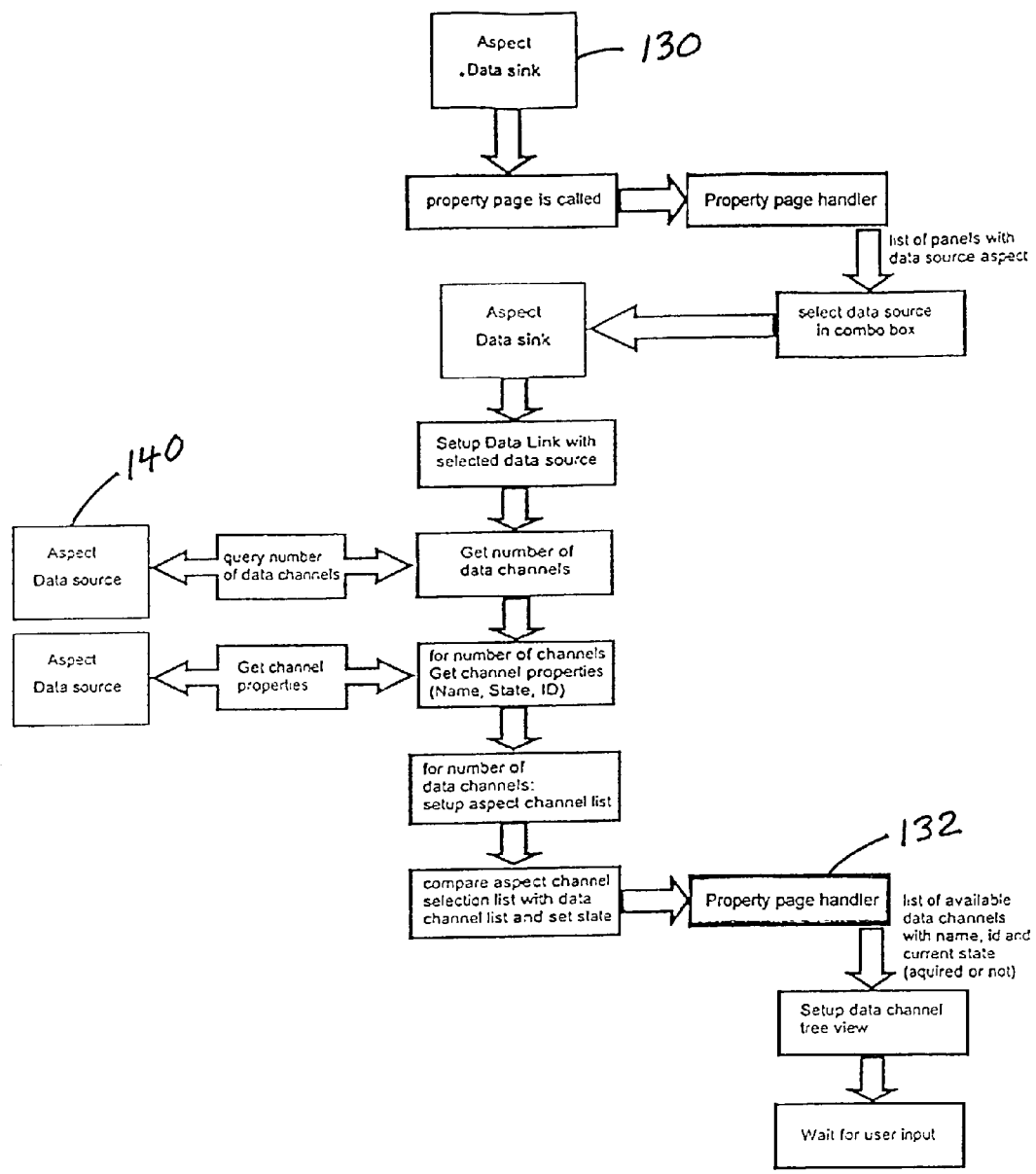
FIG. 12 is a flow chart illustrating the construction of a tree view of available data source channels within a window of a data sink aspect property page.

Picking up in FIG. 12 the continuation of the above-described process, data sink aspect 130, upon establishing a data link with the selected data source aspect 140, requests said data source aspect to provide the number of ("DAQ") data channels it provides and the basic properties of each of those channels, including its name, state and ID. On receipt of the list of data source ("DAQ") data channels, and of the data channel properties information, obtained from data source aspect 140, the property page handler 132 of data sink 130 creates from said information a data channel tree view, on the property page of data sink 130, for the user's selection of data channels. Such a tree view is illustrated in FIG. 13, which is a screen shot of the property page of a (Spectrum analyzer) data sink aspect, presenting for selection by a user a list of available AID data channels of a selected subsystem ("DT9804(00)") of a selected data source (DT data source 1).

Figure 13:
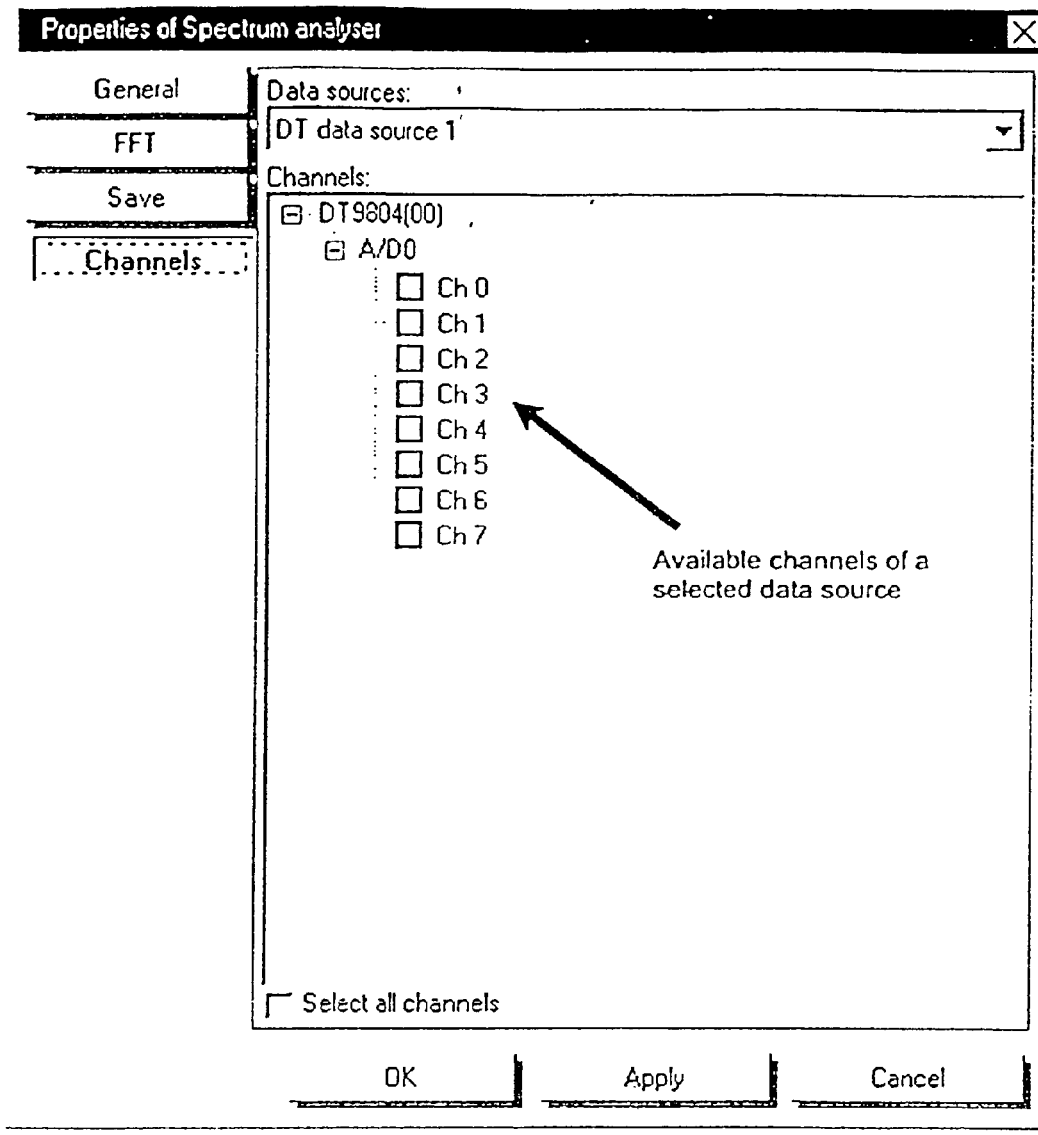
FIG. 13 is a screen shot illustrating the result of the process illustrated in FIG. 12 as presented to the user.

As shown on FIG. 13 all available and supported channels of a selected data source are listed on a tree view, to allow the user to choose the channels to be processed and/or displayed by the data sink (here a Spectrum analyzer). FIG. 13 thus illustrates that the channel tree view is preferably designed to enable the user to see, on a single page, an identification of the data source hardware device, its subsystem (here "DT9804(00)"), and a listing of all channels available to the user from that subsystem, thereby providing the use with an overview of the data channels available from the selected data source aspect.

Figure 14:
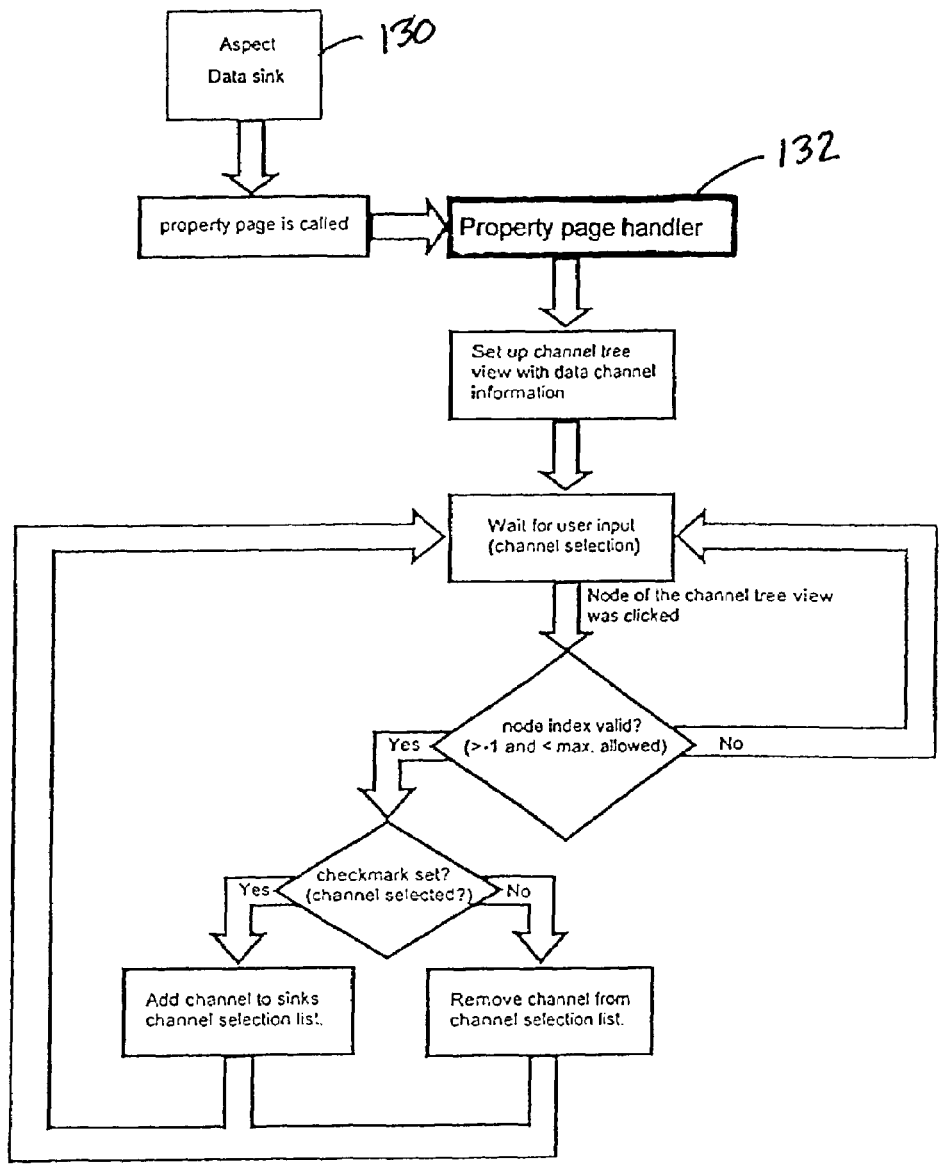
FIG. 14 is a flow chart illustrating the validity check process conducted by a data sink aspect property page handier upon a user selection of a data source channel.

To select a channel from the listing presented in the tree view of FIG. 13 the user has to set a checkmark by clicking the box adjoining the channel name. Upon the making of such a channel selection by the user, a validity check is performed. For a "single channel consuming sink" (for example a digital display panel), the maximum number of channels that may validly be selected is 1; for others the number of channels that may validly be selected is unlimited. If this check is successful, the state of the channel will next be checked. If a channel is checked (that is, a checkmark has been set by the user), the channel is added to the channel selection list of the data sink aspect; if the channel is unchecked, the channel is removed from said channel selection list. This routine is illustrated in FIG. 14.

Figure 15:
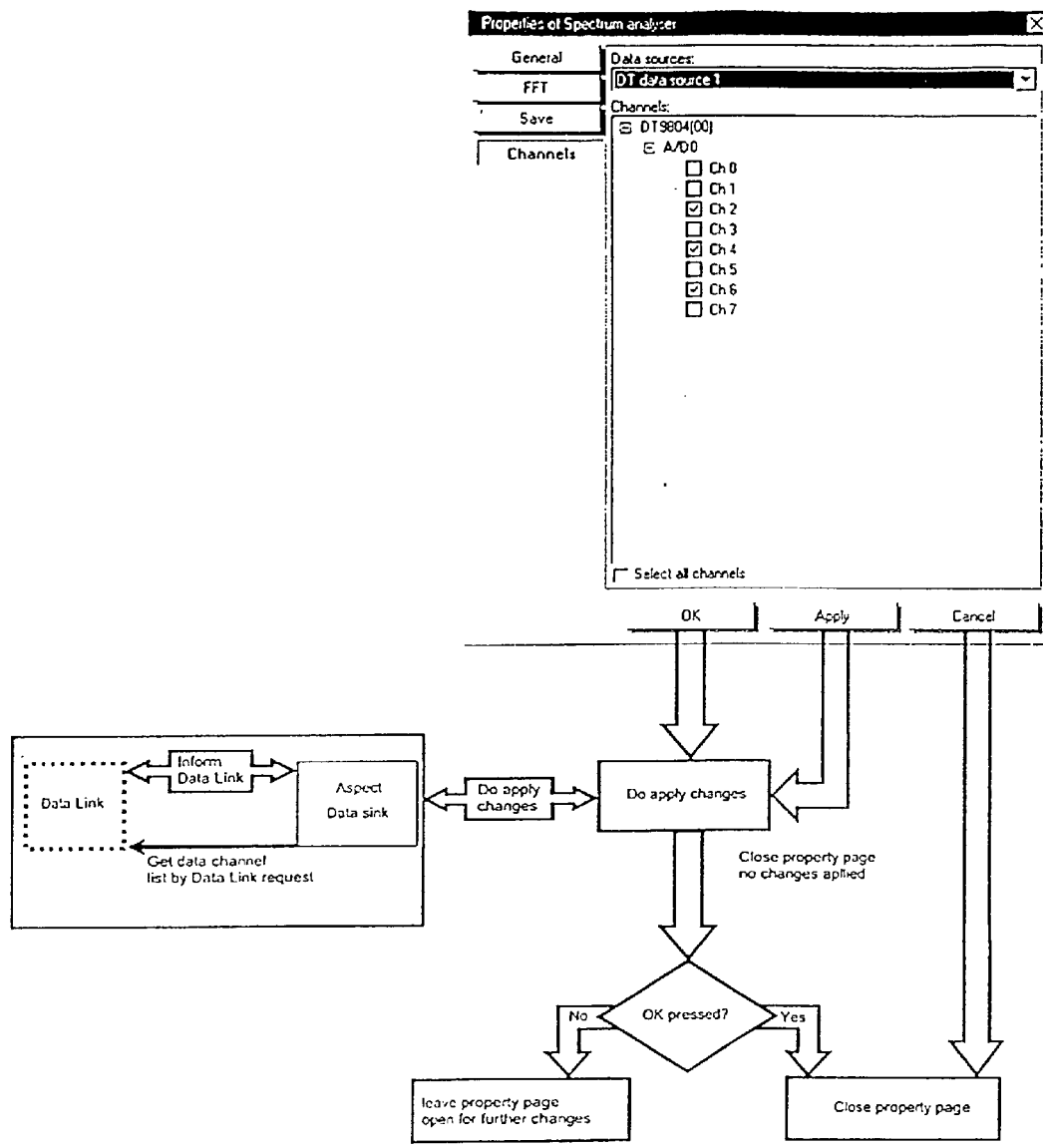
FIG. 15 combines a screen shot of a channel tree view presented by a data sink aspect property page and a flow chart illustrating the implementation of a user selection of a channel presented in said tree view.

All changes in channel selection, as described in FIGS. 10-14, are temporary until the user applies the changes, by pressing the Apply button of the property page of the data sink aspect, or closes said property page by pressing the Ok button on said page. If either the Apply or the Ok button is pressed the data link established by the data sink aspect is forced to update its settings to accord with the new channel selection imposed on the data sink aspect. This channel selection completion process is illustrated in FIG. 15.

Over a data channel between a data source (as sender) and a data sink (as receiver), "real data" may be acquired by the data sink in three ways: "buffer driven", "timed data thread driven" (single values), and "data on demand" (also single values). For all buffer-driven data sources a set of predefined functions are preferable implemented for calculating virtual channels, including the following: Sum, difference, product and division of two channels; average, RMS, standard deviation, first value, min or max of one channel, giving one value; two-point scaling; polynomial linearization of one channel; and fast Fourier transform (FFT).

The Creation of a Text File of a Measurement Application

The process by which a text file of a measurement project is created (in "AIL" language or in another appropriate textual aspect description language, such as XML) is as follows: panels as they appear on a front panel file menu, or within a "flying tool window", are only representations of the corresponding software "aspect". When a user "grabs" such a panel with the mouse, a "Start Drag" mechanism is initiated by the Aspect Handler of the front page on which the user is working. A "drag object" is created, containing an identification of its parent-container, and of the icon representing it, and the class name of the aspect corresponding to the selected icon.

As the user positions the selected panel icon at a location on the desktop, and "drops" the panel by releasing the mouse button, an "End Drag" function is called. The current mouse position (x, y) is referenced, and a validity check is made regarding the target location: generally an icon representing a software aspect may validly be dropped only on a clear space on a front panel workspace. (A few panels are defined to allow other panels to be dropped on them; for example, another panel cannot be placed onto an "oscilloscope" panel or a "digital display" panel, but certain panels can be dropped onto a "Group Box" panel, which is specifically designed to incorporate a plurality of certain panels).

As the user releases the mouse button that locates the panel on the front panel desktop, the function call "Add Panel" is invoked. This function first obtains the class name associated with the aspect represented by the selected panel. (Each type of aspect is associated with a corresponding base class, and inherits from still more basic classes. Thus a digital meter aspect is associated with, say, the class TDX-DigitalMeter; said class inherits from a data sink aspect type base class, and that class in turn inherits for a yet more basic class that comprises basic aspect functionalities common to all full-fledged aspects). The "Add Panel" function next checks to determine that the class associated with the selected panel is valid–Is there really a recognized aspect type corresponding to the selected panel? If this validity check is positive, that is, if the named class is valid, the Add Panel function then unselects all other panels on the application—leaving only the newly-selected panel.

It is at this point that the Aspect Handler creates a new aspect, having the class name of its characteristic aspect type. From this point forward the new aspect is a real software aspect, and no longer merely the representation of a potential aspect.

The Aspect Handler of the front page then calls a "constructor" function, which operates to set the basic values of the aspect. These values include "set parent", which is usually referenced to the front panel Aspect Handler; however this value could possibly be assigned another aspect such as the Group Box panel aspect. There is then set another value, "set position", which is determined from the previously set (x, y) mouse position.

A basic type check is conducted to insure that the new aspect comprises the correct core functionality appropriate to aspects of its type. Each aspect type is provided with a set of core functionalities common to all aspects of that type; these include functionalities regarding, for example, data source capabilities, data sink capabilities, control capabilities, common system events, and the like.

The constructor function of the Aspect Handler then sets up, for the new aspect, the basic behavior common to all aspects (moving, resizing, how to open the property page for the aspect, etc.), drawing for this function on extant libraries of aspect functionalities.

A unique, internal identification is created for the new aspect, consisting of the class name and an index number. Given that "snap to grid" is a user-selectable option in the application, the aspect becomes adjusted to its position on the desktop grid at this point. Other components of the application are informed that the project has changed. A "Save/Save As" function is then enabled, allowing the user to save the changed project.

To this point no AIL or other text file yet exists, but the aspect configuration information to be included in the AIL text file is embodied within the definition of the new aspect. The AIL executable text file is created following the user's invocation of the "Save Project" function, which could be upon completing the design of a measurement application, or at any time prior to completing such design. Upon the user selecting "Save" from the menu, the front panel Aspect Handler triggers a "File Save" call. (A check is then first conducted to determine whether the user's project already exists or is a new project. If the project did not previously exist a File dialog box is presented to the user, in which to fill in a name for the new project. The Save Project routine then continues as set forth below for previously existing projects).

In the "Save Project" routine the Aspect Handler of the front panel saves all instrument component panels created on the front panel by the user. In this process the Aspect Handler starts by saving itself, the front panel, as a parent object, and it then proceeds to save each aspect on the front panel as a child object. In this save procedure, functions for file streaming of persistent properties (that is, for descriptions of how object behaves) operate to create, separately for each aspect within the front panel, a set of the properties that are specific to that aspect, to contain all persistent characteristics of the aspect, including its connections and specific characteristics.

This process is repeated for each child aspect, and each child of each child, until all have been saved. The end result of this process is the AIL text file representing the front panel as developed by the user. This file is a simple text description of each aspect comprised in the front panel. As earlier stated, this file is textual, and not a binary file.

At this point other appropriate housekeeping functions are called. The "Save" and "Save As" buttons are disabled, and the Application Inspector module is notified to update its information. Projects as developed by a user may be modified at any time. Adding new functionality to the application development software, for example adding functionality to oscilloscope panel aspects, will not damage or destroy any previously developed application that employs aspects affected by the modification. The new functionality is simply added to the AIL text file of the project if it needs an AIL description. If such an AIL description is needed, and the description is not present in the "old" AIL file, default values are preferably assumed that provide for a safe operation. It is therefore easy to upgrade an embodiment of the invention, or an application developed from an earlier embodiment of the invention, without risk of damage to previously developed measurement projects.

Description of User Interface Features

The present invention provides a user with a graphical environment and development tools for creating virtual instruments that are capable of displaying and processing measurement data. These development tools principally include thematically categorized sets of "panels", described in greater detail below, with each panel representing a component of a virtual instrument. Instrument component panels can then be combined in a variety of ways to assemble a complete instrument on a "front panel". As earlier described, a user application may consist of a single front panel, or of a plurality of such panels, which can be multiplied at will, in order to equip an end user project will all necessary instrumentation.

In commercial embodiments of the present invention, therefore, the user interface should preferably comprise a toolbox of conventional graphical application tools, including graphical means to perform editing and manipulation functions such as cut, copy, save, delete, undelete and the like, which require no further discussion. Additional conventional tools appropriate to any graphical software development application are also preferably provided, including "load project", "save project", "save project as", and a "project information" property page for recording pertinent project identification information. Embodiments of the invention will preferably also be provided with other conventional tools, not further mentioned herein, such as keyboard shortcut keys, macros, and other well-known tools for assisting users to manage a graphical application environment.

To assist a user in re-using portions of a development project for another later project having functional similarities, means are preferably provided for retrievably storing entire development projects, or portions of development projects, in a "repository". A special repository may also be provided, in commercial embodiments of the invention, for retrievably storing preprogrammed virtual instruments or instrument components that have commonly used features, thereby saving the user the time otherwise required to build these commonly used instruments repeatedly. Examples of such instruments might for example include oscillators having "start", "period", "counter" and "LED" characteristics.

It is also desirable for embodiments of the present invention to comprise built-in means for integrating or interfacing seamlessly with machine vision applications, in view of the common use, in industrial as well as scientific applications, of measurement sensing means and image capture means in combination. Thus the display of measurement data using the present invention may be combined with a corresponding image view of the unit under test which is the subject of the measurement operation.

There are also preferably provided means for toggling between a "design mode", in which the development tools of the present invention are available to the user, and a "preview mode" in which the user can preview, precisely as it will appear in "run time", the desktop appearance of the application as created by the user. Preferably means are provided to create a "run time" mode of the user-developed measurement application, to comprise a working, operational version of said measurement application, in a form that does not comprise the application development tools of the invention.

Distribution of the "run time" mode version of a user-developed measurement application is preferably supported by a distribution wizard, in the form of a built-in or external installer application that creates a version of the application comprising all files required to run the application and also the set up files needed to automatically install the user-developed application on another computer. A preferred form of distribution wizard is described below.

Preferably the distributable "run time" application comprises, as an associated application, a data "analysis application" enabling the run time user to link the measurement application to another, user definable application, for example an independent application suitable for analyzing data developed using the measurement application.

"Standard" Panels and "Controlling" Panels

In a preferred embodiment of the invention, the instrument component panels made available to the user are thematically categorized into three principal groups: a set of "data source" panels, a set of "Standard" panels that comprises a large selection of data visualization and data massaging panels, and a set of "Control panels" for controlling the data source panels and the visualization and data analysis panels.

In a typical, simple user application, the front panel would comprise a display panel such as a Digital display, a data source panel, and a DAQ Controller panel with "start" and "stop" buttons for controlling sampling of data by the data source. More complex user applications would generally use a plurality of front panels, each forming a separable instrument. The present invention provides for the creation of as many front panels as the user desires, and means for readily toggling between front panels, using tab identifiers on a task bar located at the bottom of the main application window to jump from one front panel to another.

Preferably all three principal sets of panels are readily accessible from the design desktop. For "drag and drop" operations, each set of panels may be represented on the desktop by a "flying tool window", in the form of a bar containing an identification of the panel group; a mouse click on the pertinent bar then opens the "window" and presents the user with a group of icons that represent the individual panels within that group. Independently, the panels are preferably also accessible from the "Menu" button on the main tool bar of the design desktop. These two ways of providing access to the principal panel groups are illustrated on FIG. 16, a screen shot of the design desktop. FIG. 15 thus shows at the top right a set of "flying tool windows" including a data source set 134, a "standard panels" set 136 and a "Controlling panels" set 138. A user selects a panel for placement on the desk top by "drag and drop" of a panel icon within one of the "flying tool window" panel sets, or by selecting the panel through th Menu button, by selecting in order, say, "panels/Standard/Digital display" in the manner familiar from selecting items in a standard Windows "Menu" tree.

With respect to the Data Source set of panels, it should be understood that the listing of data source panels to be included in any embodiment of the present invention should correspond to the specific data source types that are, or are to be, connected to the computer of the end user of the application, and that are supported by appropriated device driver software resident in or accessible to the end user computer. For purposes of application development, however, simulated data sources may be included in embodiments of the software of the present invention, to serve as models or stand-ins for the hardware devices and other sources of data that the measurement application is intended eventually to service.

A proposed set of data source panels would include, as shown on FIG. 16:

DAQ Data Source Panel 140:
The DAQ Data Source panel allows a user to set up a conventional DAQ hardware device for external data acquisition and to configure the subsystems of said DAQ device of interest to the user. Where several external DAQ devices are to be used as sources of data, the user can use a plurality of DAQ Data Source panels. Preferably the DAQ Data Source panel comprises the functionality required to connect with and configure a Data Translation DATAX signal conditioning system.

Analog Output Panel 142:
The Analog Output panel allows the user to set up a hardware device that supports analog output operations to output data. With this panel a user can output a single analog output value, output a previously created waveform, or generate a new waveform.

Counter Panel 144:
The Counter panel enables a user to set up a hardware device to perform event counting operations. The panel counts events on the user clock inputs of counter/timer subsystems.

Frequency Panel 146:
The Frequency panel allows a user to set up a hardware device to perform frequency measurement operations. The panel measures frequencies on the user clock inputs of counter/timer subsystems.

Rate Generator Panel 148:

> The Rate Generator panel allows the user to set up a hardware device to perform continuous pulse output operations. The frequency and pulse width of the input signal are variable.

It should be understood that the above list of Data Source is illustrative and suggestive, and that the same techniques employed to construct the listed and described Data Source panels may be employed to construct other data acquisition means of interest to potential users of the present invention. In particular means for using, in an application developed using the present invention, data acquisition hardware devices not initially supported by a system according to the invention may readily be developed by using commercially available software developer kits (SDKs) to develop the necessary high level device driver interfaces.

The set of "Standard" panels is also shown in FIG. 16 and itself comprises several distinct groups of panels, primarily including data display panels but also including several panels, not connectable to data sources, that provide means for a user to place a label or descriptive information on a front panel. These Standard Panels group includes:

Digital Display Panel 150:

> The Digital Display panel allows the user to display a single data value in a 7-segment digital display. The user can define the displaying digits, the position of the decimal point, A background color, and the color of the digits Measure Source Label Panel 152:

> Allows the user to display a single data value

Bar Graph Panel 154:

> Allows the user to display the values of a measurement in a bar graph

Meter Panel 156:

> The Meter panel allows the user to display a single data value in an analog display, such as a moving needle in a dial. A variety of display style choices are preferably offered to the user.

LED Panel 158:

> The LED panel simulates a light-emitting diode. This panel may be used to provide a warning signal, for example, if a channel input crosses a specified threshold Group Box Panel 160:

> The Group Box panel allows a user to combine a group of other panels together on the desktop, using copy/paste actions. Images may be placed in the background of the panel to simulate a real hardware instrument.

Text Label Panel 162:

> Not connectable to a data source, this panel simply allows a user to place a single line of descriptive text on the front panel.

Description Text Panel 164:

> Not connectable to a data source, this panel allows a user to place multiple lines of comments or descriptions on the front panel.

File Writer Panel 166:

> The File Writer panel allows a user to record data and to save it to a file. In a typical use the data is not made visible during recording and this panel is used to log data for later use, for example in connection with an analysis application.

Line Recorder Panel 168:

> Also known as a Strip Chart Recorder, this panel allows the user to record incoming data from one or more channels of a data source to a data file. The incoming data is visible to the user on a display, and the recording of data may be started and stopped at any time by the user.

Spectrum Analyzer Panel 170:

> The Spectrum Analyzer panel allows the user to display and analyze the frequency spectrum of an input signal, by performing a "Fast Fourier Transform" (FFT), an autocorrelation, or a power spectrum operation on an input signal. This panel allows the user also to zoom in/out and to pan the displayed data.

Oscilloscope Panel 172:

> The Oscilloscope panel allows a user to display and save input data from one or more data channels of a specified data source. This panel provides a software trigger, reference cursors, one band or multi-band visualization, and a linear or logarithmic y-axis display. The user may zoom in/out and pan the data display of the Oscilloscope panel.

It should be understood that the above list of Standard panels is illustrative and suggestive, and that the same techniques employed to construct the listed and described Standard panels may be employed to construct other data visualization and presentation means of interest to potential users of the present invention.

The set of Controlling panels is also shown in FIG. 16 and it includes the following:

Control Spectrum Analyzer Panel 174:

> This panel allows the user to control defined properties and actions of the Spectrum Analyzer panel Control Oscilloscope Panel 176:

> This panel allows the user to control defined properties and actions of the Oscilloscope panel Control Line Recorder Panel 178:

> This panel allows the user to control defined properties and actions of the Line Recorder panel (which is also known as the "Strip Chart Recorder" panel)

Control Edit Panel 180:

> The Control Edit panel allows a user to control properties of other panels on a front panel. For example a user may specify a new value for a property in a text box and the value of that property is changed immediately.

Control Button Panel 182:

> The Control Button panel allows a user to control multiple properties and multiple actions of other panels on a front panel. Thus the digit color set on several Digital Display panels may be simultaneously changed using a Control Button panel. The Control Button panel may also be used as a switch, by specifying an active state and a passive state, for example for use in starting and stopping data acquisition from a specified data channel of a specified data source.

Control Combo Panel 184:

> This panel allows a user to control text-based properties of other panels on a front panel.
>
> This allows a user of the measurement application to change the setting of a text-based property by selecting from a list of text items proffered on a drop-down list associated with the characteristics of the controlled panel. For example a user can change to orientation of the display bar on a Bar Graph panel, in run time, by selecting the appropriate value (horizontal/vertical) from the Control Combo panel drop-down list.

Comparator Panel 186:
  The Comparator panel allows the user to compare the measurements from two data channels or to compare the measurements from a single data channel to a pre-defined limit. The result of such a comparison can then be employed by the user to trigger a set of actions by other panels on the front panel (and, thereby, by an external hardware device) or to change specified properties of multiple other panels on the front panel simultaneously.

Datax Controller Panel 188:
  The DATAX Controller panel allows the user to change range and filter settings of a connected Data Translation, Inc. DATAX signal conditioning system. (Upon its creation and the selection of a connected DATAX device as a data source, the DATAX Controller panel is automatically configured to correspond to the hardware set-up of the connected DATAX device).

DAQ Controller Panel 190:
  This panel allows the user to control a DAQ data source panel. From this panel, the user can in run time start and stop the acquisition of data, specify the buffer size, and select at will the clock frequency.

Control Slider Panel 192:
The Control Slider panel allows the user to control specified properties of other panels on the front panel, for example including trigger threshold values. A variety of display styles and labeling options are preferably provided.

Control Dial Panel 194:
  The Control Dial panel allows a user to control specified properties of another panel on a front panel, for example to set sampling data buffer size, or clock speed. Preferably a variety of labeling options and dial styles are made available to the user, to suit different applications.

Data Counter Panel 196:
  The Data Counter panel allows a user to count data events.

Action Counter Panel 198:
  The Action Counter panel reacts to actions from other Controlling panels, such as the Comparator panel or the Control Button panel, to increment or decrement a counter.

Value Pipe Panel 200:
  The Value Pipe panel allows a user to convert an incoming data channel from a data source panel into a control source. For example the Value Pipe panel allows a received data value to be converted to a reference value for use by a Comparator panel on the same front panel.

Delayed Operation Panel 202:
  This panel allows a user to specify a delay time and an action to be performed upon the expiration of the specified delay time.

Initialization Panel 204:
  The Initialization panel allows a user to specify initial states to be in effect upon the start-up of a project. A user may thus set all digital output lines to "high", or set data acquisition to commence automatically. Use of this panel ensures that a measurement application starts in a defined state each time a measurement project is started.

Finalization Panel 206:
  The Finalization panel allows a user to specify the conditions of a project upon its conclusion. A user may thus set all digital output lines to "low", or stop data acquisition. Use of this panel ensures that the measurement application is left in a defined state each time a measurement project is closed.

Event Client Panel 208:
  The Event Client panel allows a user to be notified of events that occur during the running of a project, and thereby to react if necessary to specified events. An Event panel may for example be employed to notify the user of a buffer overrun, the clicking of a Control Button, the run out of a counter, the cessation of data sampling for any reason, or any of many other changes in the state of an aspect property.

Universal Controller Panel 210:
  The Universal Controller panel allows a user to control many properties of other panels. In particular the Universal Controller can change its style depending on the type of property which the use wishes to control. For example, if the user seeks to change the background color of another panel on the front panel, the Universal Controller becomes a color dialog box; if the user then wishes to change a property (of the same or another panel) that has enumerated values, the Universal Controller becomes effectively a Control Combo panel; and, if the user now wishes to change a text-based property (of the same or another) panel on the front panel, the Universal Controller panel becomes effectively a Control Edit panel.

It should be understood that the above list of Controlling panels is illustrative and suggestive, and that the same techniques employed to construct the listed and described Standard panels may be employed to construct other data visualization and presentation means of interest to potential users of the present invention.

A detailed listing of the specific properties, of a selection of the above-listed data source, "standard" and controlling panels, that are subject to configuration by the user in the course of developing an application, can be found in the Appendix to this specification.

General Procedure for Developing a User Application

The development of a measurement application using the system of the present invention follows the following general procedure.

The user opens the development application. Upon opening the application the user is presented with a design desktop, which also constitutes a first "front panel" on which a virtual instrument may be organized and created. As earlier stated, the user may open as many different "front panels" as desired, each of which effectively consists, at the outset, of a blank design desktop, with a menu button at the lower left and, optionally, a set of minimized "flying tool windows". Each of the flying tool windows may be expanded to reveal a set of panel icons corresponding to the panel group of the particular tool window, be it "data source" panels, "standard panels", "Controlling panels", or the like.

Selecting a Data Source for the Application

The user places a Data Source panel on the desktop, and selects a hardware data acquisition device to connect to the Data Source panel. Once a Data Source panel has been placed on the desktop, the property page of the Data Source panel can readily be accessed and it contains functions capable of displaying all available and supported hardware devices then connected to the system. The user selects the device to be represented by the Data Source panel by making a selection from a device drop-down list.

The user selects the particular data acquisition device subsystem to be represented by the Data Source panel: From the Data Source panel property page, once a data source device has been selected, a listing of subsystems associated with said device is presented to the user, for example listing separately an A/D subsystem and a digital subsystem, and the user selects the data source device subsystem to be represented by the Data Source panel.

The user then configures the selected hardware device subsystem. Upon the user's selection of a subsystem, a "Subsystem" button was automatically created on the property page of the Data Source panel, and clicking this Subsystem button opens a screen containing a plurality of drop down boxes for configuring a plurality of parameters including "Channel type," "Channel range," "Clock frequency," and "Buffer size." The subsystem screen also comprises two windows, a left window containing a listing of the input channels of the selected subsystem, and a right side, initially empty "Channel table"

The Subsystem screen listing of input channels comprises a check box adjoining each listed input channel, for user selection of desired input channels. Upon the making of such selection, and an Apply confirmation by the user, the selected channels are then presented in a tree view in the right side "Channel table" window of said screen. An "Edit Channel" button is provided for this table, and allows the user to change the properties of each of the channels presented in the channel table tree view. Pre-set categories of channel properties that may thus be modified include channel name (say, "Temperature", or "Voltage", as appropriate to reflect the quality measured); unit of measurement (say, For V); minimum and maximum ranges. Upon making and applying desired changes to all selected input channels, and return to the Channel table view, it is seen that the tree view of the selected channels includes an identification of their configuration parameters.

User Selection of a Visualization or Data Analysis Panel

The user, having configured a data source panel as described above to represent a selected external data acquisition hardware device, next turns to the selection of a data display panel suitable for displaying measurement data from one or more data channels of the selected source of data. The user places a visualization panel on the desktop using the same procedure as was used to locate a data source panel on the desktop, only now selecting a data display panel from the Standard Panels group rather than the Data Sources Panels group.

Selecting and Defining a Display Panel

Having selected a desired visualization panel, say the Digital display panel, the user next acts to connect that visualization panel to the earlier selected and configured Data Source panel. On the property page of the newly place visualization panel (accessed, like the property page of the Data Source panel, by right clicking the top frame of the panel) the user is offered a "General" properties button, a "Data Reduction" button, and a "Channels" button. Clicking the Channels button opens a Channels screen including a Data Source drop-down listing of all data sources earlier selected for use by the user. The user clicks on the desired data source (if more than one is listed) and a channel tree then appears in a channel view window, listing the input channels of said data source that the user previously selected as candidates for visualization. Assuming for example that the user initially selected an A/D subsystem carrying, among others, an input channel adaptable to represent Temperature, and another input channel adaptable to represent Voltage, said channels would appear on the channel tree view of the property page of the Digital display channel under the names, respectively, of "Temperature" and "Voltage," with adjoining check boxes for selection by the user. The user may at this time select one or the other of the indicated input channels for visualization on the present Digital display panel. The user, if desired, must repeat the process with another Digital display panel in order to display the second parameter listed.

Selecting and Defining a Controlling Panel

The user, having made a selection of the data source input channel to be displayed on the Digital display panel, must next add to the front panel a control panel to control the operation of the data source. To do this the user selects an appropriate panel from the Controlling Panels group of development panels.

Where the data acquisition hardware device is a DAQ board, the appropriate controlling panel is a DAQ Controller panel, and such a panel is placed on the desktop using the same general procedure earlier described for the placement of a Data Source panel on the desktop. And, as was the case with the Data Source panel and the Digital display panel, the configuration of the DAQ Controller panel is implemented by accessing the property page of said panel, in the preferred embodiment simply by a right mouse click on the panel's top border. The DAQ Controller property page includes a Data Sources drop-down list, which on being opened presents the user with a list of any data sources, previously added to the front panel by the user, that are supported by the DAQ controller. The user's selection of a data source device on this drop-down list effects a connection between said data source device and the DAQ Controller panel, effective upon the user's press of the Apply or Ok button on said property page.

Closing of the DAQ Controller property page returns the user to the front panel desktop, now containing a Data Source panel, a Digital Display panel, and a DAQ Controller panel, each located where earlier placed by the user/developer. (Using conventional graphical environment tools and techniques, the user may readily move any instrument component panel to a new location, simply by left clicking in the top frame of a panel and dragging the panel to a new location, then releasing the left mouse button). The DAQ Controller panel, as shown in FIG. 26, contains a "start sampling" button, a "stop sampling" button, and also a "buffer size" drop-down list and a "Clock Frequency" drop-down list. The user may now initiate a sampling operation simply by clicking the Start Sampling button. At any time, whether in the design mode, or the run time mode, the user may modify either the buffer size or the clock frequency (within the ranges supported by the hardware and correspondingly listed in the pertinent drop-down lists).

Sample User Application

A user's development of a typical measurement application will now be described in detail, with reference to screen shots illustrating the use of a preferred embodiment of the invention to develop said application.

Figure 17:
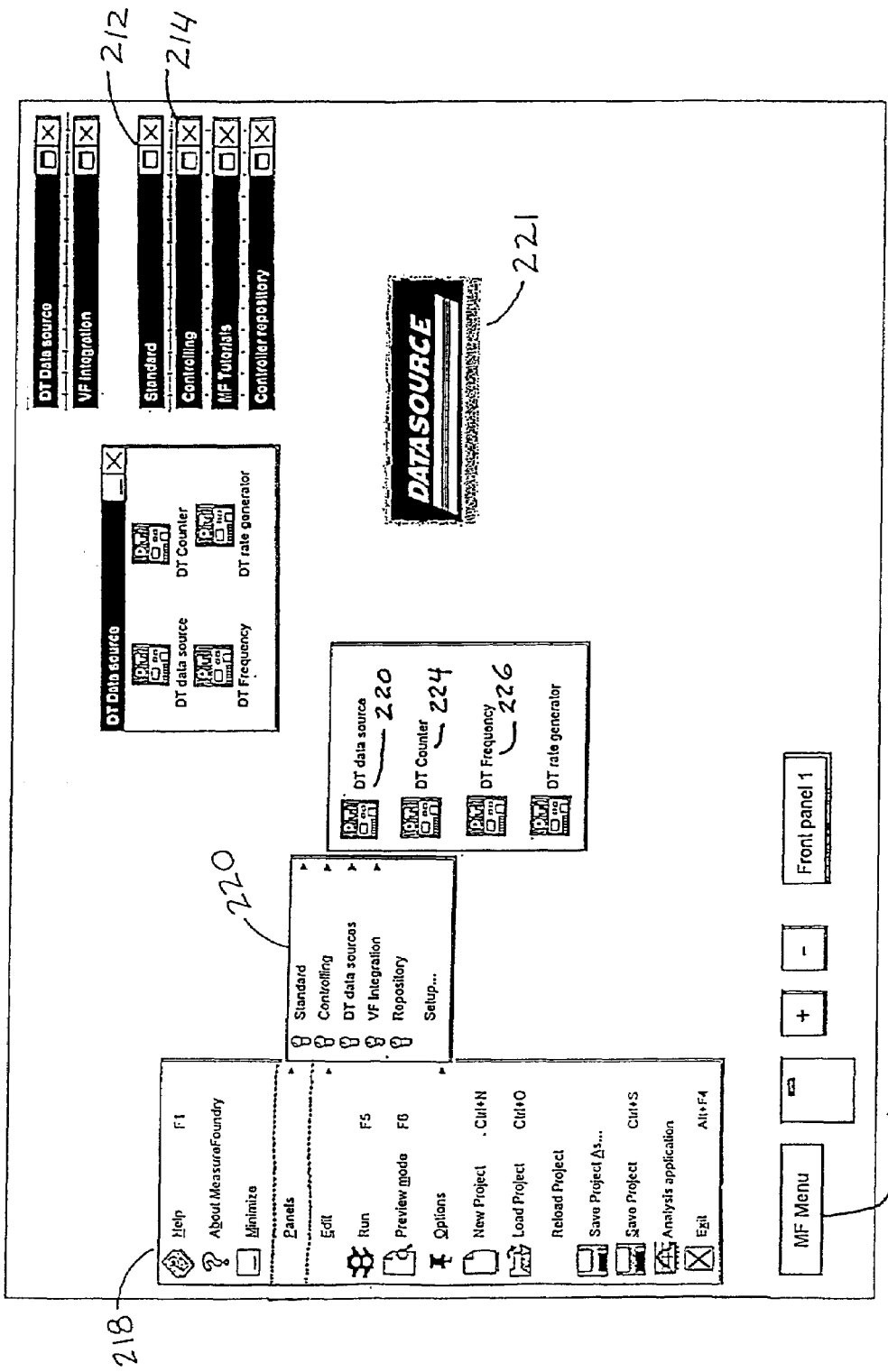
FIG. 17 is a screen shot of the design desktop illustrating the placement of a data source panel on the desktop.

The user, having started the main application, is presented with the blank project design desktop shown on FIG. 17, on which to place the panels that will make up the user's own measurement application. Present on the desktop are a set of "flying tool windows" including "Standard" bar 212 representing the "Standard panels" group (which includes the visualization panels), "Controlling" bar 214 representing the "Controlling panels" group, and, in addition, several other bars for "flying tool windows" that comprise secondary sets of tools, including debug tools, tutorials, and other tools and resources of secondary interest to the present description).

A conventional "menu" button 216, at the lower left of the desktop of FIG. 17, is available to open menu listing 218, and thereby provides independent access to the available groups of panels and other tools. Optionally keyboard shortcuts may also be provided for accessing component panels and other tools provided by a system according to the invention.

In the following example a user undertakes to use the present invention to create a measurement application, comprising the connection of a DAQ board data source to a Digital display panel, for the display of sampling data from selected data channels of the data source.

The user begins to build the application by setting up a connection to the data acquisition hardware that will provide the measurement data to be viewed and processed. To do this the user first places a data source panel on the desktop, and then uses its property page to access and to configure the hardware data acquisition device that is to be employed as the source of measurement data. Having clicked the Menu icon to open menu listing 218 of FIG. 17, the user then selects the "panels" entry, which opens list 220 of panel groups available for selection. As shown on FIG. 17 the available groups in this particular embodiment include "Standard", "Controlling," "DT data sources", "VF integration" (which refers to a visual imaging set of panels), and "Repository."

The user selects the "DT data sources" entry, which opens to present a box containing icons that represent four different sources of data, including DAQ data source icon 220, analog output icon 222, Counter panel icon 224, and frequency panel icon 226; information regarding the general nature of each of these data sources has been provided above in the general listing and brief descriptions of component panels of a preferred embodiment of the invention. The listed data source types represent all of the various data source types then supported by the software of the invention, and thus usable to connect to a corresponding physical device or other source of data.

From said list of supported data sources, the user clicks on the icon representing the data source type of interest to the user. This action causes a cursor-controlled cross mark to appear on the desktop: moving this cross mark to a desired location on the desktop and clicking the left mouse button places a data source panel 220, rectangular in shape, at the selected location.

Alternatively the user may place a data source panel on the desktop by making use of the "flying tool windows" provided in a preferred embodiment of the invention and described above. Clicking on the "Data source" bar opens a tool window comprising the same "data sources" icons listed on the front panel Menu listing; any of these icons may then be placed on the desktop by a conventional drag and drop procedure. Clicking on the icon then produces the same cursor-controlled cross mark referred to above, which is used to locate the selected panel at a desired location on the desktop.

In the present example, the user places a "DAQ data source" panel 220 at a desired location on the desktop, in order to access an external data source that is connected to the computer by a DAQ plug-in board (or that will connected to the computer of an end user for whom the application is being developed). Through the data source panel that has been placed on the desktop, the user may then proceeds to define and configure the specific data acquisition hardware that is intended to be used as a source of measurement data.

As stated earlier in this description, a user configures a data source panel by opening its property page, which provides access to user-definable properties of the data source aspect represented by said data source panel. In one embodiment of the invention, this property page is accessed with a simple (right button) mouse click within the body of the data source panel as it appears on the workspace. The software means employed to implement this action are wholly conventional and are not further described; similar software means may, if desired, be employed to effectuate this action in other ways.

Figure 18:
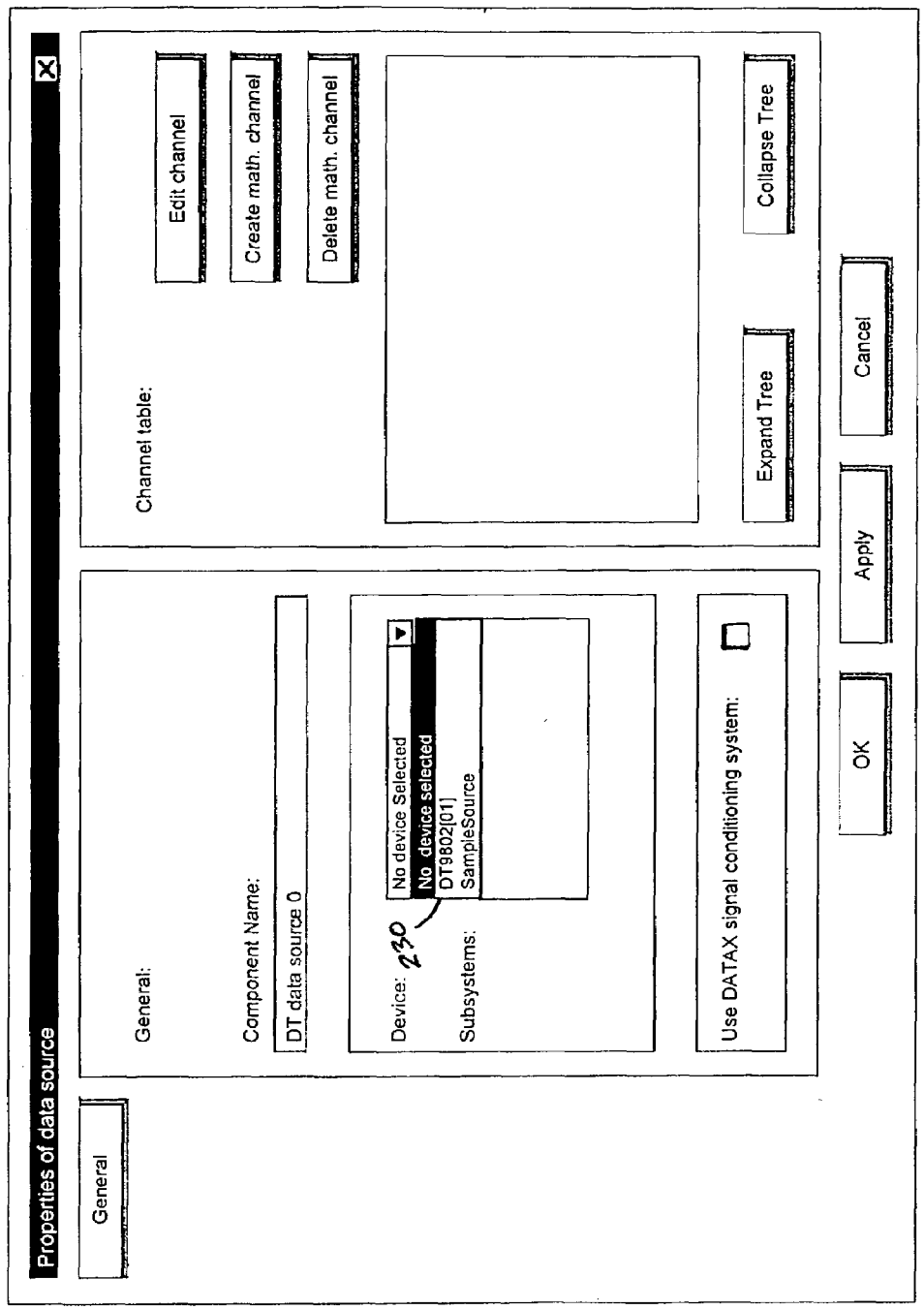
FIG. 18 is a screen shot of the property page of a data source panel placed on the desktop.

FIG. 18 illustrates generally the appearance of "General" page 228 of the data source panel property page, which is the page first presented to the user upon opening the data source panel property page. A window on the left side of said General property page presents the user with a "Device" drop-down list or combo box 230 that lists all data acquisition devices, of the type "DT data source", that are then available to and supported by the system. In the present example, shown in FIG. 18, the available devices are "SampleSource" device 232 and DT9802(01). Here, SampleSource device 232 is a simulated source representing a Data Translation, Inc. DAQ board. Preferably a system according to the invention will comprise such simulated data sources, to enable an application developer to develop and configure an application to employ such a data source, for use by an end user having a physical DAQ board of the same type plugged into the end user computer, and also for purposes of user training. The configuration of panels for a user application is the same whether the data source to be accessed is simulated or real.

Figure 19:
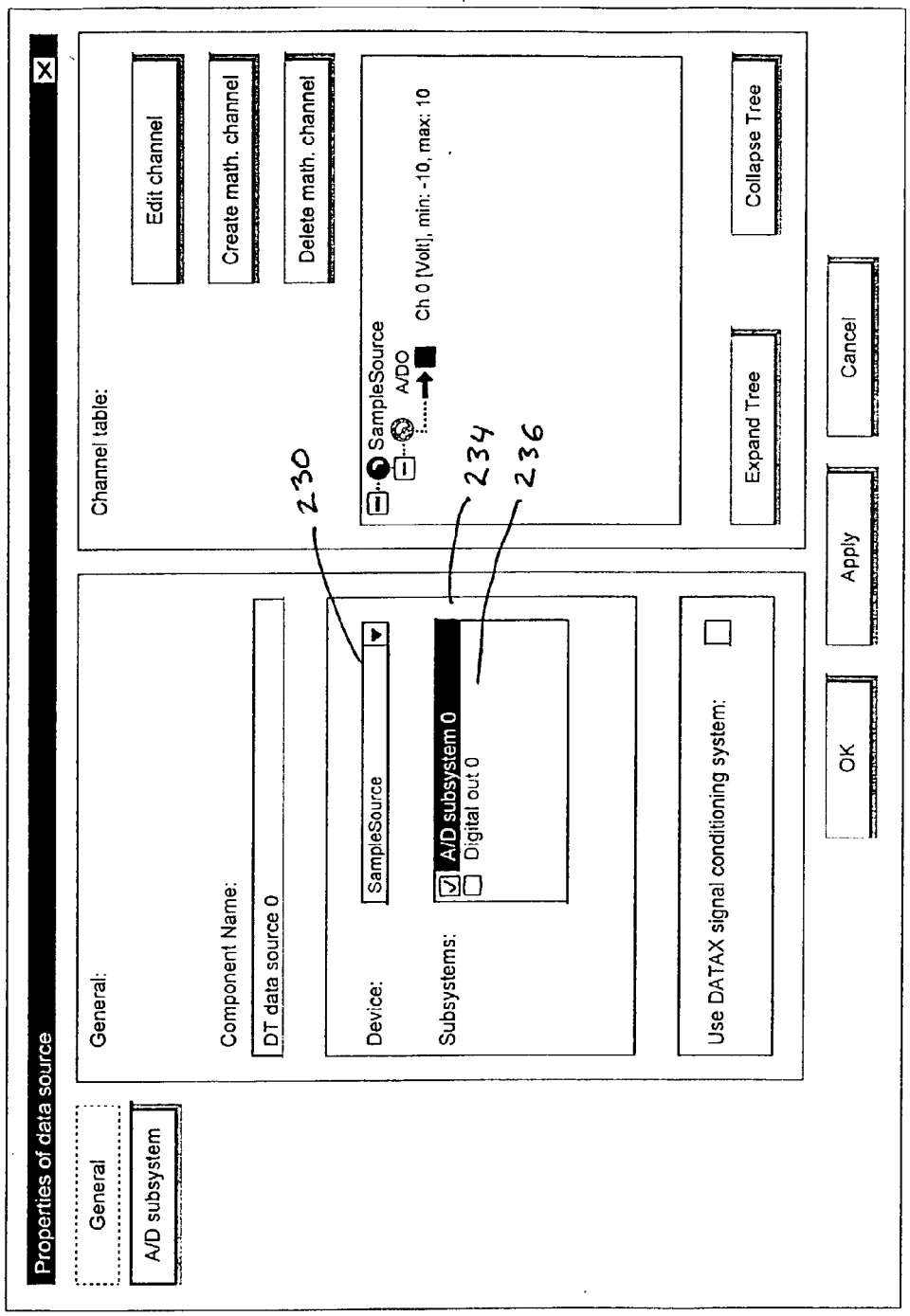
FIG. 19 is a screen shot of the property page of FIG. 18 reflecting a user selection of the AID subsystem of a "SampleSource" data source for use in creating an application.

Upon selection by the user of "Sample Source" data source from the source listing 230 in FIG. 18, there is immediately displayed, just below the device selection combo box, another box that lists any subsystems associated with the selected data source. In the present example, as shown in FIG. 18, "A/D subsystem 0" 234 subsystem and "Digital out 0" 236 subsystems are referenced in said box, and check boxes are provided for the making of a user selection. Upon the user making a selection to use the "A/D subsystem" as the data source for the instrument being built, a new button marked "A/D Subsystem" is created and appears in the upper left of FIG. 19. Pressing this "A/D Subsystem" button 238 causes the appearance, in a window on the right side of said "properties of data source" page 228, of channel table 240, which identifies the data channel or channels provided by the AND subsystem of the selected Sample Source data source.

Figure 20:
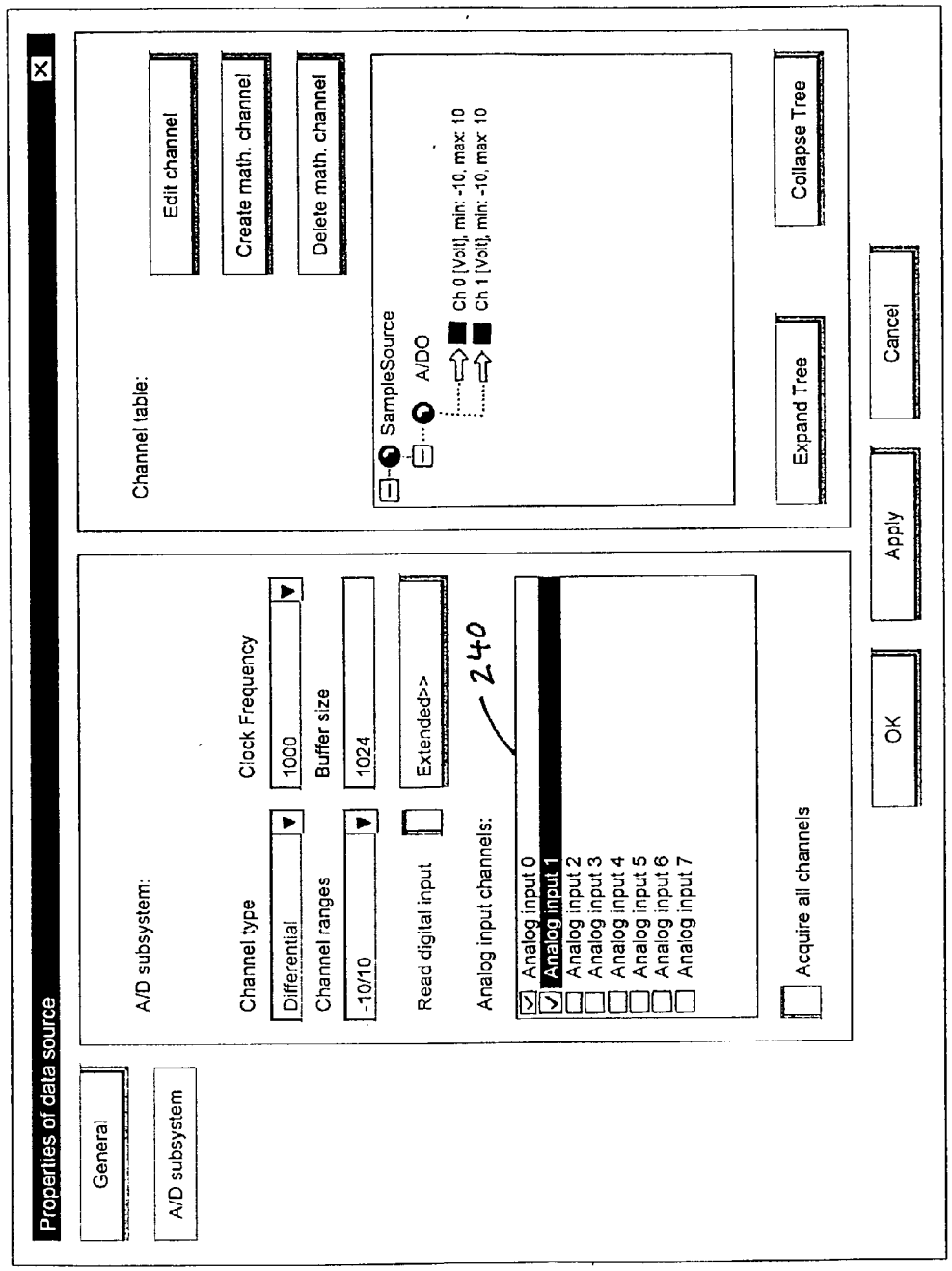
FIG. 20 is a screen shot of the "A/D subsystem" page of the property page of FIG. 18, reflecting user selection of input channels as data sources.

Clicking said A/D Subsystem button 238 opens a configuration page, shown in FIG. 20, for selecting and configuring specific data channels of the data channels offered by A/D subsystem 234 of SampleSource 233. A channel listing 240 on said FIG. 20 lists the analog input channels provided by the A/D subsystem of the selected data source, for selection and configuration by the user. (The listed data channels, and their respective characteristics, are attributes of the particular data acquisition hardware device being employed, or to be employed, in the measurement project of the user; accordingly the user in deciding which input channel or channels to select, and what tasks to assign to any particular channel, will generally be familiar with such attributes; if not, the user will have recourse to the documentation pertaining to such hardware for information regarding the particular attributes of specific channels. Thus certain input channels of a particular hardware device are suitable for use with particular sensing transducers, and others are not. These considerations are not a part of the present invention.)

Upon selecting a particular data source input channel, as a desired source of data, the user is provided by the property page of the data source panel with numerous configuration options. The properties page of the data source panel, when opened to the pertinent "Subsystem" page as shown in FIG. 20, thus provides the user with dialog boxes, combo boxes, drop-down lists and other graphical tools which the user can employ in configuring a selected input channel. Parameters that can thus be configured include channel range, clock frequency, and buffer size, all as shown on FIG. 20. (The ranges of parameter values presented to the user are set to limits established by the operating specifications of the pertinent hardware device, as determined by the software of the invention by querying the stored device driver software associated with the selected data source device).

The selection by the user of an input channel of the selected subsystem of the selected data source, by checking the box adjoining the selected input channel in channel listing 240 of the "properties of data source" page shown on FIG. 20, causes the selected input channel or channels to be displayed, each with a listing of its configured or default parameters, in a window within right-hand "Channel table" 242. Said channel table 242 includes buttons respectively marked "Edit channel", "Create math channel" and "Delete math channel". The "Edit channel" button, when clicked, opens an "Edit channel properties" frame, shown in FIG. 21, which comprises boxes for the user to modify the default values of a pre-set selection of channel properties (which have been pre-selected taking into account the inherent capabilities and characteristics of the various channels provided by specific types of data source devices). Thus certain channels are dedicated to voltage outputs, and the "unit" value of the data may not be altered; in other cases the user is offered a choice between, say, voltage or current units. In all cases the user may select a name for the channel; and typically the user is provided with the opportunity to select a range including a minimum value and a maximum value (say, −10 to +10).

Figure 21:
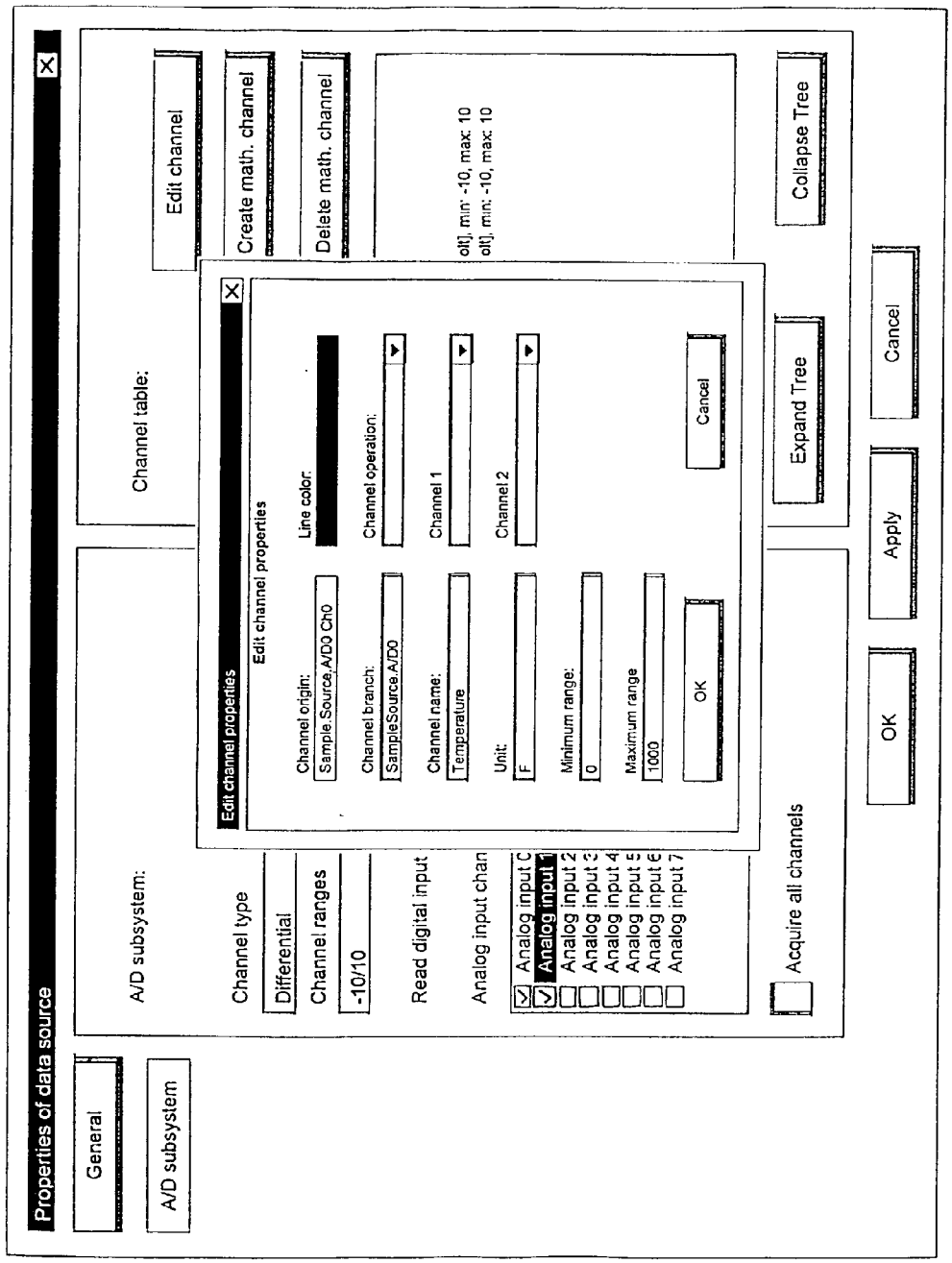
FIG. 21 is a screen shot of "Edit channel properties" box opened from "A/D subsystem" page of FIG. 20.
Figure 22:
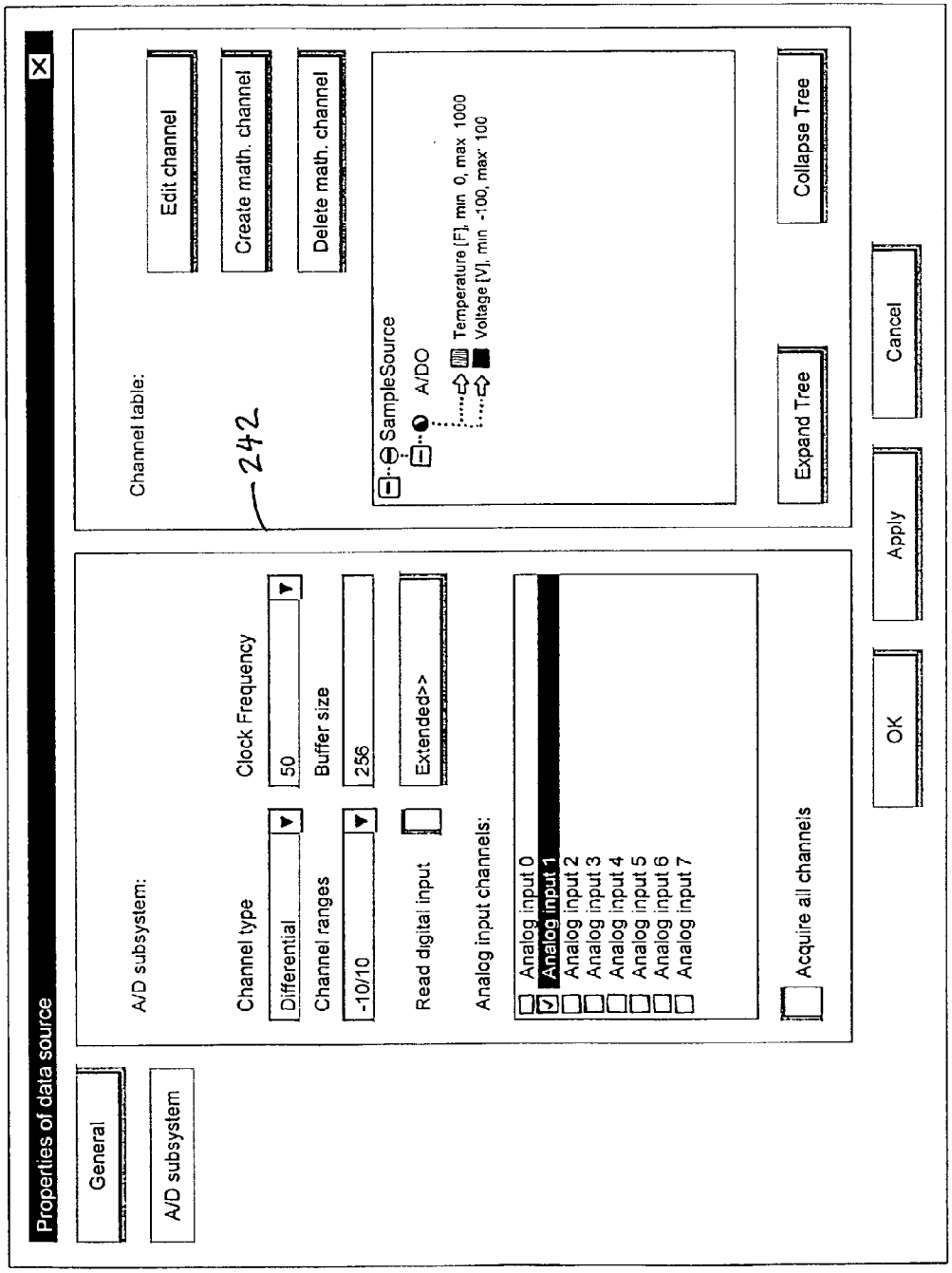
FIG. 22 is a screen shot of "A/D subsystem" page of FIG. 20, following configuration of selected data channels by user.

FIG. 22 illustrates the appearance of the A/D subsystem page of data source property page, following the entry by the user of configuration selections from within the Edit channel page illustrated in FIG. 21. Thus, the channel view window of right-hand side "Channel table" 242 reflects new parameter selections applicable to data channel "Analog input 1" (which is checked in the left-hand "Analog input channels" window.) This channel has now been assigned the name "Voltage", the unit "V", and a range of min: −100 and max: 100. The user, having made selections from the proffered choices of properties, actuates those selections by pressing the "Apply" button (which actuates a selection but leaves the "Edit channel properties open" page open) or the "Ok" button (which actuates all selections made by the user and also closes the "Edit channel properties open" page). These actions by the user complete the selection and configuration of the data source data channels that are to be the sources of data for the instrument being built by the user.

The user proceeds next to place a visualization panel on the design desktop, on which to display measurement data received from the selected data channels of the selected data source. In the present example the user has chosen to place a Digital display panel on the desktop. The digital display panel is capable of displaying, in the preferred embodiment, up to six digits.

Figure 23:
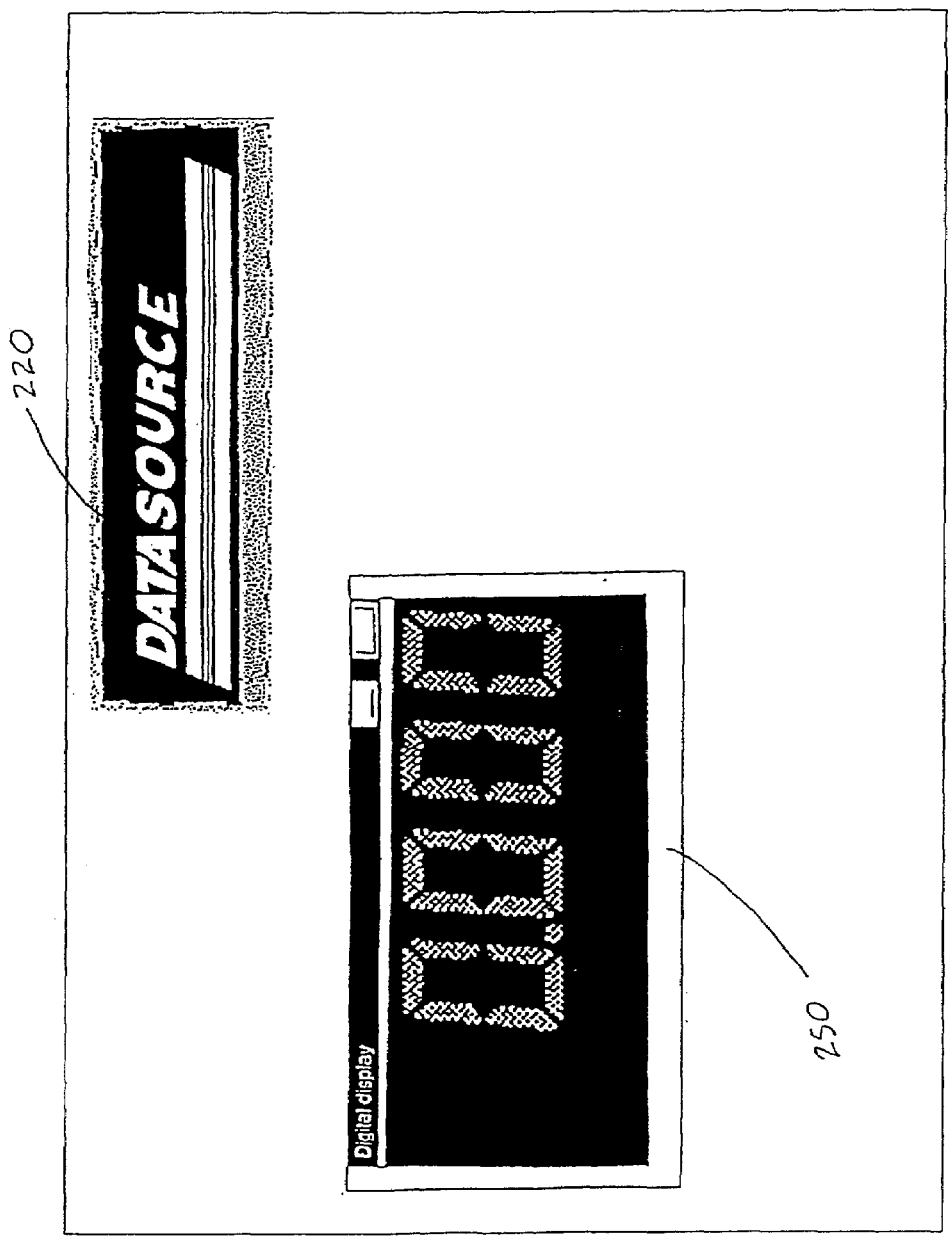
FIG. 23 is a screen shot of the front panel workspace upon placement of a Digital display panel on the workspace.

The Digital Display panel is found within the Standard Panels group, and therefore the user can place a Digital display panel on the desktop by clicking open the front panel Menu button and selecting "Panels/Standard/Digital display". Alternatively the user can drag and drop a Digital display icon from the "Standard Panels" flying" tool window bar 212 shown on FIG. 17. As occurred in the user's selection of a data source panel, these user actions activate a mouse-controlled "cross" tool that serves as a box location and sizing tool; the user by holding down the left mouse button and dragging the mouse in a diagonal can size the selected panel to a desired dimension. This procedure is in all respects similar to that used for creating boxes in conventional drawing programs. On release of the left mouse button, a Digital display panel 250 is placed and sized as defined by the rectangle drawn by the user, as shown in FIG. 23.

The user then proceeds to select desired properties for the newly-created digital display panel, by opening the property page of digital display panel 250, in the preferred embodiment by right-clicking the top frame of said panel, or by left double-clicking anywhere on the panel. The property page 252 of digital display panel 250, as shown on FIG. 24 offers the user three separate groups of properties for making selections, including a "general" group, a "Data reduction" group, and a "Channels" group, each identified and selectable from a button bearing the property group name.

The set of "General" Digital display properties available for user selection, as set forth in the Appendix to this description, includes choices of "Component name," "Digit's color", "Background color", "Number of Digits", and "Decimal Point" number (from 1 through 6).

Figure 24:
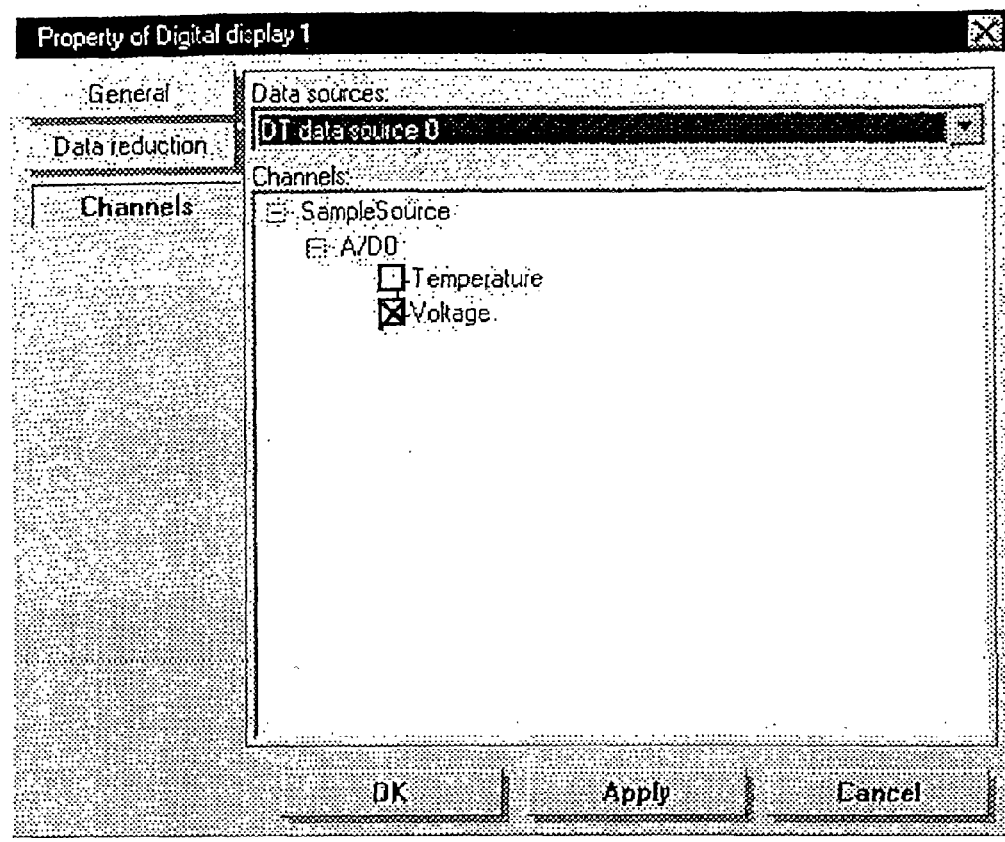
FIG. 24 is a screen shot of the property page of a selected Digital display visualization panel.

To select the data source input channel that is to be displayed on the Digital display panel, the user presses the "Channels" button on the "Property of Digital display" property page 252, thereby opening the Data sources view page shown on FIG. 24. Said Data sources view page includes "Data sources" drop-down list 254, which on clicking the down arrow presents the user with a list of available data sources. User selection of one of the a listed data sources results in the presentation, in a "Channels" view box 256 (located below the "Data sources" drop-down list box), of a tree list of the channels available to Digital display panel 250 from the selected data source, with selection check boxes adjoining each listed channel. In the present example, "Sample Source" has been selected, and its two previously selected A/D 0 channels are available for selection as shown on FIG. 24, with the "Voltage" check box checked for illustrative purposes. The user may then close the Digital display property page by clicking the Apply button then the Ok button in the lower part of the "Properties of Digital Display" page.

It should be understood that the user may select as many "Digital display" panels as are needed or useful for the user's measurement project, and the user may accordingly open a second digital display panel, using the procedures described above, in order to create a digital display on which to display the output of a second input channel associated with "Sample Source".

A digital display panel is designed to display only "single value" data. Therefore, for use of a Digital display panel to display data from a source of buffer data, there is provided in preferred embodiments of the invention a "data reduction" set of properties. Clicking on the "data reduction" button of digital display property page 252 (shown on FIG. 24) thus allows the user to select a desired form of presentation from the following list of pre-set options for presenting data received as buffer data from a data source:

First value in buffer
Last value in buffer
Average of buffer
Minimum of buffer
Maximum of buffer
Root-mean-square of buffer
Standard deviation of buffer Lastly, in order to receive and display data from "Sample Source" on the newly created digital display panel, the user needs only to create a suitable controller panel and connect it to the data source panel of "Sample Source". This controller panel will allow the user, in run time, to start and stop at will the presentation of data from the selected data channel of the data source to the digital display panel. Where the selected source of measurement data is a data acquisition board, commonly known as a "DAQ" board, this will require a DAQ controller panel, and the user proceeds to place such a panel on the design desktop by selecting, from the front panel Menu, "Panels/Controlling/DAQ controller" (or, alternatively, by drag and drop of a DAQ controller panel from the appropriate "flying" tool window). As earlier described for the data source panel and the digital display panel, the user locates and sizes the DAQ controller panel by holding down the left mouse button while dragging the mouse along a diagonal path; releasing the left mouse button locates the DAQ controller panel in the space thus defined by the user.

Figure 25:
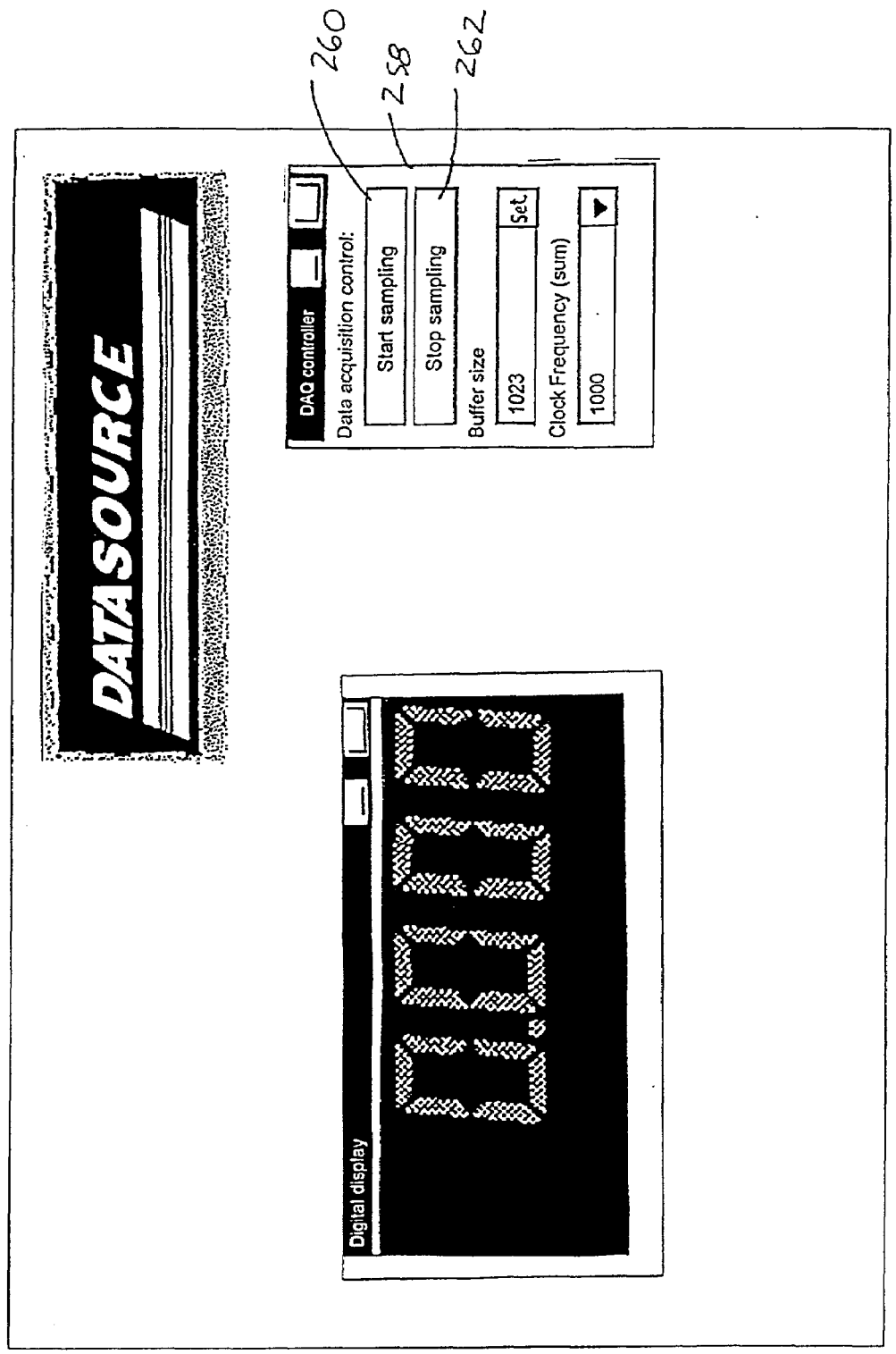
FIG. 25 is a screen shot of a three-aspect Digital display instrument for sampling and visualizing DAQ measurement data.

As shown in FIG. 25, DAQ controller panel 258 has the shape of a vertically oriented rectangular box and it contains "Start sampling" button 260 and "Stop sampling" button 262. Said DAQ controller panel further comprises a "Buffer size" combo box 264 and a "Clock frequency" combo box 266, for use in selecting a desired sampling buffer size and a desired sampling frequency.

To connect DAQ controller 258 to the data source of interest to the user, and to the digital display panel previously created by the user to display data from the data source of interest, the user accesses the property page of the DAQ controller panel (by right clicking on the top border of said panel). Where DAQ Controller 258 is dedicated to controlling a DAQ data source, its property page, when opened, contains "data source" combo box that presents to the user, for selection, a list of only those data sources available on the system that are supported by the DAQ controller panel, with adjoining check boxes for making a selection. Preferably, in a system according to the invention, the only data sources that will be presented to the user by the property page of a controlling panel are data sources having data channels that are supported by the particular controlling panel. Thus, where a DAQ controller panel accepts only buffered data sources, a data source limited to single value data channels will not be displayed in the controller panel property page and could not be connected to said panel.

The user checks the box adjoining the desired data source, and then clicks the Apply button located at the lower part on said property page to actuate the selection. Upon the user closing said property page (by clicking on the Ok button adjoining the Apply button) the user is returned to the DAQ controller panel, which is now empowered to control the sampling of data from the selected data source, for immediate display on Digital display panel shown on FIG. 26.

By pressing "Start sampling" button 260 on DAQ controller panel 258 of Digital display instrument 268 illustrated on FIG. 25, the user initiate the transport of measurement data from the data source represented by data source panel 221 to Digital display panel 250 and such measurement data will be presented on said Digital display panel in the form selected by the user on the property page of said Digital display panel, as previously described. FIG. 25 now represents a fully functional Digital display instrument for sampling and viewing measurement data acquired from a DAQ board source. DAQ controller panel 258 on FIG. 25 allows the user to change the buffer size setting and the clock speed of the data sampling at any time during run time.

The procedure described above, for the construction of a virtual Digital Display instrument, is representative of the general procedure to be employed in constructing other instruments using the graphical resources provided by the present invention.

In the preferred embodiment of the invention there is provided a "Preview mode" whereby a measurement application as created by a user of the present invention may be displayed in the precise desktop format of a run time version of the application, for review and possible further modification by the user of the manner in which the panels used in said measurement application are presented on the desktop. In Preview mode the user application can sample and display either simulated data or real data (where the computer system is connected to an external data acquisition device).

Finally a "run time mode" is also provided in the preferred embodiment of the invention, said run time mode comprising the complete measurement application as designed and created by the user, in an archivable package adapted for running said application, but that does not include application development tools employed in creating the measurement application. Thus the run time mode can load and run a measurement application that was designed in the design mode; however, all means to change the user's program in run time mode are disabled and not accessible. Thus panels cannot be added or removed in run time mode. However it must be kept in mind that, in design mode, the user may have selected control panels that permit the user to access and modify particular panel properties during run time. Thus, properties such as sampling buffer size may generally be modified in run time.

Solution to Windows Message Queue Blocking Problem

When running a conventional measurement application within a Windows environment, that is, under the supervision of the Windows operating system, the standard message-queue mechanism of Windows can interfere with, and block, the flow of data from an external data source into the measurement application. This phenomenon occurs because, in a typical Windows-based application, both the flow of data into the application and any user action affecting any window on the desktop of the user application, are handled by the Windows software and specifically by its internal message-queue mechanism. Consequently, whenever a user acts to "grab" a window, or to resize it or move it, the Windows message queue is blocked, and any incoming data flow is then also blocked. The blocking of incoming measurement data can seriously corrupt a measurement application, in that the continuing inflow of data can easily overrun any data buffers, resulting in the outright loss of measurement data.

For use in the present invention there is accordingly provided a mechanism whereby actions relating to the management of window moving or sizing actions, are handled by the application itself, rather than by the Windows message queue mechanism. There is accordingly provided, in a preferred embodiment of the present invention, an internal set of "Windows" classes, including the functionality to create a desktop window that sits "on top" of the original Windows operating system. The properties of this window are effectively those of a standard Windows window, stripped of unneeded original Windows elements, such as the title or caption bar, and the minimize, maximize and close buttons. These in turn are replaced by newly created, corresponding elements.

The Windows message queue still exists and is unaffected by the new structures. However the handling of important messages and events is implemented wholly within the application, by-passing the Windows message queue mechanism and consequently avoiding any blocking of the Windows queue. Data acquisition and display can occur in a continuous and uninterrupted manner, even though the user may be clicking on a window caption bar, moving the window, or resizing it, because these actions are handled independently of the Windows message queue and do not operate to block that message queue.

More particularly, the structures and operations created and implemented to effect this bypassing of the Windows Message Queue are generally as follows: a base class is created, and equipped with the functionalities required to move or resize a window. Said base class is placed "on top" of the window, and given responsibility for handling all functions needed to move or resize the window. The "paint" routines normally used by the Windows operating system to create windows on a desktop are replaced by new and equivalent routines, and, for each desired desktop window, a blank window without a caption bar or resizing buttons is set up, and an appropriate caption bar is placed on top of said window.

When a user acts to move or to resize a window in a Windows graphical environment, three actions/events occur, and, normally, internal routines of the Windows operating system are alerted to perform associated functions using the Windows message queue. In the present invention, equivalent routines are developed to manage these events, and these routines enable the system to bypass the handling of these events by the Windows message queue mechanism. The pertinent events are (a) "Mouse Button down"; (b) "Mouse Button up"; and (c) "Mouse move".

The "Mouse Button down" event is initiated when the left mouse button is pressed down to "grab" an item in the window. Upon this occurrence, an "event" is fired, issuing a notice that the left mouse button has been pressed, and certain basic functions of mouse handling are called. The principal function is:

Check position of mouse—where is the cursor located?
Specifically, is the cursor in one of the following places?
 (a) Caption bar
 (b) Minimize rectangle
 (c) Maximize rectangle
 (d) Close rectangle If all are responses are "false", then the cursor is located in the main window, and movement of the cursor motion will not invoke any of the window moving or resizing functions.

Taking the other possibilities in order, the cursor may be within the window's "caption bar" area. If the mouse button is clicked while the cursor is in a Windows caption bar area, the cursor is in an area within which the only action that can be taken, per Windows rules, is to move the window. Therefore, if the mouse is in the caption bar, the response to a call: "is moving of the window allowed?" must be "True".

If, however, the mouse button has been pressed while the cursor is within the "minimize", "maximize" or "close" rectangles located at the upper right of the window, the window must (in all three cases) be repainted. Therefore, the current position of the window must be stored.

The "Mouse Move" Event:
This event occurs only where the answer to the call "is the mouse allowed to move?" is "True".
Set the new mouse position—by calculating the difference between the new position of the cursor/mouse and the old (now stored) position of the window
Set new bounds—the frame around the window.
An event fires to repaint the background and to erase old background.

The "Mouse Button Up" Action:
Occurs upon release of the left mouse button, and invokes the following:
Check that mouse is not in a moving mode (once mouse button has been released, the mouse is not moving).
Check if cursor position is within the Close rectangle.
If the cursor is within the Close rectangle, fire event that notifies the system that the window is about to close.
Then Close window.
Check if cursor position is within the Minimize rectangle.
If cursor is within the Minimize rectangle, fire event that notifies the system that the window is about to minimize.
Set window to Minimize state.
Check if cursor position is within the Maximize rectangle.
If cursor is within the Maximize rectangle, fire event that notifies the system that the window is about to maximize.

Set window to Maximize state.

Set value of "is mouse moving?" property to "False"—The mouse is no longer moving.

Distribution Wizard

Measurement applications created using a system according to the present invention are intended generally to be capable of distribution to end users, for installation on a personal computer and for managing a measurement application supervised by the end user, who generally will be a person other than the user who developed the measurement application. To implement this objective the present invention preferably comprises a Distribution Wizard tailored to the specific characteristics of the present invention, and in particular that takes advantage of such characteristic features of the present invention as the use of aspect-type software objects associated with exectutable code segments that express attributes and properties of said aspects. The Distribution Wizard consists of three parts: The first is an "application executable" that contains the graphical user interface (GUI), from which the user can find the user-designed measurement program, add other files and set it up to be distributed. The second part is a traditional "set up executable installer", such as the commercially available WISE 8.0 installer marketed by Wise Solutions Incorporated. The third part of the Distribution Wizard is a so-called "stub application", which is needed for unzipping the distributed application on the personal computer of an end user.

To create a file for the distribution of a particular measurement application, the user who designed the application would go through the following steps:

Open the Distribution Wizard

1. Select a storage directory—all files necessary for the creation of a distributed application will be temporarily copied to that directory, and the distribution wizard will make a final executable for distribution from these stored files.
2. Project selection—The user, who may have developed a plurality of separate measurement projects, for example to suit the needs of different end users, must select which project or projects are to be included in this particular project distribution file.
3. The directory of projects that are available for distribution may be displayed in a project selection box, and results from Save Project actions. (Each time a project is saved, the Save Project action causes an entry to be written to the Windows registry, and it then shows up in the project selection box.)
4. Upon user selection of a project, the (dtx) file embodying the project, that is, the descriptive text script of the program, in AIL language or a comparable description language, is browsed for the project name, author, company, copyright, and version number, and this information is displayed.
5. Installation options are presented for selection by the user, principally including whether the application should install with or without a run-time package, and also conventional options such as whether to create a desktop icon enabling the end-user to start the program by double-clicking the icon.
6. Additional files can be added for inclusion in the final executable file for distribution, such as DLLs, image files, or ActiveX files that the end user may need in order to run the program. For example, if a device driver has been written or obtained for an OPC client device, which is to serve as a data source for the end user's application, this driver would be included among such additional files.
7. Creation of an executable file for distribution:
    i. Create a metadirectory—as a temporary storage directory to which all the files will go.
    ii. Write an "ini file" to that directory, with all relevant information in text blocks including program name, and other conventional ini file information.
    iii. Create Create a zip file in the metadirectory as an archive-type file (a type of file that can execute but also can store other files). Place in said zip file, first, all of the files needed by the application program (DTX file, run-time exe, set up prototype), then the ini file, and then any additional files selected as described above. Then close this zip file.
    iv. Create a self-extracting executable file (also an archive-type file).
    v. Add the stub application to the executable file—the result is a new merged executable file that contains the stub and the executable file.
    vi. The zip file is then copied as a stream into the memory of the new executable file.
8. At this point the user can delete the original zip file from the temporary metadirectory, and also delete the prototype file and the ini file, leaving only the self-extracting executable file, which can be copied or otherwise provided to the end user's PC and installed on the end user's PC.

This self-extracting executable file, upon being opened on the end user's PC, automatically uncompresses, starts the set-up prototype, obtains the information needed from the ini file, and then starts up like any traditional Windows-based graphical application.

Upon open opening of said self-extracting executable file, on an end user's PC, the following actions occur in the course of the installation process:

1. The stub file—starts as a self-extracting exe
2. The stub file creates a new zip archive file, and copies the zip file to a specific temporary directory.
3. The "set up prototype" is unpacked from the zip file and starts
4. Write a registry entry that says that the set up now runs—called Run The stub application and set up prototype must communicate—if there is a problem with the install they must all shut down 5. The set up prototype installs all files, and, upon completion of this task, it deletes the Run entry from the registry and writes in the registry that it is finished.
6. At this point the stub application has been noticed that the set up is done, and it deletes all the temporary files, including the set up and the ini file.
7. The application is installed and ready to run.

APPENDIX

PROPERTIES OF A SELECTION OF PANELS OF A PREFERRED EMBODIMENT

SIMPLE PANELS:

Panel: PanelMeter

Properties:

|  |  |
|---|---|
| -Digits | Number of displayed digits |
| -DecimalPoint | Position of decimal point |
| -BkColor | Background color |
| -FGColor | Color of display |
| -ZeroSuppress | Suppress leading zeros: yes/no |

Panel: Meter

Properties:

|  |  |
|---|---|
| -Angle1, Angle2 | Angles of gauge |
| -Min/Max | Min and Max values of gauge |
| -Gap | Gap for labeling |
| -BGColor | Background Color |
| -NeedleColor | Color of "needle" |
| -LabelingStyle | Select labeling position: inside/outside of gauge circle |
| -Legend1/Legend2 | Two "strings" to display, e.g., unit and purpose of meter |
| -Range/Colors | Array of colors for the range display |
| -RangeLimits | Array of "limits" for each range |

(Note: ranges are colored areas on gauge)

Panel: LED

Properties:

| | |
|---|---|
| -ActiveColor | Color of active LED |
| -PassiveColor | Color of inactive LED |
| -Flashing | LED is flashing when active: yes/no |
| -FlashInterval | Interval between flashes when Flashing is enabled |
| -Style | LED style (round, triangle, etc.) |
| CompareMethod | Method to set active/inactive (e.g., over/under limit, in/out of range, etc.) |
| -Limit | Compare value to 1 |
| -LimitUpper | Compare value to 2 |

Panel: Bargraph

Properties:

| | |
|---|---|
| -Min/Max | Min and Max values of gauge |
| -Gap | Gap for labeling |
| -BGColor | Background color |
| -RangeColors | Array of colors for the range display |
| -RangeLimits | Array of "limits" for each range |
| -Style | Labeling style (where to put the labeling, etc.) |
| -Horizontal | Display horizontal (true) or vertical (false) |

COMPLEX PANELS

Panel: Oscilloscope

Properties:

| | |
|---|---|
| -TriggerBufferSize | Size of the trigger buffer (in samples) |
| -TriggerType | Trigger conditions (positive, negative, none, hold) |
| -TriggerSingleShot | True: trigger one event only; False: rearm automatically |
| -TriggerLevel | Trigger level |
| -ShowTriggerStateLabel | Show a label that displays current trigger state? yes/no |
| -DisplayStyle | Display as one band, n bands, or "fixed bands" |
| -DisplayBands | Max number of display bands in which channels are displayed (when DisplayStyle is set to "fixed bands") |
| -LegendPosition | Display position of legend: (left, right, top, bottom, hide) |
| -BGColor | Background color |
| -BandColor | Band color |
| -Font | Font for all labeling |
| -Autoscale | Scale to fit (yes/no) |
| -ChannelVisibility | Array of booleans to enable/disable visibility of each connected channels |
| -GridScale | Lin/log display (in y) |
| -ShowCursors | Display cursors and a cursor panel |
| -CursorPanelPosition | Position of the cursor panel (when cursors are active) (left, right, top, bottom) |
| -SaveMethod | Method used to generate a filename for a save operation (Show dialog. Create name, use name, etc.) |
| -SaveFileName | Filename used as a filename in SaveMethod actions |

Actions:

| | |
|---|---|
| -Rearm Trigger | Start new trigger operation (when TriggerSingleShot "true") |
| -Capture scale | Perform one autoscale operation |
| -Save Buffer | Save current triggerbuffer to file (if buffer is filled) |

Panel: Line recorder

Properties:

| | |
|---|---|
| -DisplayStyle | Display as one band, n bands or "fixed bands" |
| -DisplayBands | Max number of display bands in which the channels are displayed (when display style is set to "fixed bands") |
| -LegendPosition | Display position of the legend (right, left, top, bottom, hide) |
| -BGColor | Background color |
| -BandColor | Band color |
| -Font | Font for all labeling |
| -Channel visibility | Array of booleans to enable/disable the visibility of each connected channel |
| -SaveMethod | Method used to generate a filename for a save operation (Show dialog. Create name, use name, etc.) |
| -SaveFileName | Filename used as a filename for SaveMethod operations |
| -ShowCursors | Display cursors and a cursor panel |
| -CursorPanelPosition | Position of the cursor panel when cursors are active |
| -MaxRecordingTime | Time interval in seconds after which recording stops automatically. (Set to 0, recording does not stop automatically) |
| -ConfirmStop | When set to "true", confirmation dialog opens when user stops recording through the "stop" action, to confirm action; set to "false", a stop action is immediately executed |
| -RelativeTime | Set to "true", relative time is used (starts with 0 seconds); when set to "false", absolute time is used, starting with current date/time |

| | |
|---|---|
| -DisplayAsDateTime | Set to "true", displays in date/time format; set to "false", displays in seconds |
| -ScrollStep | Step width in seconds used for the scroll actions |

Actions:

| | |
|---|---|
| -Start | Starts recording. (Depending on SaveMethod, a filedialog might be opened before recording starts) |
| -Stop | Stops recording |
| -CaptureScale | Perform one autoscale operation |
| -ScrollToStart | Move data window to start of recording |
| -ScrollToEnd | Move data window to end of recording and lock display |
| -ScrollLeft | Move data window "ScrollStep" seconds to the left |
| -ScrollRight | Move data window "ScrollStep" seconds to the right |

Panel: Spectrum analyzer

Properties:

| | |
|---|---|
| -DisplayStyle | Display as one band, n bands, or "fixed bands" |
| -DisplayBands | Maximum number of display bands in which channels are displayed (with DisplayStyle set to "fixed bands") |
| -LegendPosition | Display position of the legend (left, right, top, bottom, hide) |
| -BGColor | Background color |
| -BandColor | Band color |
| -Font | Font for all labeling |
| -ChannelVisibility | Array of booleans to enable/disable the visibility of each connected channel |
| -ShowCursors | Display cursors and a cursor panel |

| | |
|---|---|
| -CursorPanelPosition | Position of the cursor panel when cursors are active |
| -Type | Selects the "kind" of spectrum analyzer. Possible values are: Spectrum Analyzer, Autocorrelation, Power Spectrum |
| -ShowPhase | True: displays the phase; false: the phase is not displayed |
| -Autoscale | Scale to fit: yes/no |
| -Window | Select a window function. Possible values are: Rectangle, Hamming, Blackman, Hanning |
| -GridScale | Lin/log display (in y and t) |
| -TriggerBufferSize | Size of the triggerbuffer (in samples) |
| -TriggerType | Trigger conditions (positive, negative, none, hold) |
| -TriggerSingleShot | True: trigger only one event; false: rearm trigger |
| -TriggerLevel | Trigger level |
| -ShowTriggerStateLabel | Show label to display current trigger state (yes/no) |
| -SaveMethod | Method for generating filename for save operation (Show dialog, Create name, use name, etc.) |
| -SaveFileName | Filename used as a filename for SaveMethods "use name" |
| -MaxRecordingTime | Time in seconds after which recording stops automatically. If set to 0, recording does not stop automatically. |
| -ConfirmStop | Set to "true", a confirm dialog opens when user stops recording through a "stop" action, to confirm this action. When set to "false", a stop action is immediately executed |

Actions:

| | |
|---|---|
| -Start | Starts recording |
| -Stop | Stops recording |

The invention claimed is:

1. A graphical application development environment stored on computer storage media adapted for developing a plurality of user-defined test, measurement or process control applications without recourse to data-flow-diagram means or to any object request broker, said environment comprising:
   (a) a graphical desktop providing user access to a plurality of selectable panels;
   (b) aspect handler means for creating and constructing aspect type software objects adapted to comprise functionalities, including interconnection functionalities, drawn from extant libraries of aspect functionalities;
   (c) at least one data source type panel for providing access to s source of streaming data, said source type panel comprising a property page accessible to a user from said desktop;
   (d) at least one data sink type panel for receiving streaming data from a data source type panel and for displaying a representation of such streaming data on said desktop, said data sink type panel comprising a property page accessible to a user from said desktop; and
   (e) at least one controlling type panel for controlling a property of another of said panels, said controlling type panel comprising a property page accessible to a user from said desktop;
   (f) wherein there is associated with each of said panels an aspect-type software object created and constructed by said aspect handler means that comprises attributes and properties embodied in executable code segments drawn from a store of pre-written executable code segments; and
   (g) wherein said attributes and properties of a said aspect-type software object may be selectively configured by a user, from the property page of the panel associated with said object, thereby to effect a user-specified interconnection between said object and an aspect-type software object associated with another of said panels through the invocation of a pre-defined and pre-written set of said executable code segments.

2. A graphical application development environment according to claim 1, wherein a plurality of said aspect-type software objects form a class of data sink type aspects.

3. A graphical application development environment according to claim 2, wherein each aspect-type software object in said class of data sink type aspects shares a common set of data sink aspect properties and functionalities, and each such data sink type aspect additionally contains specific properties concerning a specific instrument component function.

4. A graphical application development environment according to claim 3, wherein at least one of said specific properties of a data sink type aspect that concern a specific instrument component is subject to configuration by a user from said graphical desktop.

5. A graphical application development environment according to claim 2, wherein said class of data sink aspects comprises functionalities enabling a user, for each data sink aspect within said class, to access a property page of said data sink aspect, and from said property page to effect a connection between said data sink aspect and at least one data channel provided by a selected data source aspect.

6. A graphical application development environment according to claim 1, wherein a plurality of said aspect-type software objects form a class of controlling type aspects.

7. A graphical application development environment according to claim 6 wherein each aspect-type software object in said class of controlling type aspects shares a common set of controlling aspect properties and functionalities, and each such controlling type aspect additionally contains specific properties concerning a specific instrument component function that is subject to configuration by a user.

8. A graphical application development environment according to claim 7, comprising at least one controlling type aspect containing functionality for user control of at least one property of a data source type aspect.

9. A graphical application development environment according to claim 7, comprising at least one controlling type aspect containing functionality for user control of at least one property of a data sink type aspect.

10. A graphical application development environment according to claim 7, comprising at least one controlling type aspect containing functionality for simultaneous user control of at least one property of a plurality of other aspect-type software objects.

11. A graphical application development environment according to claim 10, comprising at least one controlling type aspect containing functionality for user control of at least one property of a first property type of one aspect, and simultaneous user control of at least one property of a second property type of the same or another aspect.

12. A graphical application development environment according to claim 7, comprising at least one controlling type aspect containing functionality for user control of at least one action property of a data source type aspect.

13. A graphical application development environment according to claim 7, comprising at least one controlling type aspect containing functionality for user control of at least one action property of a data sink type aspect.

14. The graphical application development environment of claim 1 further comprising means for the automatic creation of a file containing a human-readable description of all aspect-type software objects as selected and configured by a user for use in an application, and means enabling the execution of said application through the invocation of executable code segments associated with said description upon a parsing of said description.

15. A graphical application development environment stored on computer readable storage media and adapted for the development of a plurality of user-defined test, measurement or process control applications without recourse to data-flow-diagram means or to any object request broker, said environment comprising:
   (a) aspect handler mean for creating and constructing aspect-type software objects adapted to comprise functionalities, attributes and properties drawn from extant libraries of functionalities, attributes and properties;
   (b) a plurality of aspect-type software objects wherein each of said aspects comprises
   (c) a panel associated with a graphical representation of a specific virtual instrument component, and
   (d) a set of attributes and properties, capable of configuration by a user employing graphical tools, corresponding to and expressed by pre-defined sets of executable code segments immediately accessible from a store of pre-written executable code segments, wherein
   (f) said set of user-configurable attributes and properties comprises means for establishing a data link between each said aspect-type software object and at least one other of said aspect-type software objects through the invocation of a said pre-defined set of said pre-written stored executable code segments.

16. A graphical application development environment according to claim 15, wherein each said aspect-type software object constitutes functionally a specific user-visible component of a virtual instrument.

17. A graphical application development environment according to claim 15, wherein each such aspect-type software object is associated with a property page accessible to a user from a graphical desktop, whereby said user is enabled to configure from within said property page at least one property of at least one aspect-type software object in said plurality of aspect-type software objects.

18. A graphical application development environment according to claim 17, wherein a user is enabled to control a property of at least one of said plurality of aspect-type software objects via a control channel established from a said property page associated with another aspect.

19. A graphical application development environment according to claim 15 comprising at least one aspect-type software object having characteristics of a data source aspect, at least one aspect-type software object having characteristics of a data sink aspect, and at least one aspect-type software object having characteristics of a controlling aspect.

20. A graphical application development environment according to claim 19, wherein each aspect-type software object having characteristics of a data sink aspect comprises user-configurable connectivity means for establishing a data link with at least one aspect-type software object having characteristics of a data source aspect, enabling the transport of streaming data to said data sink aspect from said data source aspect.

21. A graphical application development environment according to claim 19, wherein said each data sink aspect further comprises means enabling a user to select, from a property page of said data sink aspect accessible from a graphical desktop, at least one specific data channel from among a plurality of data channels provided by a data source to said data sink aspect.

22. A graphical application development environment stored on computer storage media adapted for the development of a plurality of user-defined test, measurement or process control applications without recourse to data-flow-diagram means or to any object request broker, said environment comprising:

A desktop for the placement by a user of a plurality of panels each representing a different functional component of an instrument for accomplishing a user-defined task, and aspect handler means adapted for creating and constructing, in association with each such panel an aspect-type software object having properties and attributes corresponding to pre-defined sets of executable code segments immediately accessible from a store of pre-written executable code segments, and wherein each of said panels comprises a property page accessible to a user from said graphical desktop, whereby said user may from said property page configure at least one defined property of the aspect-type software object associated with said panel to thereby establish an interconnection with another said aspect-type software object associated with another said panel.

23. The graphical application development environment of claim 22, wherein at least one of said panels comprises a property page accessible to a user from said graphical desktop, whereby a user may establish a control channel for controlling at least one property of an aspect-type software object associated with another of said panels.

24. The graphical application development environment of claim 22, wherein said plurality of panels comprises a data source group of panels, a data sink group of panels, and a controlling panel group of panels.

25. The graphical application development environment of claim 24, wherein the property page of each panel in said group of data sink panels comprises means for a user to establish a data link providing for the streaming of data from a selected data source represented by a data source panel to the data sink panel associated with the said property page.

26. The graphical application development environment of claim 24, further providing means, accessible from the property page of each data sink panel, for establishing a data link with a data source panel for streaming data provided by a specific data channel of said data source.

27. The graphical application development environment of claim 24, wherein each panel in said controlling panels group of panels has a property page accessible to a user from a graphical desktop, whereby a user may establish a control channel data link between any panel in said group of controlling panels and at least one other panel from another panel group, for controlling at least one property of said at least one other panel.

28. The graphical application development environment of claim 27, wherein an event channel data link is automatically established upon the establishment of a controlling channel link between a controlling panel and any other panel, whereby any change in the state of the property controlled via said control channel is reported to said controlling panel.

29. A graphical application development environment stored on computer readable storage media and comprising:
(a) libraries of executable code segments corresponding to attributes and properties appropriate for the construction of aspect-type software objects that represent components of instruments usable in the development of a plurality of different user-defined test, measurement or process control applications without recourse to data-flow-diagram means or to any object request broker means;
(b) a base class containing core functionalities selected from said executable code segments and common to all aspect-type software objects, including functionalities providing for the establishment of data links between any one aspect-type software object and any other aspect-type software object;
(c) aspect handler means adapted to create and construct a plurality of aspect-type software objects grouped into aspect classes including a data source aspect class, a data sink aspect class, and a controlling aspect class,
(d) wherein said aspect classes comprises class attributes and properties selected from executable code segments in said libraries,
(e) and wherein each aspect-type software object in each of said aspect classes additionally comprises attributes and properties specific to said aspect-type software object that serve to characterize said aspect-type software object as a single function element for use in a user-defined virtual instrument.

30. The graphical environment of claim 29 further comprising means for a user to select and configure panels representing virtual instrument components each corresponding to a said aspect-type software object, to form a complete virtual instrument for performing a test, measurement or control task.

31. The graphical environment of claim 30 further comprising means for representing said complete virtual instrument in a textual description of the aspect-type software objects selected and configured by the user, in a form whereby execution of said textual description directly invokes and activates the executable code segments associated with each of said aspect-type software objects.

32. A test, measurement or process control software application stored on computer storage media for accomplishing a specific user-defined task, said application being stored on computer readable media and comprising:
   (a) a plurality of aspect-type software objects created and configured by an application developer, whereby each of said objects constitutes a single specific and configured function element for performing at least a partial solution of said user-defined task;
   (b) data links, configured by said application developer using graphical tools without recourse to data-flow-diagramming means or to any object request broker means, connecting each of said plurality of objects with at least one other of said objects;
   (c) a store of executable code segments for implementing all attributes, properties, functions, actions and connectivity associated with said objects and said data links; and
   (d) a human-readable descriptive listing of said plurality of objects and data links, in a form usable to invoke and activate said executable code segments;
   (e) whereby at least one object characteristic of a data source is enabled to provide streaming data to at least one object characteristic of a data sink, via a said data link, for display in a form associated with said data sink.

33. A graphical application development environment stored on computer storage media adapted for developing a plurality of user-defined test, measurement or process control applications without recourse to data-flow-diagram means or to any object request broker means, said environment comprising:
   (a) a graphical desktop providing user access to a plurality of selectable panels;
   (b) at least one data source type panel for providing access to a source of streaming data;
   (c) at least one data Sink type panel for receiving streaming data from a data source type panel and for displaying a representation of such streaming data on said desktop;
   (d) at least one controlling type panel for controlling a property of another of said panels;
   (e) library means comprising executable code segments adaptable to implement any of a plurality of contemplated interconnections between one type panel and a different type panel; and
   (f) aspect handler means for creating and constructing, in association with each of said panels an aspect-type software object that has access to said library means and that comprises attributes and properties that may be configured by a user using graphical tools to effect at least one of said plurality of contemplated interconnections between a said panel and a different type panel.

34. A graphical application development environment stored on computer storage media adapted for developing a plurality of user-defined test, measurement or process control applications without recourse to data-flow-diagram means or to any object request broker means, said environment comprising:
   (a) a graphical desktop providing user access to a plurality of selectable panels including;
   (b) at least one data source type panel for providing access to a source of streaming data;
   (c) at least one data sink type panel for receiving streaming data from a data source type panel and for displaying a representation of such streaming data on said desktop; and
   (d) at least one controlling type panel for controlling a property of another of said panels,
   (e) aspect handler means for creating and constructing, in association with each of said panels, an aspect-type software object that comprised functionalities enabling a user to select and establish, from a property page of a said panel, one among a plurality of potentially available interconnections with a different one of said panels.

* * * * *